(12) United States Patent
Ward et al.

(10) Patent No.: US 7,566,478 B2
(45) Date of Patent: *Jul. 28, 2009

(54) METHODS OF MAKING CARBON NANOTUBE FILMS, LAYERS, FABRICS, RIBBONS, ELEMENTS AND ARTICLES

(75) Inventors: Jonathan W. Ward, Burlington, MA (US); Thomas Rueckes, Boston, MA (US); Brent M. Segal, Woburn, MA (US)

(73) Assignee: Nantero, Inc., Woburn, MA (US)

( * ) Notice: Subject to any disclaimer, the term of this patent is extended or adjusted under 35 U.S.C. 154(b) by 255 days.

This patent is subject to a terminal disclaimer.

(21) Appl. No.: 10/341,005

(22) Filed: Jan. 13, 2003

(65) Prior Publication Data

US 2008/0299307 A1     Dec. 4, 2008

Related U.S. Application Data

(63) Continuation-in-part of application No. 09/915,093, filed on Jul. 25, 2001, now Pat. No. 6,919,592, and a continuation-in-part of application No. 10/128,118, filed on Apr. 23, 2002, now Pat. No. 6,706,402.

(51) Int. Cl.
*C23C 16/26* (2006.01)
*B05D 5/12* (2006.01)
*B05D 3/00* (2006.01)

(52) U.S. Cl. .................. 427/249.1; 427/264; 427/270; 427/271; 427/301; 977/843

(58) Field of Classification Search ............ 427/78, 427/198, 200, 249.1, 264, 270, 271, 301, 427/903; 423/447.1, 447.3, 445 B; 977/843, 977/845

See application file for complete search history.

(56) References Cited

U.S. PATENT DOCUMENTS 3,448,302 A     6/1969     Shanefield .................. 307/318

(Continued)

FOREIGN PATENT DOCUMENTS

EP           0 217 023 A2     4/1987

(Continued)

OTHER PUBLICATIONS

Bonard, J. et al., "Monodisperse Multiwall Carbon Nanotubes Obtaine with Ferritin as Catalyst", Nano Letters, 2002, vol. 2, No. 6, 665-667.
Collins, P., "Engineering Carbon Nanotubes and Nanotube Circuits Using Electrical Breakdown", Science, vol. 292, Apr. 27, 2001, pp. 706-709.

(Continued)

*Primary Examiner*—William Phillip Fletcher, III
(74) *Attorney, Agent, or Firm*—Wilmer Cutler Pickering Hale and Dorr LLP

(57) ABSTRACT

Methods of Making Carbon Nanotube Films, Layers, Fabrics, Ribbons, Elements and Articles are disclosed. Carbon nanotube growth catalyst is applied on to a surface of a substrate. The substrate is subjected to a chemical vapor deposition of a carbon-containing gas to grow a non-woven fabric of carbon nanotubes. Portions of the non-woven fabric are selectively removed according to a defined pattern to create the article. A non-woven fabric of carbon nanotubes may be made by applying carbon nanotube growth catalyst on to a surface of a wafer substrate to create a dispersed monolayer of catalyst. The substrate is subjected to a chemical vapor deposition of a carbon-containing gas to grow a non-woven fabric of carbon nanotubes in contact and covering the surface of the wafer and in which the fabric is substantially uniform density.

29 Claims, 34 Drawing Sheets

U.S. PATENT DOCUMENTS

| | | | |
|---|---|---|---|
| 3,740,494 A | 6/1973 | Dunand et al. | |
| 3,892,890 A | 7/1975 | Watanabe et al. | |
| 3,970,887 A | 7/1976 | Smith et al. | 313/309 |
| 4,324,814 A | 4/1982 | Reichert | 427/86 |
| 4,378,629 A | 4/1983 | Bozlev et al. | 29/580 |
| 4,495,511 A | 1/1985 | Yoder | 357/22 |
| 4,510,016 A | 4/1985 | Chi et al. | 156/643 |
| 4,524,431 A | 6/1985 | Haken et al. | |
| 4,673,474 A | 6/1987 | Ogawa | 204/157.64 |
| 4,694,427 A | 9/1987 | Miyamoto et al. | |
| 4,701,842 A | 10/1987 | Olnowich | 364/200 |
| 4,707,197 A | 11/1987 | Hensel et al. | 437/189 |
| 4,758,534 A | 7/1988 | Derkits, Jr. et al. | 437/89 |
| 4,819,212 A | 4/1989 | Nakai et al. | |
| 4,845,533 A | 7/1989 | Pryor et al. | 357/2 |
| 4,853,893 A | 8/1989 | Eaton, Jr. et al. | 365/145 |
| 4,876,667 A | 10/1989 | Ross et al. | 365/113 |
| 4,888,630 A | 12/1989 | Paterson | 357/23.5 |
| 4,901,121 A | 2/1990 | Gibson et al. | 357/15 |
| 4,903,090 A | 2/1990 | Yokoyama | 357/22 |
| 4,939,556 A | 7/1990 | Eguchi et al. | 357/4 |
| 4,947,226 A | 8/1990 | Huang et al. | |
| 4,979,149 A | 12/1990 | Popovic et al. | |
| 4,985,871 A | 1/1991 | Catlin | 365/230.06 |
| 5,010,037 A | 4/1991 | Lin et al. | 437/200 |
| 5,031,145 A | 7/1991 | Lever | |
| 5,032,538 A | 7/1991 | Bozler et al. | 437/83 |
| 5,051,956 A | 9/1991 | Burns | |
| 5,057,883 A | 10/1991 | Noda | 357/22 |
| 5,089,545 A | 2/1992 | Pol | 524/17 |
| 5,155,561 A | 10/1992 | Bozler et al. | 357/22 |
| 5,161,218 A | 11/1992 | Catlin | 395/425 |
| 5,168,070 A | 12/1992 | Luth | 437/31 |
| 5,175,597 A | 12/1992 | Cachier et al. | 257/267 |
| 5,184,320 A | 2/1993 | Dye | 365/49 |
| 5,196,396 A | 3/1993 | Lieber | 505/1 |
| 5,198,390 A | 3/1993 | MacDonald et al. | 437/203 |
| 5,198,994 A | 3/1993 | Natori | 365/145 |
| 5,216,631 A | 6/1993 | Sliwa | 365/174 |
| 5,252,835 A | 10/1993 | Lieber et al. | 250/492.1 |
| 5,290,715 A | 3/1994 | Pardya | 437/29 |
| 5,316,979 A | 5/1994 | MacDonald et al. | 437/203 |
| 5,346,683 A | 9/1994 | Green et al. | 423/447.2 |
| 5,412,785 A | 5/1995 | Skruhak et al. | 395/375 |
| 5,424,054 A | 6/1995 | Bethune et al. | 423/447.2 |
| 5,426,070 A | 6/1995 | Shaw et al. | 437/203 |
| 5,444,421 A | 8/1995 | Carroll et al. | 331/111 |
| 5,444,651 A | 8/1995 | Yamamoto et al. | 365/108 |
| 5,453,970 A | 9/1995 | Rust et al. | 396/176 |
| 5,456,986 A | 10/1995 | Majetich et al. | 428/403 |
| 5,475,341 A | 12/1995 | Reed | 327/566 |
| 5,479,172 A | 12/1995 | Smith et al. | 342/51 |
| 5,482,601 A | 1/1996 | Ohshima et al. | 204/173 |
| 5,517,194 A | 5/1996 | Carroll et al. | 342/50 |
| 5,521,602 A | 5/1996 | Carroll et al. | 342/50 |
| 5,533,061 A | 7/1996 | Smith et al. | 375/334 |
| 5,538,916 A | 7/1996 | Kuroi et al. | |
| 5,547,748 A | 8/1996 | Ruoff et al. | 428/323 |
| 5,553,099 A | 9/1996 | Carroll et al. | 375/334 |
| 5,563,424 A | 10/1996 | Yang et al. | 257/40 |
| 5,586,286 A | 12/1996 | Santeler et al. | 395/432 |
| 5,589,692 A | 12/1996 | Reed | 257/23 |
| 5,590,078 A | 12/1996 | Chatter | 365/189.01 |
| 5,592,642 A | 1/1997 | Thomas | |
| 5,592,643 A | 1/1997 | Thomas | |
| 5,592,644 A | 1/1997 | Thomas | |
| 5,608,246 A | 3/1997 | Yeager et al. | 257/295 |
| 5,608,888 A | 3/1997 | Purcell et al. | 395/412 |
| 5,623,638 A | 4/1997 | Andrade | 395/494 |
| 5,626,670 A | 5/1997 | Varshney et al. | 117/7 |
| 5,626,812 A | 5/1997 | Ebbesen et al. | 264/248 |
| 5,640,133 A | 6/1997 | MacDonald et al. | 333/197 |
| 5,640,343 A | 6/1997 | Gallagher et al. | 365/171 |
| 5,650,958 A | 7/1997 | Gallagher et al. | 365/173 |
| 5,651,126 A | 7/1997 | Bailey et al. | 395/401 |
| 5,652,856 A | 7/1997 | Santeler et al. | 395/432 |
| 5,699,317 A | 12/1997 | Sartore et al. | 365/230.06 |
| 5,716,708 A | 2/1998 | Lagow | 428/408 |
| 5,719,073 A | 2/1998 | Shaw et al. | 437/228 |
| 5,721,862 A | 2/1998 | Sartore et al. | 395/445 |
| 5,739,057 A | 4/1998 | Tiwari et al. | 438/172 |
| 5,747,180 A | 5/1998 | Miller et al. | 428/601 |
| 5,751,156 A | 5/1998 | Muller et al. | 324/699 |
| 5,753,088 A | 5/1998 | Olk | 204/173 |
| 5,780,101 A | 7/1998 | Nolan et al. | 427/216 |
| 5,781,717 A | 7/1998 | Wu et al. | 395/182.06 |
| 5,793,697 A | 8/1998 | Scheuerlein | 365/230.07 |
| 5,799,209 A | 8/1998 | Chatter | 395/876 |
| 5,802,583 A | 9/1998 | Yeager et al. | 711/152 |
| 5,838,165 A | 11/1998 | Chatter | 326/38 |
| 5,840,435 A | 11/1998 | Lieber et al. | 428/698 |
| 5,841,692 A | 11/1998 | Gallagher et al. | 365/173 |
| 5,846,849 A | 12/1998 | Shaw et al. | 438/52 |
| 5,847,454 A | 12/1998 | Shaw et al. | 257/734 |
| 5,847,565 A | 12/1998 | Narayanan | 324/322 |
| 5,850,089 A | 12/1998 | Varshney et al. | 257/295 |
| 5,850,231 A | 12/1998 | Orimoto et al. | 345/507 |
| 5,858,862 A | 1/1999 | Westwater et al. | 438/503 |
| 5,875,451 A | 2/1999 | Joseph | 711/105 |
| 5,878,840 A | 3/1999 | Tessum et al. | 182/229 |
| 5,887,272 A | 3/1999 | Sartore et al. | 711/105 |
| 5,897,945 A | 4/1999 | Lieber et al. | 428/323 |
| 5,903,010 A | 5/1999 | Flory et al. | 257/24 |
| 5,909,624 A | 6/1999 | Yeager et al. | 438/396 |
| 5,914,553 A | 6/1999 | Adams et al. | 310/309 |
| 5,925,465 A | 7/1999 | Ebbesen et al. | 428/408 |
| 5,928,450 A | 7/1999 | Russell | 156/169 |
| 5,930,164 A | 7/1999 | Zhu | 365/158 |
| 5,939,785 A | 8/1999 | Klonis et al. | 257/729 |
| 5,946,228 A | 8/1999 | Abraham et al. | 365/173 |
| 5,946,930 A | 9/1999 | Anthony | 62/293 |
| 5,973,444 A | 10/1999 | Xu et al. | 313/309 |
| 5,985,446 A | 11/1999 | Lagow | 428/367 |
| 5,993,697 A | 11/1999 | Cohen et al. | 252/502 |
| 5,994,733 A | 11/1999 | Nishioka et al. | |
| 5,997,832 A | 12/1999 | Lieber et al. | 423/249 |
| 6,025,618 A | 2/2000 | Chen | 257/295 |
| 6,031,711 A | 2/2000 | Tennent et al. | 361/303 |
| 6,031,756 A | 2/2000 | Gimzewski et al. | 365/151 |
| 6,036,774 A | 3/2000 | Lieber et al. | 117/105 |
| 6,038,060 A | 3/2000 | Crowley | 359/328 |
| 6,038,637 A | 3/2000 | Berube et al. | 711/105 |
| 6,044,008 A | 3/2000 | Choi | 365/145 |
| 6,048,740 A | 4/2000 | Hsu et al. | |
| 6,049,856 A | 4/2000 | Bolyn | 711/168 |
| 6,051,866 A | 4/2000 | Shaw et al. | 257/417 |
| 6,052,263 A | 4/2000 | Gill | 360/113 |
| 6,052,313 A | 4/2000 | Atsumi et al. | |
| 6,057,637 A | 5/2000 | Zettl et al. | |
| 6,060,724 A | 5/2000 | Flory et al. | 257/24 |
| 6,062,931 A | 5/2000 | Chuang et al. | |
| 6,063,243 A | 5/2000 | Zettl et al. | 204/164 |
| 6,064,107 A | 5/2000 | Yeh et al. | |
| 6,069,380 A | 5/2000 | Chou et al. | 257/315 |
| 6,072,718 A | 6/2000 | Abraham et al. | 365/173 |
| 6,083,624 A | 7/2000 | Hiura | 428/408 |
| 6,087,293 A | 7/2000 | Carnahan et al. | |
| 6,088,760 A | 7/2000 | Walker et al. | 711/104 |
| 6,100,109 A | 8/2000 | Melzner et al. | 438/53 |
| 6,104,633 A | 8/2000 | Abraham et al. | 365/171 |
| 6,105,381 A | 8/2000 | Ghoshal | 62/259.2 |
| 6,108,725 A | 8/2000 | Chatter | 710/56 |
| 6,128,214 A | 10/2000 | Kuekes et al. | 365/151 |
| 6,136,160 A | 10/2000 | Hrkut et al. | 204/192.16 |

| Patent No. | Kind | Date | Inventor | Class |
|---|---|---|---|---|
| 6,138,219 | A | 10/2000 | Soman et al. | 711/149 |
| 6,144,481 | A | 11/2000 | Kowarz et al. | 359/291 |
| 6,146,227 | A | 11/2000 | Mancevski | 445/24 |
| 6,156,256 | A | 12/2000 | Kennel | 264/461 |
| 6,159,620 | A | 12/2000 | Heath et al. | 428/615 |
| 6,159,742 | A | 12/2000 | Lieber et al. | 436/164 |
| 6,165,890 | A | 12/2000 | Kohl et al. | |
| 6,166,948 | A | 12/2000 | Parkin et al. | 365/173 |
| 6,177,703 | B1 | 1/2001 | Cunningham | |
| 6,183,714 | B1 | 2/2001 | Smalley et al. | 423/447.3 |
| 6,187,823 | B1 | 2/2001 | Haddon et al. | 516/32 |
| 6,190,634 | B1 | 2/2001 | Lieber et al. | 423/439 |
| 6,198,655 | B1 | 3/2001 | Heath et al. | 365/151 |
| 6,203,814 | B1 | 3/2001 | Fisher et al. | 424/443 |
| 6,203,864 | B1 | 3/2001 | Zhang et al. | 427/592 |
| 6,212,597 | B1 | 4/2001 | Conlin et al. | 711/149 |
| 6,219,212 | B1 | 4/2001 | Gill et al. | 360/324.2 |
| 6,221,330 | B1 | 4/2001 | Moy et al. | 423/447.3 |
| 6,226,722 | B1 | 5/2001 | Shippy et al. | 711/168 |
| 6,231,744 | B1 | 5/2001 | Ying et al. | 205/324 |
| 6,231,980 | B1 | 5/2001 | Cohen et al. | 428/402 |
| 6,232,706 | B1 | 5/2001 | Dai et al. | 313/309 |
| 6,233,665 | B1 | 5/2001 | Bolyn | 711/168 |
| 6,237,130 | B1 | 5/2001 | Soman et al. | 716/10 |
| 6,239,547 | B1 | 5/2001 | Uemura et al. | 313/495 |
| 6,250,984 | B1 | 6/2001 | Jin et al. | 445/51 |
| 6,256,767 | B1 | 7/2001 | Kuekes et al. | |
| 6,259,277 | B1 | 7/2001 | Tour et al. | 326/136 |
| 6,262,469 | B1 | 7/2001 | Le et al. | |
| 6,277,318 | B1 | 8/2001 | Bower | 264/346 |
| 6,300,205 | B1 | 10/2001 | Fulford et al. | |
| 6,314,019 | B1 | 11/2001 | Kuekes et al. | |
| 6,320,428 | B1 | 11/2001 | Atsumi et al. | |
| 6,322,713 | B1 | 11/2001 | Choi et al. | 216/38 |
| 6,325,909 | B1 | 12/2001 | Li et al. | |
| 6,331,209 | B1 | 12/2001 | Jang et al. | |
| 6,333,016 | B1 | 12/2001 | Resasco et al. | 423/447.3 |
| 6,342,276 | B1 | 1/2002 | You et al. | |
| 6,346,413 | B1 | 2/2002 | Fodor et al. | |
| 6,348,295 | B1 | 2/2002 | Griffith et al. | |
| 6,348,700 | B1 | 2/2002 | Ellenbogen et al. | |
| 6,350,488 | B1 * | 2/2002 | Lee et al. | 427/249.1 |
| 6,354,133 | B1 | 3/2002 | Yedur et al. | 73/1.89 |
| 6,358,756 | B1 | 3/2002 | Sandhu et al. | |
| 6,361,861 | B2 | 3/2002 | Gao et al. | |
| 6,362,073 | B2 | 3/2002 | Kim | |
| 6,380,434 | B1 | 4/2002 | Chiang | |
| 6,400,088 | B1 | 6/2002 | Livingston et al. | |
| 6,400,091 | B1 | 6/2002 | Deguchi et al. | |
| 6,406,776 | B1 | 6/2002 | D'Evelyn | |
| 6,409,567 | B1 | 6/2002 | Amey et al. | |
| 6,413,487 | B1 | 7/2002 | Resasco et al. | 423/447.3 |
| 6,417,606 | B1 | 7/2002 | Nakamoto et al. | |
| 6,420,726 | B2 | 7/2002 | Choi et al. | |
| 6,421,271 | B1 | 7/2002 | Gogl et al. | |
| 6,422,450 | B1 | 7/2002 | Zhou et al. | |
| 6,423,583 | B1 * | 7/2002 | Avouris et al. | 438/132 |
| 6,426,134 | B1 | 7/2002 | Lavin et al. | |
| 6,443,901 | B1 | 9/2002 | Fraser | 500/459 |
| 6,445,006 | B1 | 9/2002 | Brandes et al. | 257/76 |
| 6,495,116 | B1 | 12/2002 | Herman | 423/447.3 |
| 6,495,258 | B1 | 12/2002 | Chen et al. | 428/408 |
| 6,515,339 | B2 | 2/2003 | Shin et al. | 257/358 |
| 6,528,020 | B1 * | 3/2003 | Dai et al. | 422/98 |
| 6,541,309 | B2 | 4/2003 | Chen | 438/118 |
| 6,566,983 | B2 | 5/2003 | Shin | 333/193 |
| 6,574,130 | B2 * | 6/2003 | Segal et al. | 365/129 |
| 6,586,965 | B2 | 7/2003 | Kuekes | 326/37 |
| 6,611,033 | B2 | 8/2003 | Hsu et al. | 257/414 |
| 6,630,772 | B1 | 10/2003 | Bower et al. | |
| 6,643,165 | B2 * | 11/2003 | Segal et al. | 365/151 |
| 6,645,628 | B2 | 11/2003 | Shiffler, Jr. et al. | |
| 6,706,402 | B2 | 3/2004 | Rueckes et al. | |
| 6,707,098 | B2 | 3/2004 | Hofmann et al. | |
| 6,808,746 | B1 * | 10/2004 | Dai et al. | 427/249.1 |
| 6,833,558 | B2 * | 12/2004 | Lee et al. | 257/49 |
| 6,858,197 | B1 | 2/2005 | Delzeit | |
| 6,863,942 | B2 | 3/2005 | Ren et al. | |
| 6,899,945 | B2 | 5/2005 | Smalley et al. | |
| 6,918,284 | B2 | 7/2005 | Snow et al. | |
| 6,919,592 | B2 | 7/2005 | Segal et al. | |
| 6,919,740 | B2 | 7/2005 | Snider | |
| 6,921,575 | B2 | 7/2005 | Horiuchi et al. | |
| 6,924,538 | B2 | 8/2005 | Jaiprakash et al. | |
| 6,946,410 | B2 | 9/2005 | French et al. | |
| 7,057,402 | B2 | 6/2006 | Cole et al. | |
| 2001/0004929 | A1 | 6/2001 | Han et al. | 216/4 |
| 2001/0004979 | A1 * | 6/2001 | Han et al. | 216/4 |
| 2001/0023123 | A1 | 9/2001 | Kim | |
| 2001/0023986 | A1 | 9/2001 | Mancevski | |
| 2002/0055010 | A1 | 5/2002 | Gao et al. | |
| 2002/0061441 | A1 | 5/2002 | Ogura et al. | |
| 2002/0068170 | A1 | 6/2002 | Smalley et al. | |
| 2002/0081380 | A1 | 6/2002 | Dillon et al. | |
| 2002/0081787 | A1 | 6/2002 | Kohl et al. | |
| 2002/0088938 | A1 | 7/2002 | Colbert et al. | |
| 2002/0090331 | A1 | 7/2002 | Smalley et al. | |
| 2002/0092983 | A1 | 7/2002 | Colbert et al. | |
| 2002/0092984 | A1 | 7/2002 | Colbert et al. | |
| 2002/0096634 | A1 | 7/2002 | Colbert et al. | |
| 2002/0098135 | A1 | 7/2002 | Smalley et al. | |
| 2002/0102193 | A1 | 8/2002 | Smalley et al. | |
| 2002/0102194 | A1 | 8/2002 | Smalley et al. | |
| 2002/0102196 | A1 | 8/2002 | Smalley et al. | |
| 2002/0102353 | A1 | 8/2002 | Mauthner et al. | |
| 2002/0112814 | A1 | 8/2002 | Hafner et al. | 156/272.2 |
| 2002/0125805 | A1 | 9/2002 | Hsu | 313/309 |
| 2002/0130353 | A1 | 9/2002 | Lieber et al. | 257/315 |
| 2002/0136896 | A1 * | 9/2002 | Takikawa et al. | 428/408 |
| 2002/0160111 | A1 | 10/2002 | Sun et al. | 427/248.1 |
| 2002/0172639 | A1 | 11/2002 | Horiuchi | 423/477.2 |
| 2002/0173083 | A1 | 11/2002 | Avouris et al. | 438/129 |
| 2002/0175323 | A1 | 11/2002 | Guillom et al. | 257/10 |
| 2002/0179434 | A1 | 12/2002 | Dai et al. | 204/242 |
| 2003/0004058 | A1 | 1/2003 | Li et al. | 502/258 |
| 2003/0021966 | A1 | 1/2003 | Segal et al. | 428/209 |
| 2003/0108480 | A1 | 6/2003 | Baker et al. | 432/447.3 |
| 2003/0122111 | A1 | 7/2003 | Glatkowski | |
| 2003/0177450 | A1 | 9/2003 | Nugent | |
| 2003/0200521 | A1 | 10/2003 | DeHon et al. | |
| 2004/0005723 | A1 | 1/2004 | Empedocles et al. | |
| 2004/0007528 | A1 | 1/2004 | Bakajin et al. | |
| 2004/0023253 | A1 | 2/2004 | Kunwar et al. | |
| 2004/0041154 | A1 | 3/2004 | Watanabe et al. | |
| 2004/0043527 | A1 | 3/2004 | Bradley et al. | |
| 2004/0071949 | A1 | 4/2004 | Glatkowski et al. | |
| 2004/0099438 | A1 | 5/2004 | Arthur et al. | |
| 2004/0104129 | A1 | 6/2004 | Gu et al. | |
| 2004/0181630 | A1 | 9/2004 | Jaiprakash et al. | |
| 2004/0253167 | A1 | 12/2004 | Silva et al. | |
| 2004/0265550 | A1 | 12/2004 | Glatkowski et al. | |
| 2005/0053525 | A1 | 3/2005 | Segal et al. | |
| 2005/0095938 | A1 | 5/2005 | Rosenberger et al. | |
| 2007/0004191 | A1 | 1/2007 | Gu et al. | |

FOREIGN PATENT DOCUMENTS

| | | |
|---|---|---|
| EP | 0 269 225 A2 | 6/1988 |
| EP | 0 269 225 A3 | 6/1988 |
| EP | 441409 A3 | 7/1988 |
| EP | 441409 B1 | 7/1988 |
| EP | 0 269 716 A2 | 12/1988 |
| EP | 0 296 716 A3 | 12/1988 |
| EP | 0 315 392 A2 | 5/1989 |
| EP | 0 315 392 A3 | 5/1989 |
| EP | 426282 B1 | 8/1990 |

| | | |
|---|---|---|
| EP | 0 613 130 A1 | 8/1994 |
| EP | 0 665 187 A1 | 8/1995 |
| EP | 0 688 618 A2 | 8/1995 |
| EP | 0 688 618 A3 | 8/1995 |
| EP | 758028 A3 | 7/1996 |
| EP | 1209123 A2 | 9/1996 |
| EP | 0 665 187 B1 | 12/1997 |
| EP | 0 947 466 A1 | 10/1999 |
| EP | 0 989 579 A3 | 3/2000 |
| EP | 0 945 402 A1 | 9/2000 |
| EP | 1 046 613 A2 | 10/2000 |
| EP | 1225613 A1 | 10/2000 |
| EP | 1 052 520 A1 | 11/2000 |
| EP | 1 054 249 A1 | 11/2000 |
| EP | 1 059 266 A3 | 12/2000 |
| EP | 1 061 040 A1 | 12/2000 |
| EP | 1 061 043 A1 | 12/2000 |
| EP | 1 061 044 A1 | 12/2000 |
| EP | 1 061 544 A1 | 12/2000 |
| EP | 1 061 555 A1 | 12/2000 |
| EP | 1 069 206 A2 | 1/2001 |
| EP | 1 072 693 A1 | 1/2001 |
| EP | 1132920 A2 | 2/2001 |
| EP | 1 100 106 A2 | 5/2001 |
| EP | 1 100 297 A2 | 5/2001 |
| EP | 1096533 | 5/2001 |
| EP | 1205436 A1 | 11/2001 |
| GB | 2364933 A | 7/2001 |
| GB | 2364933 | 2/2002 |
| JP | 11-011917 | 1/1999 |
| JP | 2000-203821 | 7/2000 |
| JP | 2001-035362 A * | 2/2001 |
| JP | 2001 181842 A | 7/2001 |
| JP | 2004-090208 | 3/2004 |
| WO | WO 95/02709 | 1/1995 |
| WO | WO 96/38410 | 12/1996 |
| WO | WO 96/41043 | 12/1996 |
| WO | WO 97/09272 | 3/1997 |
| WO | WO 97/22971 | 6/1997 |
| WO | WO 97/31139 | 8/1997 |
| WO | WO 97/43473 | 11/1997 |
| WO | WO 98/26871 | 6/1998 |
| WO | WO 98/39250 | 9/1998 |
| WO | WO 98/39251 | 9/1998 |
| WO | WO 98/42620 | 10/1998 |
| WO | WO 98/48456 | 10/1998 |
| WO | WO 99/06618 | 2/1999 |
| WO | WO 00/08650 | 8/1999 |
| WO | WO 99/47570 | 9/1999 |
| WO | WO 99/48810 | 9/1999 |
| WO | WO 99/58748 | 11/1999 |
| WO | WO 99/65821 | 12/1999 |
| WO | WO 00/09443 | 2/2000 |
| WO | WO 00/17101 | 3/2000 |
| WO | WO 00/19494 | 4/2000 |
| WO | WO 00/63115 | 4/2000 |
| WO | WO 00/44094 | 7/2000 |
| WO | WO 00/48195 | 8/2000 |
| WO | WO 00/63115 | 10/2000 |
| WO | WO 01/03208 | 10/2000 |
| WO | WO 00/73204 | 12/2000 |
| WO | WO-00/76912 A | 12/2000 |
| WO | WO 01/03208 | 1/2001 |
| WO | WO-01/03208 A1 | 1/2001 |
| WO | WO 01/032208 | 1/2001 |
| WO | WO 01/18246 | 3/2001 |
| WO | WO 01/23303 | 4/2001 |
| WO | WO 01/44796 | 6/2001 |
| WO | WO 02/19420 | 3/2002 |
| WO | WO 02/37500 | 5/2002 |
| WO | WO 02/38496 | 5/2002 |
| WO | WO 02/42204 | 5/2002 |
| WO | WO-02/45113 | 6/2002 |
| WO | WO 02/48701 | 6/2002 |
| WO | WO 02/48822 | 6/2002 |
| WO | WO 02/054505 | 7/2002 |
| WO | WO 02/059898 | 8/2002 |
| WO | WO 02/060812 | 8/2002 |
| WO | WO 02/060813 | 8/2002 |
| WO | WO-03/016901 | 2/2003 |
| WO | WO-03/034142 A1 | 4/2003 |

OTHER PUBLICATIONS

Homma, Y., "Single-Walled Carbon Nanotube Growth on Silicon Substrates Using Nanoparticle Catalysts", Jpn. J. Appl. Phys., vol. 41 (2002), pp. L89-L91.
Snow, E.S. et al., "Random Networks of Carbon Nanotubes as an Electronic Material." Applied Physics Letters, Mar. 31, 2003, vol. 82, No. 13, 2145-2147.
Bernholc et al., "Mechanical and Electrical Properties of Nanotubes", Annu. Rev. Mater. Res., 32 (2002) 347.
Kaneto, K., et al., "Electrical conductivities of multi-wall carbon nano tubes", Synthetic Metals, Elsevier Science S.A. (1999) vol. 103, pp. 2543-2546.
Winslow, Troy. "Advanced+ Boot Block World's First 0.18-Micron Flash Memory." Flash Products Group. Apr. 17, 2000.
"Double Sided 4Mb SRAM Coupled Cap PBGA Card Assembly Guide." International Business Machines Corp. (IBM), 1998.
Tyagi et al. "A 130nm Generation Logic Technology Featuring 70nm Transistors, Dual Vt Transistors and 6 Layers of Cu Interconnects." Portland Technology Development.
"Preliminary: 8Mb (256K×36 & 512K×18) and 4Mb (128K×36 & 256K×18) [IBM0418A8CBLBB, IBM0418A4CBLBB, IBM0436A8CBLBB, IBM0436A4CBLBB]." International Business Machines Corp. (IBM), 1998.
Wei, Chengyu et al. "Temperature and Stain-Rate Dependent Plastic Deformation of Carbon Nanotube."
"Package Mechanicals for USAR ICs." USAR Systems, Inc., 1998.
Dipert, Brian. "Exotic Memories, Diverse Approaches." EDN Magazine. Apr. 26, 2001, 56-70.
Duan, Xiangfeng. "Indium Phosphide Nanowires as Building Blocks for Nanoscale Electronic and Optoelectronic Devices." Nature (2001); 409: 66-69.
Yang. "A High Performance 180 nm Generation Logic Technology." Portland Technology Development.
Dai, Hongjie. "Controlled Chemical Routes to Nanotube Architectures, Physics, and Devices." The Journal of Physical Chemistry B (1999); 103: 11246-11255.
Callaby, D. Roy et al. "Solid State Memory Study Final Report." National Media Lab, Feb. 1994.
Cui, Yi. "Doping and Electrical Transport in Silicon Nanowires." The Journal of Physical Chemistry B (2000); vol. 104, No. 22: 5213-5216.
Li, Mingtao et al. "Direct Three-dimensional Patterning Using Nanoimprint Lithography." *Applied Physics Letters* (2000); vol. 78, No. 21: 3322-3324.
"8 Mb Synchronous Communication SRAM (IBM0418A86LQKA, IMB0418A86SQKA, IBM0436A86IQKA, IBM436A86SQKA)." International Business Machines Corp. (IBM), 1999.
Dipert, Brian. "Memory Cards: Designing with a Full Deck." EDN Magazine. May 25, 2000.
Schönenberger, Christian et al. "Physics of Multiwall Carbon Nanotubes." *Physics World*. Apr. 4, 2000.
Whatmore, Roger W. "Nanotechnology." *Ingenia*. Feb. 2000.
"Nanochip NC800SX, 0.8 Gbyte Molecular Memory IC (R/W), Nanochip NC200SX, 0.2 Gbyte Molecular Memory IC (R/W), Nanochip NCM4510SX, Molecular Array Read/write Engine, Low Voltage Thermal Actuated, Dynamic Media Series M2, Nanochip NC4525DX, A/D-D/A Interface, Preliminary Specifications, Advance Information, (C) 1996-2000 Nanochip Document NCM2230500."
Odom, Teri Wang et al. "Atomic Structure and Electronic Properties of Single-Walled Carbon Nanotubes." *Nature* (1998); 391: 62-64.
Ouyang, Min. "Atomically Resolved Single-Walled Carbon Nanotube Intramolecular Junctions." *Science* (2001); 291: 97-100.

Odom, Teri Wang et al. "Magnetic Clusters on Single-Walled Carbon Nanotubes: The Kondo Effect in a One-Dimensional Host." *Science* (2000); 290: 1549-1552.

Wong, Eric et al. "Nanobeam Mechanics: Elasticity, Strength, and Toughness of Nanorods and Nanotubes." *Science* (1997); 277: 1971-1975.

Hu, Jiangtao et al. "Controlled Growth and Electrical Properties of Heterojunctions of Carbon Nanotubes and Silicon Nanowires." *Nature* (1999); 399: 48-51.

Rueckes, Thomas et al. "Carbon Nanotube-Based Nonvolatile Random Access Memory for Molecular Computing." *Science* (2000); 289: 94-7.

Kim, Philip et al. "Nanotube Nanotweezers." *Science* (1999); 286: 2148-2150.

Huang, Yu et al. "Directed Assembly of One-Dimensional Nanostructures into Functional Networks." *Science* (2001); 291: 630-33.

Cui, Yi et al. "Functional Nanoscale Electronic Devices Assembled Using Silicon Nanowire Building Blocks." *Science* (2001); 291: 851-53.

Oullette, Jennifer. "Exploiting Molecular Self-Assembly." *The Industrial Physicist*. American Institute of Physics, Dec. 2000.

Peng, Shu et al. "Chemical Control of Nanotube Electronics." *Nanotechnology* (2000); 11: 57-60.

"The Ultimate Memory Guide." Kingston Technology (1998).

Morales, Alfredo et al. "A Laser Ablation Method for the Synthesis of Crystalline Semiconductor Nanowires." *Science* (1998); 279: 208-11.

Franklin, Nathan R. and Hongjie Dai, "An Enhanced CVD Approach to Extensive Nanotube Networks with Directionality." *Advanced Materials* (2000): 890-894.

Kong, Jing; Chongwu Zhou; Erhan Yenilmez; Hongjie Dal. "Alkaline metal-doped n-type semiconducting nanotubes as quantum dots." *ApplieDPhysics Letters* (Dec. 11, 2000): 3977-3979.

Tombler, Thomas W.; Chongwu Zhou; Jing Kong; Hongjie Dai. "Gating individual nanotubes and crossed with scanning probes." *Applied Physics Letters* ( Apr. 24, 2000): 2412-2414.

Zhou, Chongwu: et al. "Electrical measurements of individual semiconducting single-walled carbon nanotubes of various diameters." *Applied Physics Letters* (Mar. 20, 2000): 1597-1599.

Zhang, Y. and Hongjie Dai. "Formation of metal nanowires on suspended single-walled carbon nanotubes." *Applied Physics Letters* (Nov. 6, 2000): 3015-3017.

Chen, Robert J. et al. "Molecular photodesorption from single-walled carbon nanotubes." *Applied Physics Letters* (Oct. 1, 2001): 2258-2260.

Zhang, Y.et al. "Electric-field-directed growth of aligned single-walled carbon nanotubes." *Applied Physics Letters* (Nov. 5, 2001): 3155-3157.

Zhang, Y. et al. "Metal coating on suspended carbon nanotubes and its implication to metal-tube interaction." *Chemical Physics Letters* (Nov. 24, 2000): 35-41.

Chen, Robert J. et al. "Noncovalent Sidewall Functionalization of Single-Walled Carbon Nanotubes for Protein Immobilization." *American Chemical Society* (2001): 3838-3839.

Li, Yiming et al. "Growth of Single-Walled Carbon Nanotubes from Discrete Catalytic Nanoparticles of Various Sizes." *American Chemical Society* (2001).

Cassell, Alan M. et al. "Large Scale CVD Synthesis of Single-Walled Carbon Nanotubes." *American Chemical Society* (1999): 6484-6492.

Fan Shoushan et al. "Carbon nanotube arrays on silicon substrates and their possible application." *Physica E* (2000): 179-183.

Liu, Lei et al. "Controllable Reversibility of an sp2 to sp3 Transition of a single Wall Nanotube under the Manipulation of an AFM Tip." *Physical Review Letters* (May 22, 2000): 4950-4953.

Kong, Jing et al. "Quantum Interference and Ballistic Transmission in Nanotube Electron Waveguides." *Physical Review Letters* (Sep. 3, 2001); 87, 106801(4).

Liu, C. et al. "Synthesis of Macroscopically Long Ropes of Well-Aligned Single-Walled Carbon Nanotubes." *Advanced Materials* (Aug. 16, 2000); 12, 1190-1192.

Kiang, Ching-Hwa. "Growth of Large-Diameter Single-Walled Carbon Nanotubes." *American Chemical Society* (2000); 104, 2454-2456.

Cheung. Chin Li et al. "Growth and fabrication with single-walled carbon nanotube probe microscopy tips." *Applied Physics Letters* (2000); 76, 3136-3138.

Bozovic, Dolores et al: "Electronic properties of mechanically induced kinds on single-walled carbon nanotubes." *Applied Physics Letters* (Jun. 4, 2001); 78, 3693-3695.

Hafner, Jason H. et al. "High-Yield Assembly of Individual Single-Walled Carbon Nanotube Tips for Scanning Prone Microscopies." *The Journal of Physical Chemistry* (Feb. 1, 2001); 105, 743-746.

Hafner, J.H. et al. "Structural and functional Imaging with carbon nanotube AFM probes." *Progress in Biophysics & Molecular Biology* (2001); 77, 73-110.

Jorio, A. et al. "Joint density of electronic states for one isolated single-wall carbon nanotube studied by resonant Raman scattering." *Physical Review B* (2001); 63: 24541(4).

Filho, A. G. Souza et al. "Electronic transition energy Eii for an isolated (n, m) single-wall carbon nanotube obtained by anti-Stokes/Stokes resonant Raman intensity ratio." *Physical Review* (2002); 63, 241404(4).

Saito, R. et al. "Chirality-dependent G-band Raman intensity of carbon nanotubes." *Physical Review* (2001); 64, 085312(7).

Jorio, A. et al. "Structural (n, m) Determination of Isolated Single-Wall Carbon Nanotubes by Resonant Raman Scattering." *Physical Review Letters* (Feb. 5, 2001); 86, 1118-1121.

Woolley, Adam T. et al. "Structural biology with carbon nanotube AFM probes." *Chemistry & Biology* (2000); 7, R193-204.

Li, Yan et al. "Preparation of Monodispersed Fe-Mo Nanoparticles as the Catalyst for CVD Synthesis of Carbon Nanotubes." *Chemical Material* (2001): 13; 1008-1014.

Rao, C. N. R. et al. "Nanotubes." *CHEMPHYCHEM* (2001); 2, 78-105.

Nerushev, Oleg A. et al. "Carbon nanotube films obtained by thermal chemical vapor deposition." *Journal of Chemistry Materials* (2001); 11, 1122-1132.

Flahaut, E. et al. "Synthesis of single-walled carbon nanotube-Co-MgO composite powders and extraction of the nanotubes." *Journal of Chemical Materials* (2000); 10, 249-252.

Dresselhaus, Mildred S. and Phaedon Avouris. "Introduction to Carbon Materials Research." *Topics Applied Physics* (2001); 80, 1-9.

Dresselhaus, Mildred S. and Morinobu Endo. "Relation of Carbon Nanotubes to Other Carbon Materials." *Topics in Applied Physics* (2001); 80, 11-28.

Dai, Hongjie. "Nanotube Growth and Characterization." *Topics in Applied Physics* (2001); 80, 29-53.

Charlier, Jean-Chrisophe and Surnio Iijima. "Growth Mechanisms of Carbon Nanotubes." *Topics in Applied Physics* (2001); 80, 55-81.

Tenne, Richard and Alex K. Zettl. "Nanotubes from Inorganic Materials." *Topics in Applied Physics* (2001); 80, 81-112.

Louie, Steven G. "Electronic Properties, Junctions, and Defects of Carbon Nanotubes." *Topics in Applied Physics* (2001); 80, 113-145.

Yao, Zhen et al. "Electrical Transport Through Single-Wall Carbon Nanotubes." *Topics in Applied Physics* (2001); 80, 147-171.

Odom, Teri Wang et al. "Scanning Probe Microscopy Studies of Carbon Nanotubes." *Topics in Applied Physics* ((2001); 80, 173-211.

Saito, Riichiro and Hiromichi Kataura. "Optical Properties and Raman Spectroscopy of Carbon Nanotubes." *Topics in Applied Physics* (2001); 80, 213-247.

Fink, Joerg H. and Philippe Lambin. "Electron Spectroscopy Studies of Carbon Nanotubes." *Topics in Applied Physics* (2001); 80, 247-272.

Hone, James. "Phonons and Thermal Properties of Carbon Nanotubes." *Topics of Applied Physics* (2001); 80, 273-286.

Yakobson, Boris I. And Phaedon Avouris. "Mechanical Properties of Carbon Nanotubes." *Topics in Applied Physics* (2001); 80, 287-327.

Forro, Laszlo and Christian Schoenenberger. "Physical Properties of Multi-wall Nanotubes." *Topics in Applied Physics* (2001); 80, 329-391.

Ajayan, Pulickel M. and Otto Z. Zhou. "Applications of Carbon Nanotubes." *Topics in Applied Physics* (2001); 80, 391-425.

Kong, J. et al. "Synthesis, integration, and electrical properties of individual single-walled carbon nanotubes." *Applied Physics A* (1999); 69, 305-308.

Dai, Hongjie et al. "Exploiting the properties of carbon nanotubes for nanolithography." *Applied Physics Letters* (Sep. 14, 1998); 73, 1508-1510.

Soh, Hyongsok T. et al. "Integrated nanotube circuits." *Applied Physics Letters* (Aug. 2, 1999); 75, 627-629.

Bozler, C.O., et al., "Fabrication and Microwave Performance of the Permeable Base Transistor," *IEEE Tech. Dig. Int. Electron Devices Meeting* (1979) 384.

Cheng, H. M. et al. "Large-scale and low-cost synthesis of single-walled carbon nanotubes by the catalytic pyrolysis of hydrocarbons." *Applied Physics Letters* (Jun. 22, 1998); 72, 3282-3284.

Shim, Moonsub et al. "Polymer Functionalization for Air-Stable n-Type Carbon Nanotube Field-Effect Transistors." *Journal of American Chemical Society* (2001); 123, 11512-11513.

Haddon, R. C. "C70 Thin Film Transistors." *Journal of the American Chemical Society* (1996); 118, 3041-3042.

Hafner, Jason H. et al. "Direct Growth of Single-Walled Carbon Nanotube Scanning Probe Microscopy Tips." *Journal of the American Chemical Society* (1999); 121, 9750-9751.

Hafner, Jason H. et al. "Growth of nanotubes for probe microscopy tips." *Scientific Correspondence* (Apr. 29, 1999); 398, 761, 762.

Bekyarova, E. et al. "Oxidation and Porosity Evaluation of Budlike Single-Wall Carbon Nanohorn Aggregates." *American Chemical Society* (2002).

Hafner, Jason H. et al. "Catalytic growth of single-wall carbon nanotubes from metal particles." *Chemical Physics Letters* (Oct. 30, 1998); 296, 195-202.

Kiang, Ching-Hwa. "Growth of Large-Diameter Single-Walled Carbon Nanotubes." *Journal of Physical Chemistry A*. (2000); 104, 2454-2456.

Zhou, Chongwu et al. "Electrical measurements of individual semiconducting single-walled carbon nanotubes of various diameters." *Applied Physics Letters* (Mar. 20, 2000); 76, 1597-1599.

Yu, et al., *J. Phys. Chem. B*, 105:6831-6837 (2001).

Berber, S., *Phys. Rev. Lett*, 84, 4613 (2000).

Bahr, Jeffrey L. and James. M. Tour. "Highly Functionalized Carbon Nanotubes Using in Situ Generated Diazonium Compounds." *Chemical Materials* (2001); 13, 3823-3824.

Peigney, Alain et al. "A Study of the Formation of Single- and Double-Walled Carbon Nanotubes by a CVD Method." *Journal of Physical Chemistry B* (2001); 105, 9699-9710.

Yao, B. D. and N. Wang. "Carbon Nanotube Arrays Prepared by MWCVD." *Journal of Physical Chemistry* (2001); 105, 11395-11398.

Ago, Hiroki et al. "Gas-Phase Synthesis of Single-wall Carbon Nanotubes from Colloidal Solution of Metal Nanoparticles." *Journal of Physical Chemistry B* (Nov. 1, 2001); 105, 10453-10456.

Li, Yiming et al. "Growth of Single-Walled Carbon Nanotubes from Discrete Catalytic Nanoparticles of Various Sizes." *Journal of Physical Chemistry B* (2001); 105, 11424-11431.

Ng, Hou Tee et al. "Soft-Lithography-Mediated Chemical Vapor Deposition of Architectured Carbon Nanotube Networks on Elastomeric Polymer." *American Chemical Society* (2001).

Derycke, V. et al. "Carbon Nanotube Inter-and Intramolecular Logic Gates." *Nano Letters* (Sep. 2001); 1, 453-456.

Erkoc et al., *Int. J. Modem Phys. C*, 12:865-870 (2001).

Benerjee, Sarbajit and Stanislaus S. Wong. "Functionalization of Carbon Nanotubes with a Metal-Containing Molecular Complex." *Nano Letters* (2001); 0, A-E.

Reynoso, J. 391PGA Drawings (3): Project No. 32639103. *Kyocera America, Inc.* (Apr. 12, 1994).

Diehl, Michael R. et al. "Self-Assembled, Deterministic Carbon Nanotube Wiring Networks." *Angew. Chemical International Edition* (2002); 41, 353-356.

Table of Contents for Semiconductor Consulting Services (1999).

Sidorov, S. N. et al. "Cobalt Nanoparticle Formation in the Pores of Hyper-Cross-Linked Polystyrene." *Chemical Materials* (1999); 11, 3210-3215.

Brown, David A. et al. "Kinetics of Inron(III) Chelation from Polynuclear Oxo-Hydroxy Aggregates by Hydroxamic Acids." *Inorganic Chemistry* (1999); 38, 5198-5202.

Douglas, Trevor and Vistoria T. Stark. "Nanophase Cobalt Oxyhydroxide Mineral Synthesized within the Protein Cage of Ferritin." *Inorganic Chemistry* (2000); 39, 1828-1830.

Hatzikonstantinidou et al., Phys. Scripta 54: 226-229 (1994).

Cao, Anyuan et al. "Macroscopic Three-Dimensional Arrays of Fe Nanoparticles Supported in Aligned Carbon Nanotubes." *The Journal of Physical Chemistry B* (2001); 105, 11937-11940.

Li, Shoutian et al. "Semiconductor Nanoparticles in Contact: Quenching of the Photoluminescence from Silicon Nanocrystals by WO3 nanoparticles Suspended in Solution." *The Journal of Physical Chemistry B* (1998); 102, 7319-7322.

Zhang, Shengjun et al. "Select Pathways to Caron Nanotube Film Growth." *Advanced Materials* (Dec. 3, 2001); 13, 1767-1770.

Wei, B. Q. et al. "Organized assembly of carbon nanotubes." *Nature* (Apr. 4, 2002); 416, 495-496.

Zhao, Y.-P. et al. "Frequency-dependent electrical transport in carbon nanotubes." *Physical Review B* (2001); 64, 201402(4).

Zhu, H.W. et al. "Direct Synthesis of Long Single-Walled Carbon Nanotube Strands." *Science* (May 3, 2002); 296, 884-886.

Ajayan, P. M. et al. "Nanotubes in a Flash—Ignition and Reconstruction." *Science* (Apr. 26, 2002); 296, 705.

Franklin, Nathan R. et al. "Patterned growth of single-walled carbon nanotubes on full 4-inch wafers." *Applied Physics Letters* (Dec. 31, 2001); 79, 4571-4573.

Fan, Shoushan et al. "Self-Oriented Regular Arrays of Carbon Nanotubes and Their Field Emission Properties." *Science* (Jan. 22, 1999); 283, 512-514.

Sohn, Jung Inn, et al., "Patterned selective growth of carbon nanotubes and large field emission from vertically well-aligned carbon nanotube field emitter arrays." *Appl. Phys. Letters* (Feb. 12, 2001); 78; 901-903.

Postma, Henk W. C. et al. "Manipulation and Imaging of Individual Single-Walled Carbon Nanotubes with an Atomic Force Microscope." *Advanced Materials* (Sep. 1, 2000); 12, 1299-1302.

Chen, J. et al., "Large On-Off Ratios and Negative Differential Resistance in a Molecular Electronic Device," *Science*, vol. 286, Nov. 19, 1999, pp. 1550-151.

Collier, C.P., et al., "Electronically Configurable Molecular-Based Logic Gates," *Science*, vol. 285, Jul. 16, 1999, pp. 391-394.

"IBM Builds Tiny Transistor that Beats Silicon", *Technology—Reuters*, Yahoo, May 16, 2002.

Yao, Z., et al, *Phys. Rev. Lett*, 84, 2941 (2000).

Tans, Sander J., "Room-temperature transistor based on a single carbon nanotube," Nature, May 1998, vol. 393, pp. 49-52.

Dillon, Anne C., "A Simple and Complete Purification of Single-Walled Carbon Nanotube Materials," Advanced Materials, 1999, vol. 11, pp. 1354-1358.

Cleland, A.N., "Single-crystal aluminum nitride nanomechanical resonators," Applied Physics Letters, Sep. 24, 2001, vol. 79, pp. 2070-2072.

Ramsperger, U., "Fabrication and lateral electronic transport measurements of gold nanowires," Applied Physics Letters, Jan. 1, 2001, vol. 78, pp. 85-87.

Calleja, M., "Fabrication of gold nanowires on insulating substrates by field-induced mass transport," Applied Physics Letters, Oct. 8, 2001, vol. 79, pp. 2471-2473.

Kluth, P., "Fabrication of epitaxial $CoSi_2$ nanowires," Applied Physics Letters, Aug. 6, 2001, vol. 79, pp. 824-826.

Zhang, Y., "Formation of metal nanowires on suspended single-walled carbon nanotubes," Applied Physics Letters, Nov. 6, 2000, vol. 77, pp. 3015-3017.

Berry, A.D., "Fabrication of GaAs and InAs wires in nanochannel gas," Applied Physics Letters, Nov. 4, 1996, vol. 69, pp. 2846-2848.

Li, Jian-Long, "Spontaneous formation of ordered indium nanowire array on Si(001)," Applied Physics Letters, Oct. 22, 2001, vol. 79, pp. 2826-2828.

Jorritsma, J., "Fabrication of large arrays of metallic nanowires on V-grooved substrates," Applied Physics Letters, Sep. 4, 1995, vol. 67, pp. 1489-1491.

Sekiba, Daiichiro, "Fabrication of stable nanopatterns on metals," Applied Physics Letters, Sep. 30, 2002, vol. 81, pp. 2632-2634.

Yin, A. J., "Fabrication of highly ordered metallic nanowire arrays by electrodeposition," Applied Physics Letters, Aug. 31, 2001, vol. 79, pp. 1039-1041.

He, J. Z., "Dispersion, refinement, and manipulation of single silicon nanowires," Applied Physics Letters, Mar. 11, 2002, vol. 80, pp. 1812-1814.

Franklin, Nathan R., "Integration of suspended carbon nanotube arrays into electronic devices and electromechanical systems," Applied Physics Letters, Jul. 29, 2002, vol. 81, pp. 913-915.

Homma, Yoshikazu, "Growth of suspended carbon nanotube networks on 100-nm-scale silicon pillars," Applied Physics Letters, Sep. 16, 2002, vol. 81, pp. 2261-2263.

Yenilmez, Erhan, "Wafer scale production of carbon nanotube scanning probe tips for atomic force microscopy," Applied Physics Letters, Mar. 25, 2002, vol. 80, pp. 2225-2227.

Sax, Harald, "Polysilicon Overfill Etch Back Using Wet Chemical Spin-process Technology," 7 pgs.

Dinaro, Joanna, "Analysis of an Elementary Reaction Mechanism for Benzene Oxidation in Supercritical Water, Combustion Institute," 2000, vol. 28, pp. 1529-1536.

Monthioux, M., "Sensitivity of single-wall carbon nanotubes to chemical processing: an electron microscopy investigation," Carbon, 2001, vol. 39, pp. 1251-1272.

Hou, P. X., "Multi-step purification of carbon nanotubes," 2002 Elsevier Science Ltd., Mar. 8, 2001, vol. 40, pp. 81-85.

Avouris, P., "Carbon nanotube electronics," Carbon, 2002, vol. 40, pp. 429-445.

Chen, Bin, "Heterogeneous Single-Walled Carbon Nanotube Catalyst Discovery and Optimization," Chemical Materials, Dec. 7, 2001, vol. 14, pp. 1891-1896.

Maurin, I., "Carbon Miscibility in the Boron Layers of the $MgB_2$ Superconductor," Chemical Materials, 2002, pp. A-D.

Hyeon-Lee, Jingyu, "Aero-Sol-Gel Synthesis of Nanostructured Silica Powders," Chemical Materials, 1997, vol. 9, pp. 2400-2403.

McEuen, Paul L., Single-Walled Carbon Nanotube Electronics, to be published in the inaugural issue of the IEEE Transactions on Nanotechnology (2002), 9 pgs.

Dürkop, T., "Nanotubes are High Mobility Semiconductors," Department of Physics, University of Maryland, 4 pgs.

Choi, Hee Cheul, "Spontaneous Reduction of Metal Ions on the Sidewalls of Carbon Nanotubes," J. Amer. Chem. Soc., May 7, 2002, pp. A-B.

Zheng, Bo, "Efficient CVD Growth of Single-Walled Carbon Nanotubes on Surfaces Using Carbon Monoxide Precursor,"Nano Letters, 2002, pp. A-D.

Deng, S. Z., "Synthesis of silicon carbide nanowires in a catalyst-assisted process," Chemical Physics Letters, Apr. 26, 2002, vol. 356, pp. 511-514.

Zhang, R. Q., "Silicon nanotubes: Why not?," Chemical Physics Letters, 2002, vol. 364, pp. 251-258.

Lei, Y., "Fabrication, characterization and Raman study of $TiO_2$ nanowire arrays prepared by anodic oxidative hydrolysis of $TiCl_3$," Chemical Physics Letters, 2001, vol. 338, pp. 231-236.

Zheng, M. J., "Fabrication and optical properties of large-scale uniform zinc oxide nanowire arrays by one-step electrochemical deposition technique," Chemical Physics Letters, 2002, vol. 363, pp. 123-128.

O'Connell, Michael J., "Reversible water-solubilization of single-walled carbon nanotubes by polymer wrapping," Chemical Physics Letters, 2001, vol. 342, pp. 265-271.

Huang, Houjin, "Purification and alignment of arc-synthesis single-walled carbon nanotube bundles," Chemical Physics Letters,2002, vol. 356, pp. 567-572.

Kong, Jing, "Chemical vapor deposition of methane for single-walled carbon nanotubes," Chemical Physics Letters, 1998, vol. 292, pp. 567-574.

Bergbreiter, David E., "Using Soluble Polymers To Recover Catalysts and Ligands," Chemical Reviews, Mar. 5, 2002, pp. A-AM.

Roucoux, Alain, "Reduced Transition Metal Colloids: A Novel Family of Reusable Catalysts?," Chemical Reviews, Jan. 30, 2002, pp. A-V.

Yoshida, Jun-ichi, "Tag Strategy for Separation and Recovery," Chemical Reviews, Mar. 18, 2002, pp. A-X.

De Vos, Dirk E., "Ordered Mesoporous and Microporous Molecular Sieves Functionalized with Transition Metal Complexes as Catalysts for Selective Organic Transformations," Chemical Reviews, Jan. 31, 2002, pp. A-Z.

Connelly, Neil G., "Chemical Redox Agents for Organometallic Chemistry," Chemical Reviews, Jan. 9, 1996, vol. 96, pp. 877-910.

Dequesnes, Marc, "Calculation of pull-in voltages for carbon-nanotube-based nanoelectromechanical switches," Nanotechnology, Jan. 22, 2002, vol. 13, pp. 120-131.

Serp, Philippe, "Chemical Vapor Deposition Methods for the Controlled Preparation of Supported Catalytic Materials," Chemical Reviews, Apr. 10, 2002, pp. A-AR.

Diehl, Michael R., "Self-Assembled, Deterministic Carbon Nanotube Wiring Networks," Angew. Chem. Int. Ed., 200 vol. 41, pp. 353-356.

Wind, S.J., "Localized and Directed Lateral Growth of Carbon Nanotubes from a Porous Template," IBM T.J. Watson Research Center, 17 pgs.

Wind, S. J., "Fabrication and Electrical Characterization of Top Gate Single-Wall Carbon Nanotube Field-Effect Transistors," IBM T. J. Watson Research Center, 14 pgs.

Harutyunyan, Avetik R., "CVD Synthesis of Single Wall Carbon Nanotubes under "Soft" Conditions," Nano Letters, Feb. 25, 2002, pp. A-F.

Massot, L., "Electrodeposition of carbon films from molten alkaline fluoride media," Electrochimica Acta, Jan. 28, 2002, vol. 47, pp. 1949-1957.

Heinze, S., "Carbon Nanotubes as Schottky Barrier Transistors," Physical Review Letters, Sep. 2, 2002, vol. 89, pp. 106801-1 through 106801-4.

Duan, Xiangfeng, "Indium phosphide nanowires as building blocks for nanoscale electronic and optoelectronic devices," Nature, Jan. 4, 2001, vol. 409, pp. 66-69.

Chen, Robert J., "Noncovalent Sidewall Functionalization of Single-Walled Carbon Nanotubes for Protein Immobilization," J. Amer. Chem. Soc., 2001, vol. 123, pp. 3838-3839.

Puntes, Victor F., "Synthesis of hcp-Co Nanodisks," J. Amer. Chem. Soc., 2002, vol. 124, pp. 12874-12880.

An, Lei, "Synthesis of Nearly Uniform Single-Walled Carbon Nanotubes Using Identical Metal-Containing Molecular Nanoclusters as Catalysts," j. Amer. Chem. Soc., 2002, vol. (?), total of 4 pgs.

Cassell, Alan M., "Directed Growth of Free-Standing Single-Walled Carbon Nanotubes," American Chemical Society, Jun. 21, 1999, vol. 121, pp. 7975-7976.

Bahr, Jeffrey L., "Functionalization of Carbon Nanotubes by Electrochemical Reduction of Aryl Diazonium Salts: A Bucky Paper Electrode," American Chemical Society, 2001, vol. 123, pp. 6536-6542.

Fruchart, O., "Vertical self-organization of epitaxial magnetic nanostructures," Journal of Magnetism and Magnetic Materials, 2002, vol. 239, pp. 224-227.

Zhang, J., "Fabrication and photoluminescence of ordered GaN nanowire arrays," Journal of Chemical Physics, Oct. 1, 2001, vol. 115, pp. 5714-5717.

Dubois, S., "Fabrication and properties of arrays of superconducting nanowires," Journal of Materials Research Mar. 1999, vol. 14, pp. 665-671.

Liu, Z.Q., "Synthesis of $\alpha$-$SiO_2$ nanowires using Au nanoparticle catalysts of a silicon substrate," Journal of Materials Research, Mar. 2001, vol. 16, pp. 683-686.

Lei, Y, Fabrication, characterization, and photoluminescence properties of highly ordered $TiO_2$ nanowire arrays, J. Material Research, Apr. 2001, vol. 16, pp. 1138-1144.

Li, Y., "Fabrication of Highly ordered ZnO nanowire arrays in anodic alumina membranes," J. Materials Research, Nov. 2000, vol. 15, p. 2305-2308.

Sellmyer, D.J., "Magnetism of Fe, Co and Ni nanowires in self-assembled arrays," J. of Physics: Condensed Matter, (2000) vol. 13, pp. R433-R460.

Blick, R.H., "Nanostructural silicon for studying fundamental aspects of nanomechanics," J. of Physics: Condensed Matter, (2002), pp. R905-R945.

Ciraci, S., "Quantum effects in electrical and thermal transport through nanowires," J. of Physics: Condensed Matter, (2001), pp. R537-R568.

Yu, Jae-Young, "Silicon Nanowires: Preparation, Device, Fabrication, and Transport Properteis," J. Phys. Chem. B 2000, vol. 104, pp. 11864-11870.

Yu, Zhonghua, "$(n, m)$ Structural Assignments and Chirality Dependence in Single-Wall Carbon Nanotube Raman Scattering," J. Phys. Chem. B 2001, vol. 105, pp. 6831-6837.

Wang, Y.W., "Fabrication of Ordered Ferromagnetic-Nonmagnetic Alloy Nanowire Arrays and their Magnetic Property Dependence on Annealing Temperature," J. Phys. Chem. B 2002, vol. 106, pp. 2502-2507.

Murphy, Robert, "High-Yield, Nondestructive Purification and Quantification Method for Multiwalled Carbon Nanotubes," J. Phys. Chem. B 2002, vol. 106, pp. 3087-3091.

Li, C.P., "Silicon Nanowires Wrapped with Au Film," J. Phys. Chem. B 2002, vol. 106, pp. 6980-6984.

Steuerman, David W., "Interactions between Conjugated Polymers and Single-Walled Carbon Nanotubes," J. Phys. Chem. B 2002, vol. 106, pp. 3124-3130.

Li, Jun, "Novel Three-Dimensional Electrodes: Electrochemical Properties of Carbon Nanotube Ensembles," J. Phys. Chem. B 2002, pp. A-G.

Cassell, Alan M., "Large Scale CVD Synthesis of Single-Walled Carbor Nanotubes," J. Phys. Chem. B 1999, vol. 103, pp. 6484-6492.

Dai, Hongju, "Controlled Chemical Routes to Nanotube Architectures, Physics, and Devices," J. Phys. Chem. B 1999, vol. 103, pp. 11246-11255.

Chiang, I.W., "Purification and Characterization of Single-Wall Carbon Nanotubes (SWNTs) Obtained from the Gas-Phase Decomposition of CO (HiPco Process)," J. Phys. Chem. B 2001, vol. 105, pp. 8297-8301.

Tulchinsky, D.A., "Fabrication and domain imaging of iron magnetic nanowire arrays," J. Vac. Sci. Technol., May/Jun. 1998, A 16(3), pp. 1817-1819.

Yun, Wan Soo, "Fabrication of metal nanowire using carbon nanotube as a mask," J. Vac. Sci. Technol., Jul./Aug. 2000, A 18(4), pp. 1329-1332.

Batra, Inder P., "Quantum transport through one-dimensional aluminum wires," J. Vac. Sci. Technol., May/Jun. 2002, B 20(3), pp. 812-817.

Legrand, B., "Silicon nanowires with sub 10 nm lateral dimensions: From atomic force microscope lithography based fabrication to electrical measurements," J. Vac. Sci. Technol., May/Jun. 2002, B 20(3), pp. 862-870.

Tsutsumi, Toshiyuki, "Fabrication technology of ultrafine $SiO_2$ masks and Si nanowires using oxidation of vertical sidewalls of a poly-Si layer," J. Vac. Sci. Technol., Jan./Feb. 1999, B 17(1), pp. 77-81.

Namatsu, Hideo, "Fabrication of one-dimensional nanowire structures utilizing crystallographic orientation in silicon and their conductance characteristics," J. Vac. Sci. Technol., Sep./Oct. 1997, B 15(5), pp. 1688-1696.

Namatsu, Hideo, "Fabrication of thickness-controlled silicon nanowires and their characteristics," J. Vac. Sci. Technol., Nov./Dec. 1995, B 13(6), pp. 2166-2169.

Cassell, Alan M., "Combinatorial Optimization of Heterogeneous Catalysts Used in the Growth of Carbon Nanotubes," Langmuir 2001, vol. 17, pp. 260-264.

Lewenstein, Justin C. High-Yield Selective Placement of Carbon Nanotubes on Pre-Patterned Electrodes, Nano Letters., 2002, vol. 2, No. 5, pp. 443-446.

Martino, Anthony, "Catalyst Testing of Highly Dispersed Metal Nanoparticles for Coal Liquefaction and Coal/Waste Copressing," Catalysis and Chemical Technologies Department, Sandia National Laboratories, pp. 1-7.

Peng, X.S., "Electrochemical fabrication of ordered $Ag_2S$ nanowire arrays," Materials Research Bulletin, 2002, No. 37, pp. 1369-1375.

Robinson, L.A. W., "Self-aligned electrodes for suspended carbon nanotube structures," Microelectronics Research Centre, Cavendish Laboratory, University of Cambridge and Hitachi Cambridge Laboratory, pp. 1-2.

Moore, Gordon E., "Cramming more components into integrated circuits," Electronics, Apr. 19, 1965, vol. 38, No. 8(4), 4 pgs.

Fan, Hongyou, "Multiphased assembly of nanoporous silica particles," Journal of Non-Crystalline Solids (2001) vol. 285, pp. 71-78.

Franklin, Nathan R., "Integration of suspended carbon nanotube arrays into electronic devices and electromechanical systems," Applied Physics Letters, Jul. 29, 2002, vol. 81, No. 5, 913-915.

Kong, Jing, "Synthesis of individual single-walled carbon nanotubes on patterned silicon wafers," Nature, Oct. 29, 1998, vol. 395, pp. 878-881.

Duan, Xiangfeng, "Nonvolatile Memory and Programmable Logic from Molecule-Gated Nanowires," Nano Letters, 2002, pp. A-D.

Fuhrer, M.S., "High-Mobility Nanotube Transistor Memory," Nano Letters, 2002, vol. 2, No. 7, pp. 755-759.

Radosavljević, M., "Nonvolatile Molecular Memory Elements Based on Ambipolar Nanotube Field Effect Transistors," Nano Letters, 2002, vol. 2, pp. 761-764.

Derycke, V., "Catalyst-Free Growth of Ordered Single-Walled Carbon Nanotube Networks," Nano Letters, 2002, pp. A-D.

Joselevich, Ernesto, "Vectorial Growth of Metallic and Semiconducting Single-Wall Carbon Nanotubes," Nano Letters, xxxx, vol. 0, pp. A-E.

Javey, Ali, "Carbon Nanotube Transistor Arrays for Multistage Complementary Logic and Ring Oscillators," Nano Letters, 2002, pp. A-D.

Robertson, John, "Section 11. Non-Crystalline Carbon, Properties and Prospects for Non-Crystalline Carbons," Journal of Non-Crystalline Solids 299-302, 2002, pp. 798-804.

Ci, Lijie, "Double Wall Carbon Nanotubes Promoted by Sulfur in a Floating Iron Catalyst CVD System," Chemical Physics Letters 359, Jun. 13, 2002, pp. 63-67.

Gromov, A., "Purification of Carbon Nanotubes," Caramel Workshop, Jan. 23, 2002, pp. 1-13.

Cui, Yi, "Functional Nanoscale Electronic Devices Assembled Using Silicon Nanowire Building Blocks," Science, Feb. 2, 2001, vol. 291, pp. 851-853.

Wang, Suhua, Thermal Oxidation of $Cu_2S$ Nanowires: a Template Method for the Fabrication of Mesoscopic $Cu_xO$ ($x=1,2$) Wires, Phys. Chem. Chem. Phys., 2002, vol. 4, pp. 3425-3429.

Untiedt, C., "Fabrication and Characterization of Metallic Nanowires," Physical Review B, Jul. 15, 1997, vol. 56, No. 4, pp. 2154-2160.

Marsen, Bjorn, "Fullerence-Structured Nanowires of Silicon," Physical Review B, Oct. 15, 1999, vol. 60, No. 16, pp. 11593-11600.

Berber, Savas, "Unusually High Thermal Conductivity of Carbon Nanotubes," Physical Review Letters, May 15, 2000, vol. 84, No. 20, pp. 4613-4616.

Yao, Zhen, "High-Field Electrical Transport in a Single-Wall Carbon Nanotubes," Physical Review Letters, Mar. 27, 2000, vol. 84, No. 13, pp. 2641-2944.

Zhang, Y.F., "Liquid Phase Synethesis of Carbon Nanotubes," Physica B 323, 2002, pp. 293-295.

Dresselhaus, M.S., "Raman Spectroscopy on One Isolated Carbon Nanotube," Physica B 323, 2002, pp. 15-20.

Heinze, S., "Carbon Nanotubes as Schottky Barrier Transistors," Physical Review Letters, Sep. 2, 2002, vol. 89, No. 10, 106801-1-106801-4.

Fu, Qiang, "Electrodeposition of Carbon Films from Various Organic Liquids," Surface & Coatings Technology 124, 2000, pp. 196-200

Hernadi, K., "Reactivity of Different Kinds of Carbon During Oxidative Purification of Catalytically Prepared Carbon Nanotubes,", Solid State Ionics 141-142, 2001, pp. 203-209.

Colomer, J. F., "Different Purification Methods of Carbon Nanotubes Produced by Catalytic Synthesis," Synthetic Metals 103, 1999, pp. 2482-2483.

Dalton, A.B., "A Fuctional Conjugated Polymer to Process, Purify and Selectively Interact with Single Wall Carbon Nanotubes," Synthetic Metals 121, 2001, pp. 1217-1218.

Tat, Kerk Wai, "Preparation and Characterization of Cobalt/Silica Core-Shell Magnetic Nanoparticles," Dept. Chem., National University of Singapore 2000/2001, pp. 1-5.

Shipley, Microposit® XP-90104A E-Beam Resist, Preliminary Product Information, pp. 1-2.

Smalley, R. E., Foreword (Publication unknown), Jan. 2001.

Dresselhaus, Mildred S., Preface (Publication unknown) Jan. 2001.

Advanced Semiconductor Engineering, Inc., Substrate Design 420L BGA 35*35, Dwg. No. K-l-0420, 2 pages.

Integrated Device Technology, Inc., DA Package Design, Sep. 25, 1997, 2 pages.

Integrated Device Technology, Inc. BG Package Outline, Feb. 18, 1994.

Pimenta, M.A., "Diameter dependence of the Raman D-band in isolated single-wall carbon nanotubes," Physical Review B, vol. 64 pp. 04140-04140-4.

Introduction and Historical Perspective, Chapter 1, pp. 1-48.

Modern CMOS Technology, Chapter 2, pp. 49-92.

Crystal Growth, Wafer Fabrication and Basic Properties of Silicon Wafers, Chapter 3, pp. 93-149.

Kong, J., et al., "Chemical Vapor Disposition of Methane for Single-Walled Carbon Nanotubes." Chemical Physics Letters, 292, 567, 1998.

Li., Y., et al., "Growth of Single-Walled Carbon Nanotubes from Discrete Catalytic Nanoparticles of Various Sizes." *The Journal of Physical Chemistry B* (2001); 105, 11424.

Dai, Hongjie. "Controlled Chemical Routes to Nanotue Architectures, Physics, and Devices." *The Journal of Physical Chemistry B* (1999); 103: 11246-11255.

Colomer, J.-F., at al., "Characterization of Single-Walled Carbon Nanotubes Produced by CCVD Method." *Chemical Physics Letters* (2001); 345, 11-17.

Li, Y. et al., "Preparation of Monodispersed Fe-Mo Nanoparticles as the Catalyst for CVD Synthesis of Carbon Nanotubes." Chem. Mater., 12. 1008, 2001.

Cassell, A., et al., "Large Scale Synthesis of Single-Walled Carbon Nanotubes." *The Journal of Physical Chemistry B* (1999); vol. 103, No. 22: 6484-6492.

Cassell, A., et al., "Directed Growth of Free-Standing Single-Walled Carbon Nanotubes." *Journal of the American Chemical Society* (1999); vol. 121, 7975-7976.

Delzeit, L., et al., "Multilayered Metal Catalysis for Controlling the Density of Single-walled Carbon Nanotube Growth." Chemical Physics Letters, 348, 368, 2001.

Wei, Y., et al., "Effect of Catalyst Film Thickness on Carbon Nanotube Growth by Selective Area Chemical Vapor Deposition." *Applied Physics Letters* (2001); vol. 78, No. 10: 1394-1396.

Su., M., et al., "A Scalable Method for the Synthesis of Single-Walled Carbon Nanotubes with High Catalyst Productivity." *Chemical Physics Letters* (2000); vol. 322, 231-326.

Harutyunyan, A., et al., "CVD Synthesis of Single Wall Carbon Nanotubes under 'Soft' Conditions." *Nano Letters* vol. 2c No. 5 525 (2002); Published on web Mar. 27, 2002.

Li, Q., et al., "High-Density Growth of Single-Wall Carbon Nanotubes on Silicon by Fabrication of Nanosized Catalyst Thin Films." *Chem. Mater.* (2002), 14, 4262; Published on web Sep. 11, 2002.

Homma, Y., et al., "Growth of Suspended Carbon Nanotube Networks on 100nm-Scale Silicon Pillars." *Applied Physics Letters.* (2002); vol. 81 No. 12, 2261-2263.

Javey, A., et al., "Carbon Nanotube Transistor Arrays for Multistage Complementary Logic and Ring Oscillators." *Nano Letters* (2002); vol. 2 No. 9 929-932. Published on web Jul. 31, 2002.

Kong, J., et al., "Syntheses of Individual Single-Walled carbon Nanotubes on Patterned Wafers." *Nature* (1998); 395: 878-881.

Chen, B., et al., "Heterogeneous Single-Walled Carbon Nanotube Catalyst Discovery and Optimization." *Chem. Mater.* (2002); vol. 14 1891-1896.

Yenilmez, E., et al., "Wafer Scale Production of carbon Nanotube Scanning Probe Tips for Atomic Force Microscopy." *Applied Physics Letters.* (2002); vol. 80 No. 12, 2225-2227.

Peigney, A., et al., "A Study of the Formation of Single-and-Double-Walled carbon Nanotubes by a CVD Method." *The Journal of Physical Chemistry B* (2001); 105: 9699-9710.

Franklin, N., et al., "Integration of Suspended carbon Nanotube Arrays into Electronic Devices and Electroechanical Systems." *Applied Physics Letters* (2002); vol. 81 No. 5, 913-905.

Collins, P., et al., "Engineering Carbon Nanotubes and Nanotube Circuits Using Electrical Breakdown." Science (2001); 292: 706-709.

Kim, W., et al., "Synthesis of Ultralong and High Percentage of Semiconduction Single-walled Carbon Nanotubes." *Nano Letters* (2002); vol. 2 No. 7 703-708. Published on web Jun. 1, 2002.

Reuckes, T., et al., "Carbon Nanotube-Based Nonvolatile Random Access Memory for Molecular Computing." *Science*, vol. 289, 94-97, Jul. 7, 2000.

Liu, et al., "Organizing Single-Walled Carbon Nanotubes on Gold Using a Wet Chemical Self-Assembling Technique, Langmuir," Apr. 18, 2000, vol. 16, No. 8, 3659-3573.

Soh, et al., "Integrated Nanotube Circuits: controlled growth and ohmic contacting of single-walled carbon nanotubes", Applied Physics Letters, Aug. 2, 1999, vol. 75, No. 5, 627-629.

Zheng et al, "Chemical Vapor Deposition Growth of Well-Aligned Carbon Nanotube Patterns on Cubic Mesoporous Silica Films by Soft Lithography", Chemistry of Materials, Jun. 9, 2001, vol. 13, 2240-2242.

Huang, et al., "Patterned Growth of Well-Aligned Carbon Nanotubes: A Soft-Lithographic Approach", The Journal of Physical Chemistry B., Mar. 16, 2000, vol. 104, No. 10, 2193-2196.

Chattopadhyay, et al., "Metal-Assisted Organization of Shortened Carbon Nanotubes in Monolayer and Mulilayer Forest Assemblies", Journal of the American Chemical Society, Aug. 28, 2001, vol. 123, 9451-9452.

Berhan, L. et al., "Mechanical properties of nanotube sheets: Alterations in joint morphology and achievable moduli in manufacturable materials", Journal of Applied Physics, vol. 95, No. 8, pp. 4335-4345, Apr. 15, 2004.

Desai et al., "Freestanding Carbon Nanotube Specific Fabrication," Proc. of 2005 5th IEEE Conf., Nanotech., Nagoya, Japan, pp. 1-4, Jul. 2005.

Kong, J. et al., "Nanotube Molecular Wires as Chemical Sensors", Science, vol. 287, pp. 622-625, Jan. 28, 2000.

Li, J. et al., "Carbon Nanotube Nanoelectrode Array for Ultrasensitive DNA Detection", Nano Letters, vol. 3, No. 5, pp. 597-602, 2003.

Onoa, G.B. et al., "Bulk production of singly dispersed carbon nanotubes with prescribed lengths," Nanotechnology, vol. 16, pp. 2799-2803, 2005.

Parikh, K. et al., "Flexible vapour sensors using single walled carbon nanotubes", Sensors and Actuators B, vol. 113, pp. 55-63, 2006.

Qi, P. et al., "Toward Large Arrays of Multiplex Functionalized Carbon Nanotube Sensors for Highly Sensitive and Selective Molecular Detection", Nano Letters, vol. 3, No. 3, pp. 347-351, 2003.

Sotiropoulou, S. et al., "Carbon nanotube array-based biosensor", Anal Bioanal Chem, vol. 375, pp. 103-105, 2003.

Valentini, L. et al., "Sensors for sub-ppm NO2 gas detection based on carbon nanotube thin films", Applied Physics Letters, vol. 82, No. 6, pp. 961-963, Feb. 10, 2003.

European Patent Office, Supplementary European Search Report for EP 03 81 5470, 4 pages, mailed Dec. 19, 2007.

Homma, Y. et al, "Growth of Suspended Carbon Nanotubes Networks on 100-nm-scale Silicon Pillars," Appl. Phys. Lett., Sep. 16, 2002, vol. 81, No. 12, pp. 2261-2263.

Kong, Jing, "Chemical vapor deposition of methane for single-walled carbon nanotubes," Chemical Physics Letters, vol. 292, Nos. 4-6, pp. 567-574, Aug. 14, 1998.

Li, Y., et al., "Growth of Single-Walled Carbon Nanotubes from Discrete Catalytic Nanoparticles of Various Sizes", The Journal of Physical Chemistry B, vol. 105, p. 11424-11431, 2001.

McEuen, Paul L, et al., "Single-Walled Carbon Nanotube Electronics", IEEE Transactions of Nanotechnology, IEEE Service Center, vol. 1, No. 1. pp. 78-85, Mar. 2002.

Jeong, Tak, et al., "A new purification method of single-wall carbon nanotubes using H2S and O2 mixture gas" Chemical Physics Letters (2001) 344: 18-22.

Kahn, Michael G. C., et al., "Solubilization of Oxidized Single-Walled Carbon Nanotubes in Organic and Aqueous Solvents through Organic Derivation" (2002) 2(11) 1215-1218.

International Search Report & Written Opinion, Nantero, Inc. International Patent Application No. PCT/US05/18467, Oct. 1, 2007, 5 pages.

International Search Report & Written Opinion, Natero, Inc., International Patent Application No. PCT/US05/18539, Sep. 18, 2006, 4 pages.

International Seasrch Report, Nantero, Inc., International Patent Application No. PCT/US05/45316, Sep. 6, 2006, 2 pages.

Ausman, Kevin, D. et al., "Organic Solvent Dispersions of Single-Walled Carbon Nanotubes: Toward Solutions of Pristine Nanotubes," The Journal of Physical Chemistry, vol. 104, No. 38, Sep. 28, 2000, pp. 8911-8915.

* cited by examiner

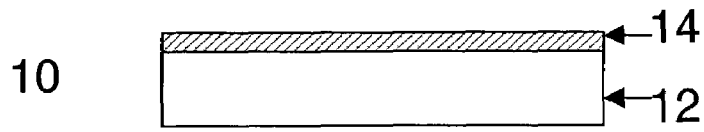
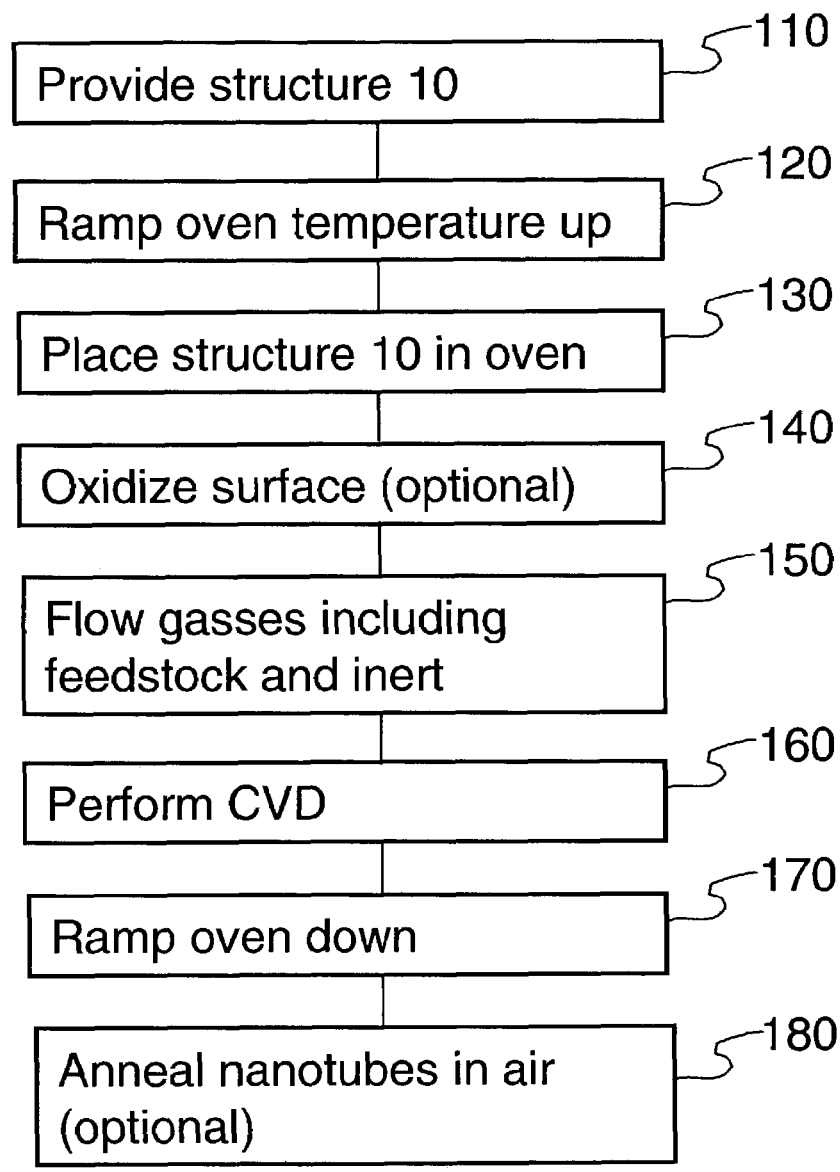

Figure 1B.2
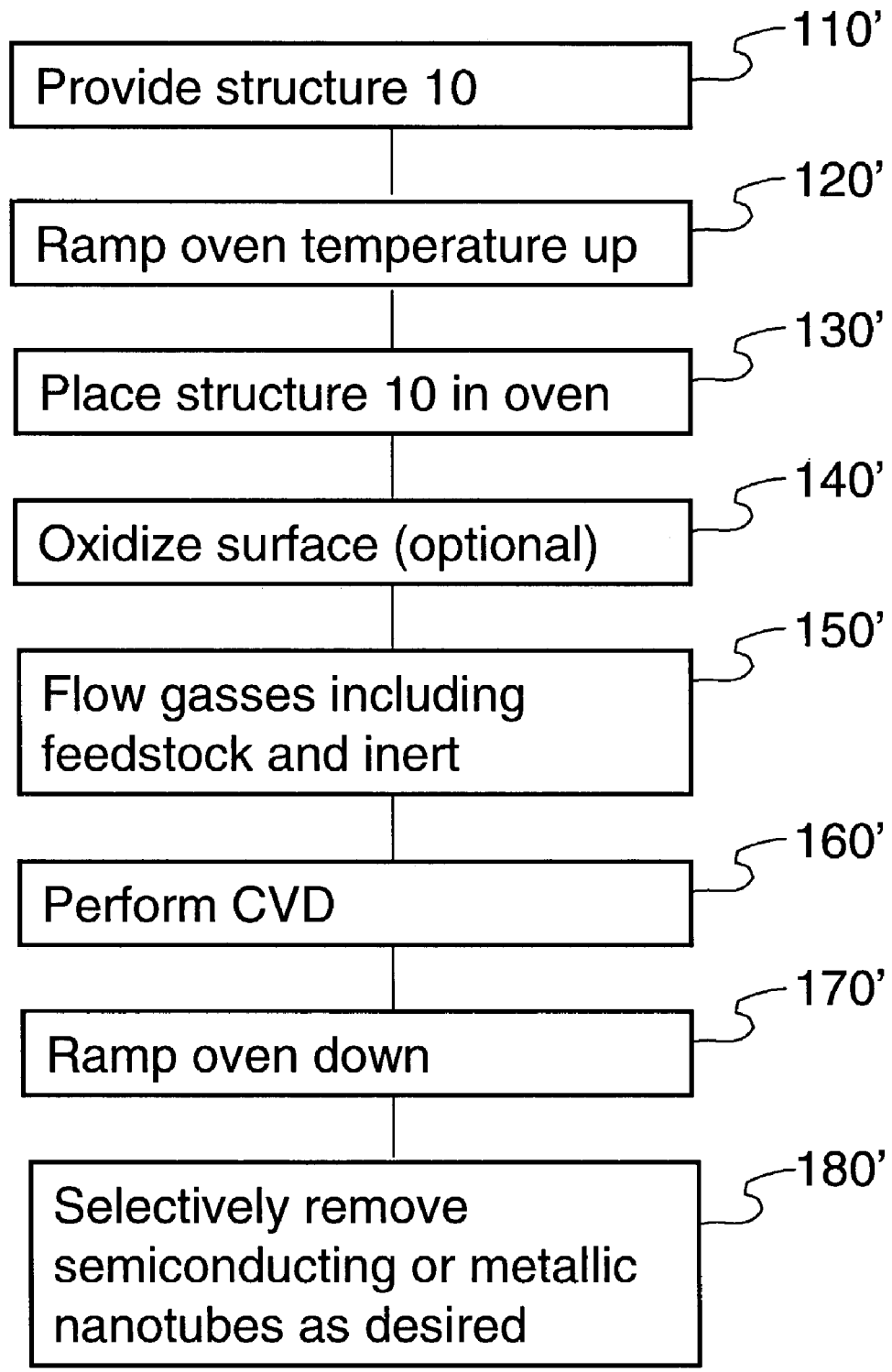

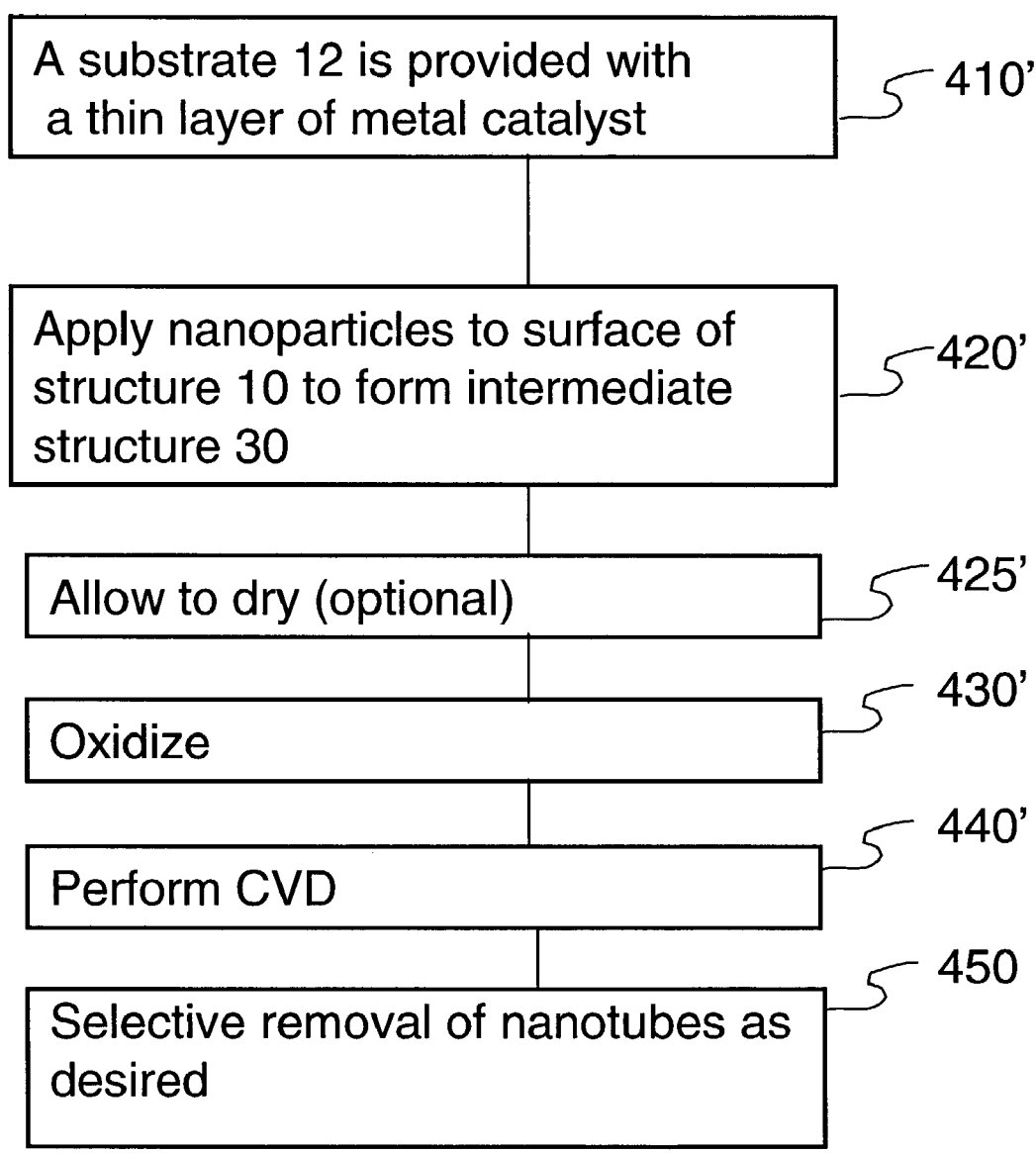

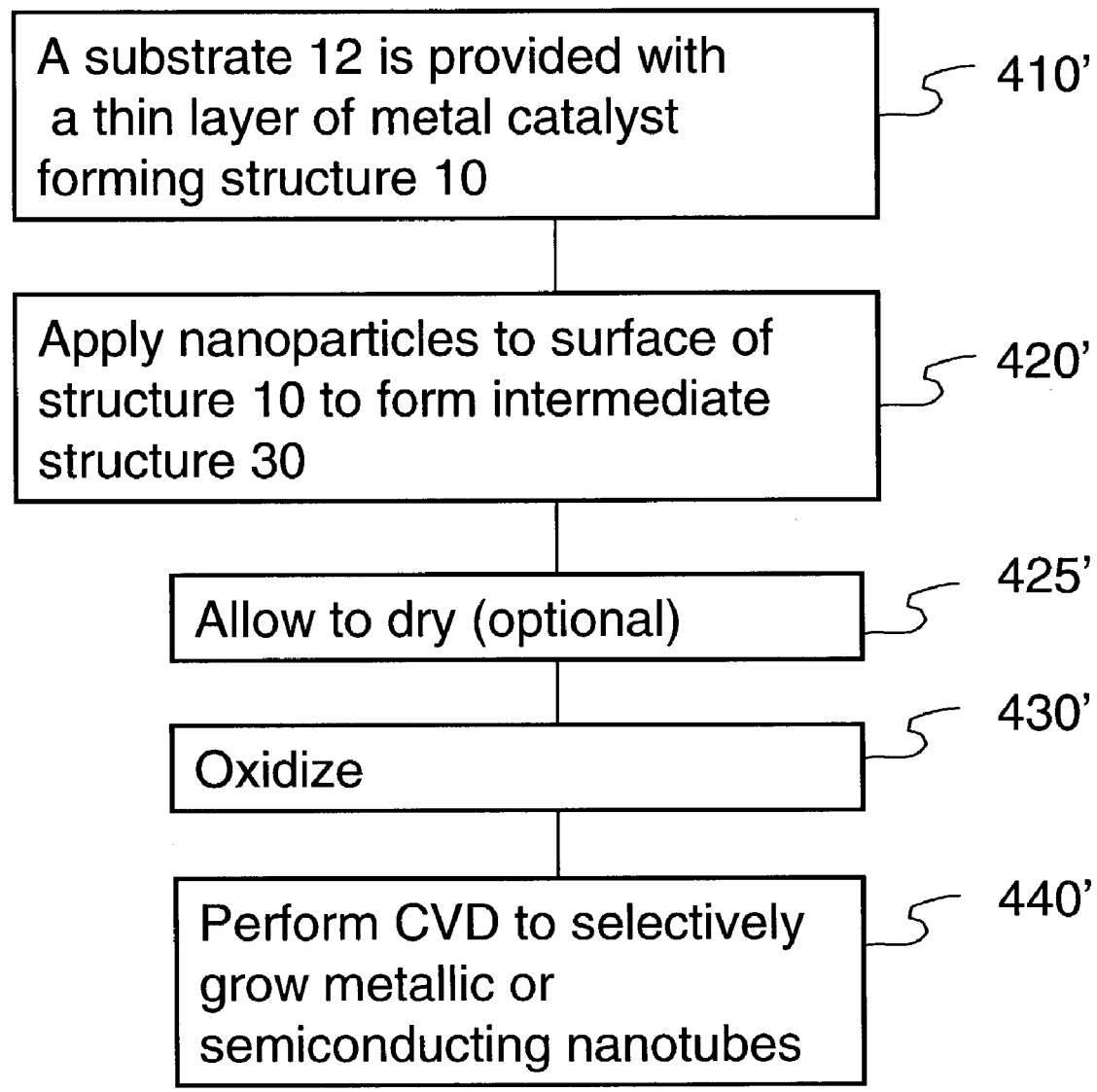

METHODS OF MAKING CARBON NANOTUBE FILMS, LAYERS, FABRICS, RIBBONS, ELEMENTS AND ARTICLES

CROSS-REFERENCE TO RELATED APPLICATIONS

This application is a continuation-in-part of and claims priority under 35 U.S.C. §120 to the following related applications, all of which are assigned to the assignee of this application, and all of which are incorporated by reference in their entirety:

Electromechanical Memory Array Using Nanotube Ribbons and Method for Making Same (U.S. patent application Ser. No. 09/915,093, now U.S. Pat. No. 6,919,592) filed Jul. 25, 2001;

Nanotube Films and Articles (U.S. patent application Ser. No. 10/128,118, now U.S. Pat. No. 6,706,402) filed Apr. 23, 2002;

This application is related to the following applications, all of which are assigned to the assignee of this application:

Methods of Using Thin Metal Layers to Make Carbon Nanotube Films, Layers, Fabrics, Ribbons, Elements and Articles (U.S. patent application Ser. No. 10/341,055), filed Jan. 13, 2003; and Methods of Using Pre-formed Nanotubes to Make Carbon Nanotube Films, Layers, Fabrics, Ribbons, Elements and Articles (U.S. patent application Ser. No. 10/341,054), filed Jan. 13, 2003; and Carbon Nanotube Films, Layers, Fabrics, Ribbons, Elements and Articles (U.S. patent application Ser. No. 10/341,130), filed Jan. 13, 2003.

BACKGROUND

1. Technical Field

The present invention relates generally to nanotube films, layers, and fabrics and methods of making same and, more specifically to carbon nanotube films, layers, and fabrics and methods of making same so that they form or may be made to form patterned ribbons, elements and articles of various shapes and characteristics.

2. Discussion of Related Art

Wire crossbar memory (MWCM) has been proposed. (ee U.S. Pat. Nos. 6,128,214; 6,159,620; and 6,198,655.) These memory proposals envision molecules as bi-stable switches. Two wires (either a metal or semiconducting type) have a layer of molecules or molecule compounds sandwiched in between. Chemical assembly and electrochemical oxidation or reduction are used to generate an "on" or "off" state. This form of memory requires highly specialized wire junctions and may not retain non-volatility owing to the inherent instability found in redox processes.

More recently, memory devices have been proposed which use nanoscopic wires, such as single-walled carbon nanotubes, to form crossbar junctions to serve as memory cells. (ee WO 01/03208, Nanoscopic Wire-Based Devices, Arrays, and Methods of Their Manufacture; and Thomas Rueckes et al., "Carbon Nanotube-Based Nonvolatile Random Access Memory for Molecular Computing," Science, vol. 289, pp. 94-97, 7 Jul., 2000.) Hereinafter these devices are called nanotube wire crossbar memories (NTWCMs). Under these proposals, individual single-walled nanotube wires suspended over other wires define memory cells. Electrical signals are written to one or both wires to cause them to physically attract or repel relative to one another. Each physical state (i.e., attracted or repelled wires) corresponds to an electrical state. Repelled wires are an open circuit junction. Attracted wires are a closed state forming a rectified junction. When electrical power is removed from the junction, the wires retain their physical (and thus electrical) state thereby forming a non-volatile memory cell.

The NTWCM proposals rely on directed growth or chemical self-assembly techniques to grow the individual nanotubes needed for the memory cells. These techniques are now believed to be difficult to employ at commercial scales using modern technology. Moreover, they may contain inherent limitations such as the length of the nanotubes that may be grown reliably using these techniques, and it may difficult to control the statistical variance of geometries of nanotube wires so grown. Improved memory cell designs are thus desired.

The reliable fabrication of electrically conductive, ultra-thin metallic layers and electrodes in the sub-10 nm regime is problematic. (See, e.g., S. Wolf, Silicon Processing for the VLSI era; Volume 2—Process Integration, Lattice Press, Sunset Beach, 1990.) Metal films in this size regime are usually non-continuous and not conductive over macroscopic distances. Furthermore, these sub-10 nm films are prone to thermal damage by electrical current, making them unsuitable for applications such as electrical interconnects in semiconductor devices. Thermal damage of thin metal interconnects caused by their low heat conductivities is one of the main factors inhibiting dramatic miniaturization and performance improvements of highly integrated semiconductor devices.

Conventional interconnect technologies have a tendency to suffer from thermal damage and metal diffusion eroding the performance of the semiconductor devices especially from degradation of the electrical properties. These effects become even more pronounced with size reduction in current generation 0.18 um and 0.13 um structures, e.g. by metal diffusion through ultra-thin gate oxide layers.

There is therefore a need in the art for conductive elements that may operate well in contexts having high current densities or in extreme thermal conditions. This includes circuit contexts with very small feature sizes but includes other high current density, extreme thermal environment contexts as well. There is also a need for conductive elements that will be less likely to diffuse undesirable amounts of contaminants into other circuit elements.

SUMMARY

The invention provides new and improved methods of making carbon nanotube films, layers, fabrics, ribbons, elements and articles.

According to one aspect of the invention, carbon nanotube growth catalyst is applied on to a surface of a substrate. The substrate is subjected to a chemical vapor deposition of a carbon-containing gas to grow a non-woven fabric of carbon nanotubes. Portions of the non-woven fabric are selectively removed according to a defined pattern to create the article.

According to another aspect of the invention, a non-woven fabric of carbon nanotubes may be made by applying carbon nanotube growth catalyst on to a surface of a wafer substrate to create a dispersed monolayer of catalyst. The substrate is subjected to a chemical vapor deposition of a carbon-containing gas to grow a non-woven fabric of carbon nanotubes of nanotubes in contact and covering the surface of the wafer and in which the fabric is of substantial uniform thickness.

According to another aspect of the invention, applying the carbon nanotube growth catalyst includes applying metallic nanoparticles.

According to another aspect of the invention, applying the carbon nanotube growth catalyst includes applying metal oxide nanoparticles.

According to another aspect of the invention, the surface of the substrate is derivitized to promote adhesion of the carbon nanotube growth catalyst.

According to another aspect of the invention, applying the carbon nanotube growth catalyst includes applying a ferritin solution in which the ferritin encapsulates metal, and wherein the act of applying followed by oxidizing the ferritin to remove the organic shell therefrom.

According to another aspect of the invention, applying carbon nanotube growth catalyst creates a substantial monolayer of nanoparticles on the surface of the substrate.

According to another aspect of the invention, applying the carbon nanotube growth catalyst includes applying a metal ligand-catalyst precursor, and wherein the surface is functionalized to promote binding of the ligand.

According to another aspect of the invention, the metal ligand-catalyst precursor has a formula ML, in which M is metal from a group including at least iron, cobalt, or nickel, and in which L is an organic ligand having a general formula $C_xH_y(COOH)$.

According to another aspect of the invention, applying the carbon nanotube growth catalyst includes applying a solution of iron oxide nanoparticles on the surface of the substrate.

According to another aspect of the invention, applying the carbon nanotube growth catalyst includes applying a suspension of liquid precursor to a metal catalyst on the surface of the substrate.

According to another aspect of the invention the carbon-containing gas is methane or ethylene.

According to another aspect of the invention, the chemical vapor deposition is at about 850° C. for about ten minutes and methane is applied at about a 500 sccm flow or the chemical vapor deposition is at about 800° C. for about forty minutes and ethylene is applied at about a 10 sccm flow.

According to another aspect of the invention, the carbon nanotubes of the non-woven fabric include metallic nanotubes and semiconducting nanotubes and the relative composition of metallic and semiconducting nanotubes in the fabric is controlled.

According to another aspect of the invention, the carbon nanotubes of the non-woven fabric include metallic nanotubes and semiconducting nanotubes, and semiconducting or metallic nanotubes may be selectively removed therefrom.

BRIEF DESCRIPTION OF THE DRAWINGS

In the Drawing,

FIGS. 4B-D illustrate exemplary methods of growing nanotube fabric by CVD using the structure of FIG. 4A.

DETAILED DESCRIPTION

Figure 1C:
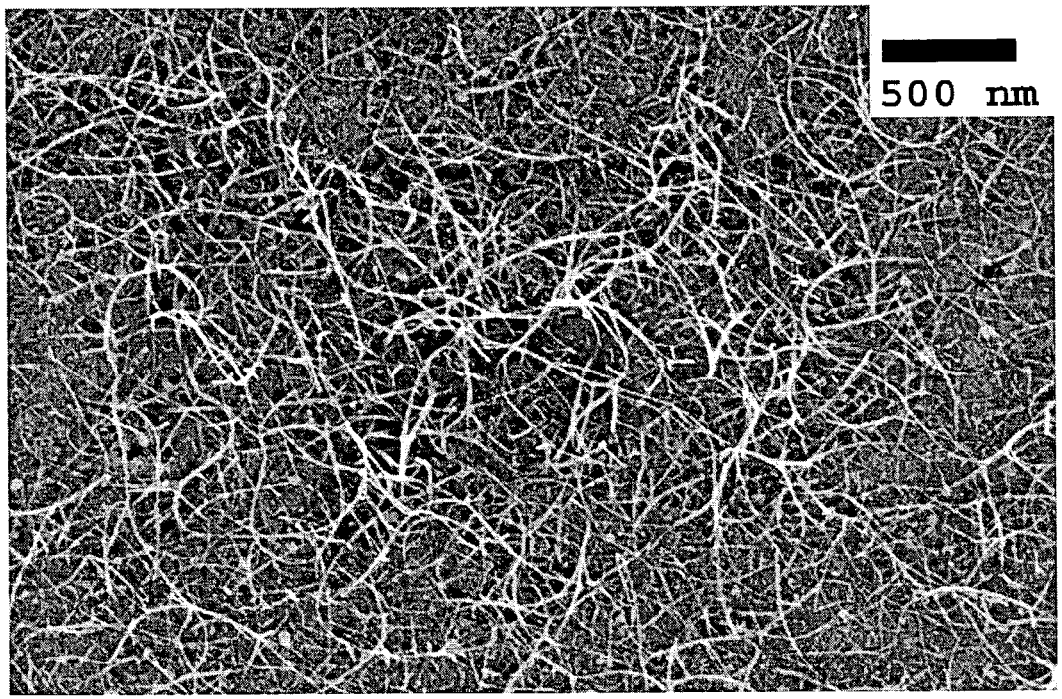
FIGS. 1C-1Z are micrographs of nanofabrics grown with exemplary processes according to certain embodiments of the invention.

Preferred embodiments of the invention provide nanotube films, layers, or non-woven fabrics and methods of making same so that they form, or may be made to form, various useful patterned components, elements or articles. (Hereinafter "films," "layers," or "non-woven fabrics" are referred to as "fabrics" or "nanofabrics".) The components created from the nanofabrics retain desirable physical properties of the nanotubes and/or the nanofabrics from which they are formed. In addition, preferred embodiments allow modern manufacturing techniques (e.g., those used in semiconductor manufacture) to be readily employed to utilize the nanofabric articles and devices.

For example, the nanofabrics may be patterned into ribbons, which can be used to create non-volatile electromechanical memory cells. As explained in U.S. patent application Ser. Nos. 09/915,093 and 10/033,323 (incorporated by reference in their entireties), the ribbons may be used as a component of a non-volatile electromechanical memory cell. The deflected, physical state of the ribbon may be made to represent a corresponding information state. The deflected, physical state has non-volatile properties, meaning the ribbon retains its physical (and therefore informational) state even if power to the memory cell is removed. The nanofabric may also be formed into conductive traces or pads. As explained in U.S. patent application Ser. Nos. 10/128,118 and 10/175,586 (incorporated by reference in their entireties), the trace has advantageous electrical and thermal conductivity, allowing it to be used for extremely small feature sizes, or to be utilized as a transistor component, such as a gate or base of a transistor forming superior metal to semiconductor contacts. The nanofabrics may also be formed or patterned into shorter segments such as ribbons or patches. The shorter segments or patches allow facile interconnection of their nanotubes to vias, interconnects, traces or other structures useful in electronic devices. They may also be used to create new forms of electromechanical memory cells, for example, non-crossbar, embedded cells. The articles so formed help enable the generation of nanoelectronic devices and may also be used to assist in increasing the efficiency and performance of current electronic devices using a hybrid approach (e.g., using nanoribbon memory cells in conjunction with semiconductor addressing and processing circuitry).

Preferred nanofabrics have a plurality of nanotubes in contact so as to form a non-woven fabric. Gaps in the fabric, i.e., between nanotubes either laterally or vertically, may exist. The fabric preferably has a sufficient amount of nanotubes in contact so that at least one electrically conductive, semi-conductive or mixed conductive and semi-conductive pathway exists from a given point within a ribbon or article to another point within the ribbon or article (even after patterning of the nanofabric).

Though certain embodiments prefer single-walled nanotubes in the nanofabrics, multi-walled nanotubes may also be used. In addition, certain embodiments prefer nanofabrics that are primarily a monolayer with sporadic bilayers and trilayers, but other embodiments benefit from thicker fabrics with multiple layers.

To create a nanofabric, the technique chosen must result in a sufficient quantity of nanotubes in contact with other nanotubes which thereby matte as a result of the nanotubes' adhesion characteristics. Certain embodiments (e.g., memory cells) benefit when the nanofabric is very thin (e.g., less than 2 nm); for example, when the nanofabric is primarily a monolayer of nanotubes with sporadic overlapping (sometimes fabric will have portions that are bilayers or trilayers), or a multilayer fabric with relatively small diameter nanotubes. Moreover, many of these embodiments benefit when the nanotubes are single-walled nanotubes (SWNTs). Other embodiments (e.g., conductive traces) may benefit from thicker fabrics or multi-walled nanotubes (MWNTs).

The nanotubes have a resistance per square between 1-1000 kΩ/□ (a lower resistance per square value is generally preferred) but can be tuned to have a resistance per square between 1 kΩ/□-10 MΩ/□ which is dependent upon the quality of nanotubes used and their electrical and mechanical characteristics. The porosity of the fabric can be tuned as well to generate low density fabrics with high porosity and high density fabrics with low porosity. The average length of a nanotube ranges between 50-1000 nm and 1-100 μm including single-walled nanotubes, multi-walled nanotubes or a mixture of both and can be controlled as is necessary for a particular application such as memory, switches, relays, chemical sensors, biosensors and resonators.

Certain preferred methods of constructing the nanofabrics involve growing nanotubes using chemical vapor deposition (CVD) processes in conjunction with various catalysts. Other preferred methods generate films using spin-coating techniques with preformed nanotubes. The fabrics may be patterned after being formed or they may be grown or formed in a predetermined pattern, e.g., by using patterned catalyst metal layers, nanoparticles or a combination thereof.

Growing Nanofabrics

Introduction

Carbon nanotubes can be grown on substrates whose surfaces contain certain metallic or oxide layers. The metallic or metal oxide layers allow metal-containing nanoparticles to be applied onto the substrate surface. Exemplary nanoparticles include metals, such as iron, cobalt, nickel, tungsten, molybdenum, rhenium and other transition metals, or metal oxides. The metals or metal oxides in these methods act as growth catalyst for carbon nanotubes.

The literature has documented research results regarding the growth of single-walled nanotubes (SWNTs) from prefabricated nanoparticles (see Kong, J., et al., Chemical Physics Letters, 292, 567, 1998; Li, Y., et al., Journal of Physical Chemistry B, 105, 11424, 2001; Dai, H., et al., Journal of Physical Chemistry B, 103, 11246, 1999; Colomer, J.-F., et al., Chemical Physics Letters, 345, 11, 2001; and Li, Y. and Liu, J., Chem. Mater., 13, 1008, 2001), catalyst solutions, e.g., "liquid catalysts" (see Cassell, A., et al., Journal of Physical Chemistry B, 103, 6484, 1999 and Cassell, A., et al., Journal Am. Chem. Soc., 121, 7975, 1999), and layered catalytic deposition (see Cassell, A., et al., Journal of Physical Chemistry B, 103, 6484, 1999). Metal oxides of various diameters may be used depending upon whether growth of single-walled nanotubes (SWNTs) or multi-walled nanotubes is desired. (See, e.g., Y. Li, W. Kim et al., Growth of Single-Walled Carbon Nanotubes From Discrete Catalytic Nanoparticles of Various Sizes, Journal of Physical Chem. B, 105, 11424, 22 Nov. 2001.) Bi-metallic catalyst nanoparticles (iron-molybdenum) have also been fabricated to assist in the production of carbon nanotubes (see Li, Y. and Liu, J., Chem. Mater., 13, 1008, 2001). These nanoparticles are usually dispersed randomly on a substrate or other support to produce nanotube growth. Typical liquid catalysts contain a mixture of chlorides or nitrates that have iron, cobalt, nickel, or molybdenum. These liquid catalysts are generated by soaking a pre-patterned 'stamp' onto a substrate. After stamping, the catalyst is calcinated or oxidized to burn off all the chlorides, nitrides, and other species leaving a random distribution of metal nanoparticles within a broad size regime. Yet another method of producing SWNTs involves the deposition of metal layers (see Delzeit, L., et al., Chemical Physics Letters, 348, 368, 2001). The metal layers may include a porous under-layer such as aluminum or iridium, a catalytic layer (iron, cobalt, nickel), and a co-catalyst layer, typically molybdenum. The catalyst nanoparticles required for nanotube formation are produced during the CVD process.

The inventors have discovered that the above techniques may be extended to create nanofabrics, which have important characteristics that may be controlled in the creation process. In addition, they have discovered new techniques to create nanofabrics. The fabrics can be assembled or grown (e.g., over an entire wafer surface) and then fabric may be selectively removed, e.g., by using lithographic patterning. In some embodiments, the fabric may be formed in a pattern; i.e., nanotube fabric will grow in places where desired and none need be removed subsequent to growth.

To grow nanofabrics, the metallic nanoparticles may be applied to the substrate surface in a variety of ways, including spin coating, application via aerosol, or by dipping the substrate into a solution that includes such nanoparticles. The metallic nanoparticles used as catalyst may also be applied to the substrate surface by deposition of a gas-phase metallic precursor such as any metallocene including ferrocene, molybdocene, cobaltocene and many other derivatives known in the literature to vaporize at relatively low temperatures, e.g. 25-600° C. (i.e., a low temperature relative to the temperatures at which carbon nanotube growth would occur using that metal as catalyst).

Once a catalyst has been applied to the surface, an appropriate feedstock gas is supplied to the substrate's environment using a CVD process and nanotubes are allowed to grow. Typical growth times range from under 1 minute to 60 minutes. A typical growth phase can be completed in less than ten minutes. Examples of appropriate feedstock gasses include, but are not limited to CO, $CH_4$, $C_2H_4$ and other carbon sources. The feedstock gas should be used at proper flow rates and at proper concentrations with inert gasses such as argon or nitrogen. Typical temperature regimes are about 600-1000° C.

Some factors influencing nanotube growth include catalyst composition, catalyst diameter, catalytic growth efficiency, temperature, CVD run time and choice of reagents including catalysts and feedstock gasses as well as reductants and inert carrier gasses, flow rates, ratios of gasses and mixtures and substrate type and composition.

The films generated by this method are typically characterized in bulk by resistance in ohms per square ($\Omega/\square$) measurements that range from 1 to 1000 k$\Omega/\square$ or in some circumstances from 1 to 20 M$\Omega/\square$. This measurement can be used to describe the quality and density of the tubes in bulk growth where lower resistance per square indicates a denser fabric and a relatively high concentration of metallic nanotubes.

Thin Catalyst Layers for Growth of Nanotubes

One preferred method of growing nanofabrics uses CVD techniques with substrates having a thin layer of metal catalyst on the substrate surface. The thin layers allow the catalyst to be easily removed in subsequent processing steps. Thicker catalyst layers may require more difficult processing steps.

FIG. 1A shows a cross-sectional view of an exemplary structure 10 having a substrate 12 and a thin metal catalyst layer 14 (shown here as one layer, though more than one layer may be employed). This figure is not to scale; the metal catalyst layer of typical embodiments is only about 1-2 nm thick.

An exemplary, non-limiting substrate 12 is made of silicon and has an upper layer of $SiO_2$ (not shown). The $SiO_2$ insulates the conductive nanotubes (once formed) from the underlying bulk silicon of substrate 12. Moreover, the upper layer of the substrate 12 may already have formed therein various elements that may be used together with the to-be-formed nanofabric articles to form circuits and the like, or the articles may be used as conductive connections between circuits formed on the substrate.

The metals that can be used as primary catalyst metals of layer 14 can be selected from a non-exclusive group known to produce SWNTs, such as iron, nickel, cobalt, and molybdenum. Metal layer 14 can also include metals that act in conjunction with primary catalysts as co-catalysts, such metals include, but are not limited to, aluminum, molybdenum, cobalt, or other co-catalyst metals. If multi-walled nanotubes (MWNTs) are desired, these and additional transition metals may be used in layer 14, such as yttrium, lanthanides and actinides.

The growth of nanotubes from deposited thin metal layers 14 typically involves the deposition by any physical vapor deposition technique of an aluminum layer, an iron layer, and/or a molybdenum layer, onto a substrate 12. (The aluminum layer generates a porous reactive support that aids in generation of carbon species which feed into the iron catalyst where growth of the nanotubes actually takes place. The molybdenum layer also serves as a site to reduce the carbon to a reactive form. The iron by itself can accomplish this reduction even but in some cases the rate is increased if the Mo and Al are present as well.) The thin metal layers 14 such as aluminum and molybdenum assist in the formation of SWNTs during CVD (when these three metals are used in concert, iron is the primary growth catalyst). These layers are extremely thin (e.g., 1-2 nm) and will diffuse or vaporize during CVD growth. Some of the particles created from such vaporization may be encapsulated by the eventually-grown nanotubes. (As the nanotubes are growing, the thin layers will diffuse. When layers are heated, they have a tendency to generate particles. Some of these particles will contain iron which will then be the site of the direct growth of carbon nanotubes. If in some instances the catalyst is very small, then the catalyst particle will be carried along as the nanotube grows. In other cases the catalyst particle will be larger and the nanotube will grow out from this end leaving the catalyst particle in place. Either way, if one looks at a transmission electron micrograph of a nanotube, one will almost always find at one end a nanoparticle, which acted as a catalyst.)

FIG. 1B.1 illustrates a way of forming nanofabrics utilizing a substrate with thin metal catalyst layer(s). First, an intermediate structure 10 is provided 110. The structure, as outlined above, includes a substrate 12 and a metal catalyst layer 14. A furnace is heated 120 to about 500° C. The structure 10 is placed 130 into the furnace. If desired, the metal layer 12 may be oxidized 140 in air. The oxidation can take place at 500° C. for 30 minutes. Oxidizing may be desired because it generates nanoparticles on the surface when metal atoms migrate and rearrange themselves. The temperature of the substrate 10 is ramped up to the CVD temperature and a flow of feedstock and inert gasses is provided 150. For example, hydrogen gas is mixed with an inert gas that has proper heat diffusion properties (typically argon or nitrogen). In some embodiments, the ratio of the gasses can be 1:5 hydrogen to inert gas (the ratio, however, should depend on the flow rate and types of gas introduced into the system upon reaching CVD temperature). For example, methane at a flow rate of 100-750 standard cubic centimeters per minute (sccm), or ethylene gas at 1.0-5.0 sccm may be used. The CVD run is performed 160 for some time typically between 1-10 minutes. (A CVD process or chemical vapor deposition involves in this case a carrier gas (argon), a reductant (hydrogen) and a carbon feedstock (methane, ethylene in combination or alone, or other gas)). The furnace is ramped down 170 to less than 200° C. in a flow of inert gas or gasses that have low or no reactivity with the carbon sources, such as argon or nitrogen. Depending on properties desired in the resulting nanotube fabric, the gas used could be air or oxygen at a lower temperature; such use would provide a final annealing 180 for nanotube adhesion and/or removal of amorphous carbon. As a result of the above, a nanofabric is created over substrate 12 and the thin metal layer 14 is substantially or totally vaporized.

The surface of the substrate 12 may have a defined pattern (e.g., a grating) on its surface. For example, the surface may have alternating regions of metal or semiconductor and insulator. The metal or semiconducting embedded materials may be partially or totally capped off by a sacrificial layer which can be removed later to provide a suspended nanotube nanoribbon structure. See U.S. patent application Ser. Nos. 09/915,093 and 10/033,323.

A defined thin metal layer pattern will determine the origination of nanotube growth. (That is, nanotube growth will originate from the catalyst regions rather than the interstitial regions which do not have catalyst. This characteristic may be exploited; i.e., depending on the ultimate use of the nanoribbons or nanofabric articles, a specific surface pattern may be desired (for example in a memory device). Moreover, the thin metal layer catalyst may be patterned to create a patterned growth of nanofabric. If the catalyst patterns are sufficiently far away from each other they may not require subsequent patterning.

Figure 2:
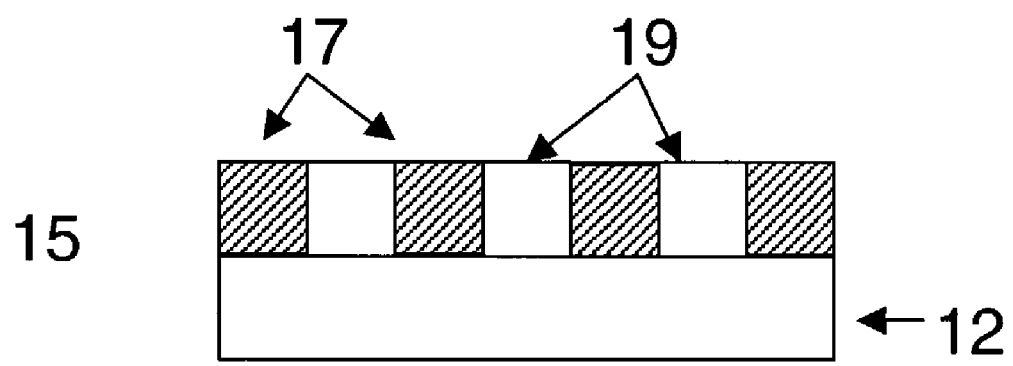
FIG. 2 is a cross-sectional view of an exemplary structure used to practice certain embodiments of the invention.

FIG. 2, for example, is a cross-sectional view of an exemplary structure 15 having a grating configuration. Surface metal regions 17 are separated from one another by insulating regions 19. The material of metal regions 17 may be selected from appropriate carbon nanotube growth catalysts, and the insulating regions 19 may be made from material that does not readily initiate carbon nanotube growth and genesis, such as silica. The separate metal catalyst layer regions 17 provide a region where nanotube growth originates.

The density of the nanotube ribbon may be controlled by altering such variables as catalyst composition and concentration, growth environment, including but not limited to growth time (e.g., less CVD run time yields less dense nanofabric), temperature, gas composition and concentration. Provided below are several exemplary ways of growing nanofabrics using the above principles.

EXAMPLE 1

Thin metal layers of aluminum, iron, and molybdenum (15 nm, 1 nm, and 2 nm, respectively) are sequentially deposited on a substrate. The substrate is placed in a tube furnace in which the temperature is ramped to 500° C. and held for thirty minutes, in an ambience of air. The temperature is then ramped to a CVD temperature of 850° C. in a flow of argon gas and hydrogen gas, at 100:400 sccm $Ar:H_2$ Upon reaching the CVD temperature, methane gas at a flow rate of 500 sccm is introduced into the furnace for a 1 minute growth time. Completing the CVD, the furnace is ramped down to below 200° C. in an argon atmosphere. FIG. 1C is a micrograph of a fabric made from this procedure.

EXAMPLE 2

Figure 1D:
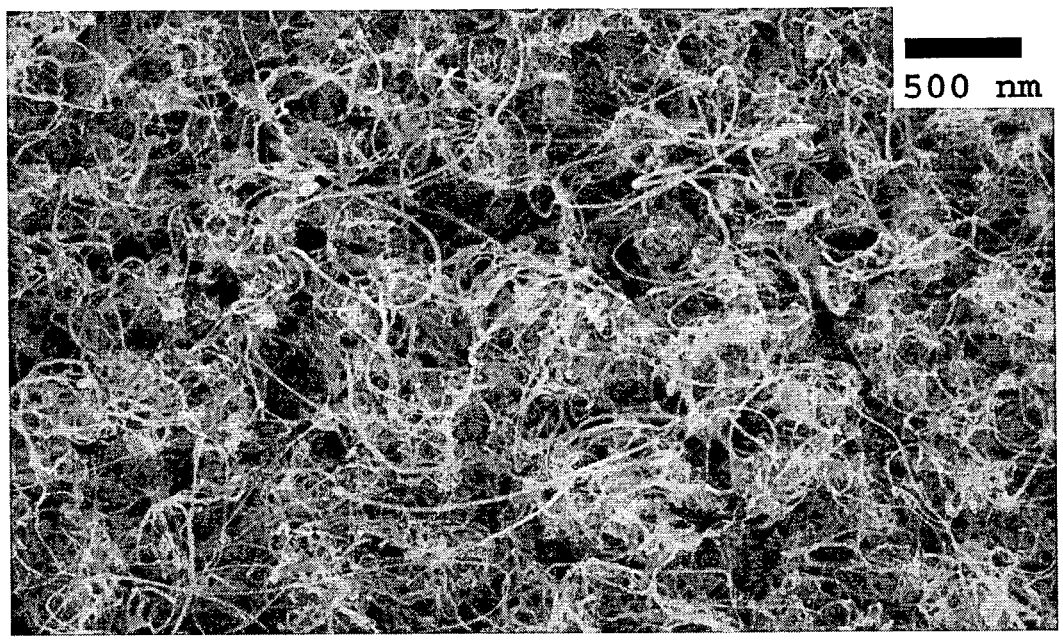
FIG. 1A shows a structure, according to certain embodiments of the invention, having a thin layer of metal catalyst that may be used in an exemplary method of growing nanofabric.
FIGS. 1B.1-1B.2 illustrate exemplary methods of growing nanotube fabric by CVD using the structure of FIG. 1A.

All parameters of example 1 are duplicated except in place of methane, ethylene is used at a flow rate of 5.0 sccm for 10 minutes, the CVD temperature is 800° C. The same types of metal layers are employed; however, the thicknesses of the metal layers used are 5 nm aluminum, 1 nm iron, and 2 nm molybdenum. FIG. 1D is a micrograph of the nanotube growth resulting from such use of ethylene.

EXAMPLES 3-6

Examples 3-6 show that the rate of methane gas flow affects the production of nanotube fabrics in typical CVD methods. From the micrographs one can see how the change in gas flow from 725 to 500 to 250 sccm affects the amount of growth. These examples show that the porosity and type of nanotubes grown may be controlled by changing specific parameters in the growth process. The growth of nanotubes is sustained over this range and can be finely controlled to generate primarily multilayer fabrics (750 sccm) to primarily monolayer fabrics (250 sccm). Reduction in gas flow to even lower levels is possible to assure primarily monolayer fabrics. An increase of the concentration would allow growth of fabrics with multilayers. Other parameters such as growth time and temperature can be controlled in concert with feedstock gas flow to provide more control over the fabric's characteristics.

Figure 1E:
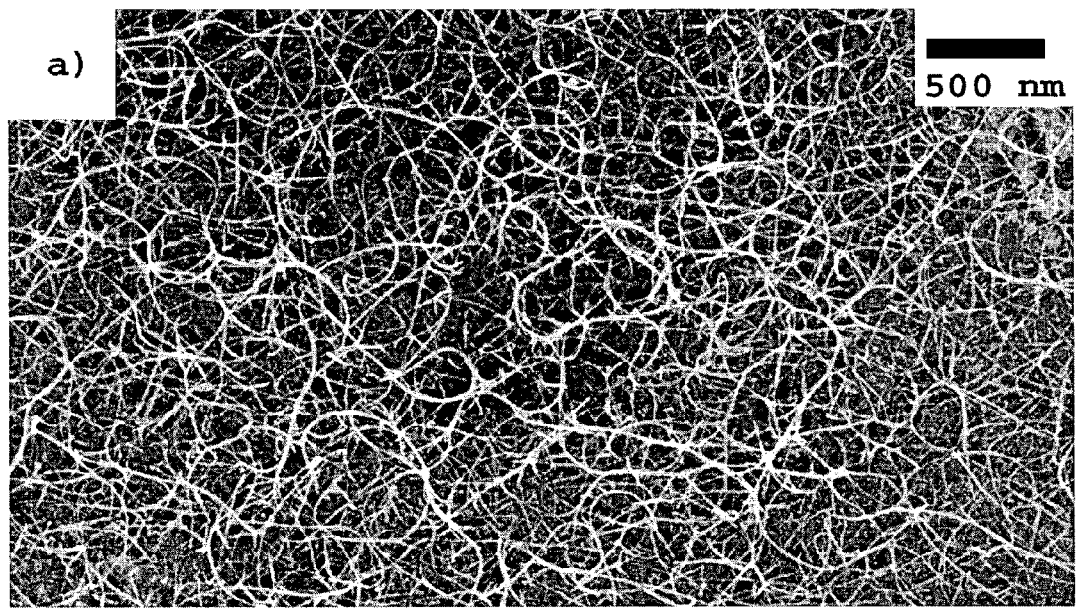

Example 3: Methane is flowed at 725 sccm and the argon and hydrogen gas flow are kept constant at 100 sccm and 400 sccm, respectively. CVD is performed as above with the following parameters: the CVD is performed at 850° C. for 1 minute with the following metal layers: 15 nm aluminum, 1 nm iron and 2 nm molybdenum. FIG. 1E is a micrograph of the film which resulted from this procedure.

Figure 1F:
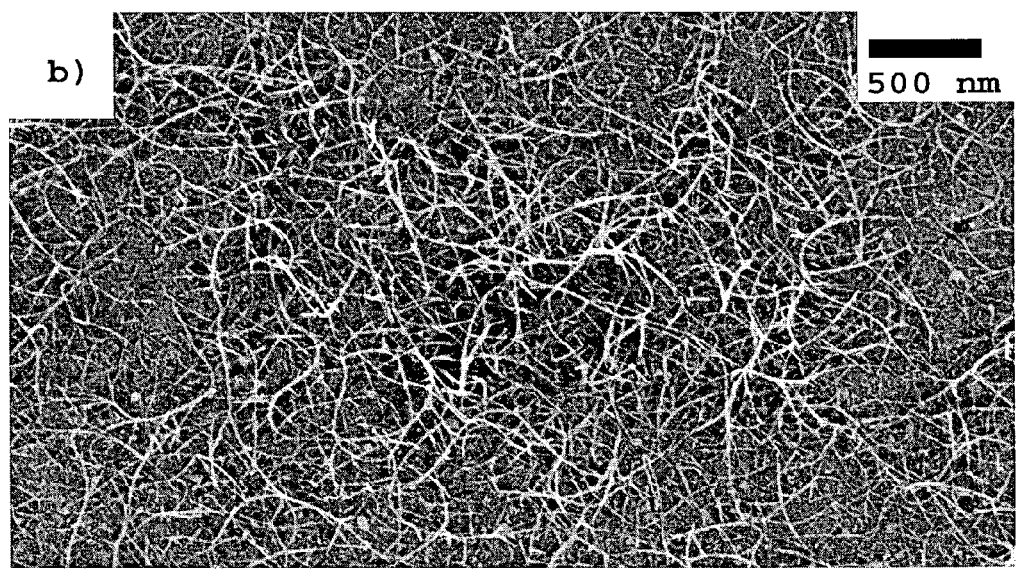

Example 4: All parameters are kept the same as example 3 except methane gas flow is 500 sccm. FIG. 1F is a micrograph of the film which resulted from this procedure.

Figure 1G:
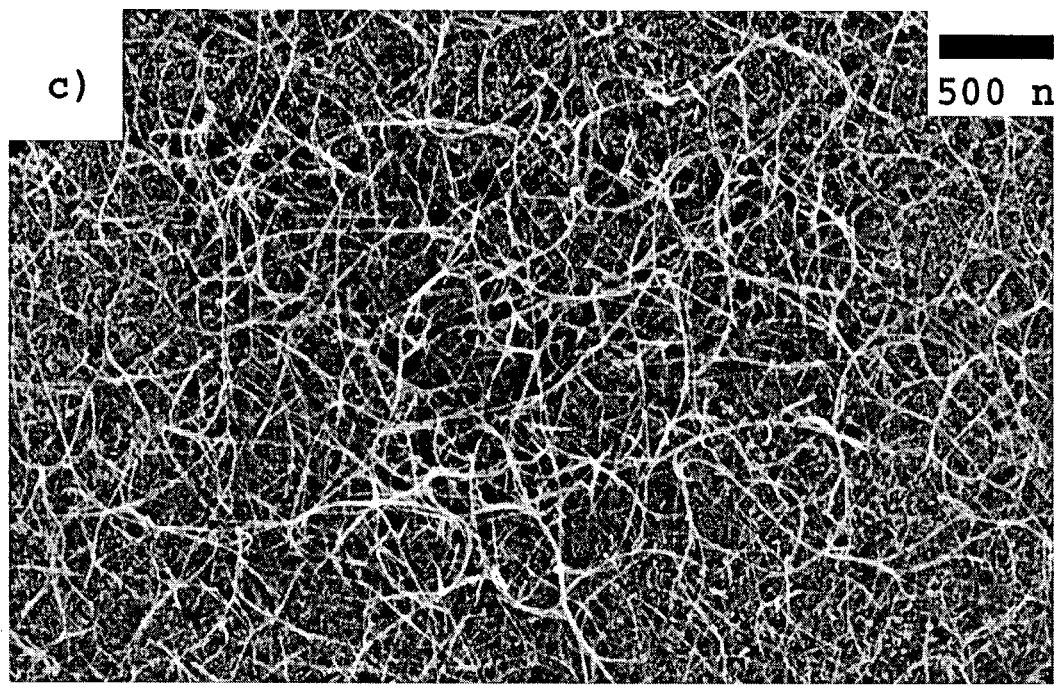

Example 5: All parameters are kept the same as example 3 except methane gas flow is 250 sccm. FIG. 1G is a micrograph of the film which resulted from this procedure.

Figure 1H:
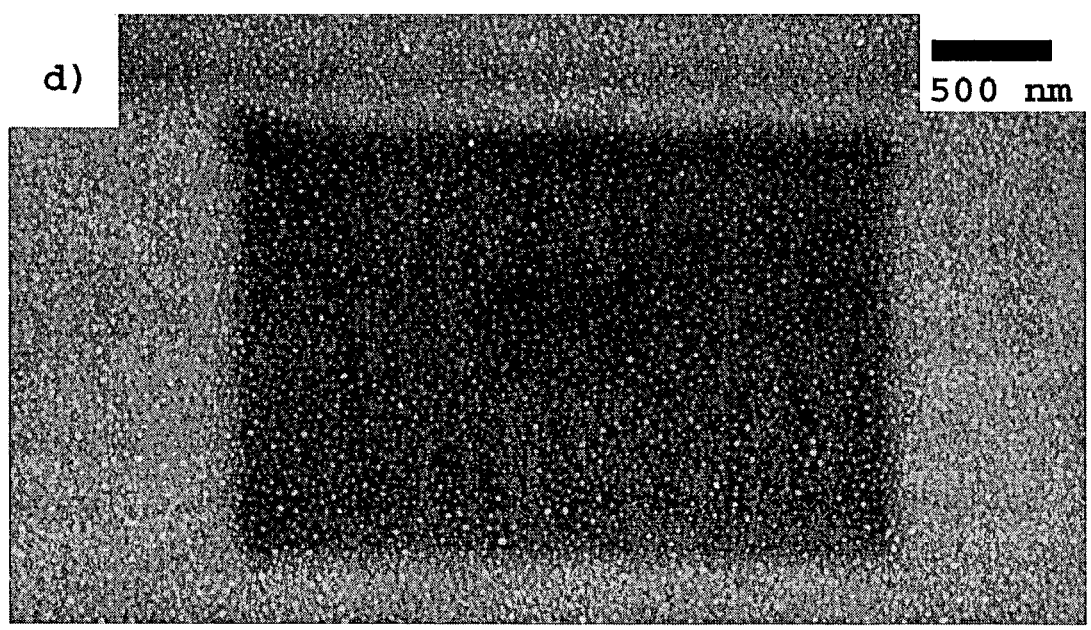

Example 6: All parameters are kept the same as example 3 except methane gas flow is 100 sccm. FIG. 1H is a micrograph of the film which resulted from this procedure.

EXAMPLES 7-9

Examples 7-9 mirror examples 3-6 in that the flow rates of ethylene gas used are decreased in sequential CVD processes, while keeping all other variables constant. As above, all of these examples show fine control may be achieved over the growth density, nanotube porosity, nanotube length and the resistance per square values. (Resistance per square is used to assess in general the porosity of the nanotubes and/or their overall conductive quality.) Figures for examples 7-9, respectively, show fabrics corresponding to decreasing the gas flow. As flow decreases, the fabric density decreases and resistance increases.

Figure 1I:
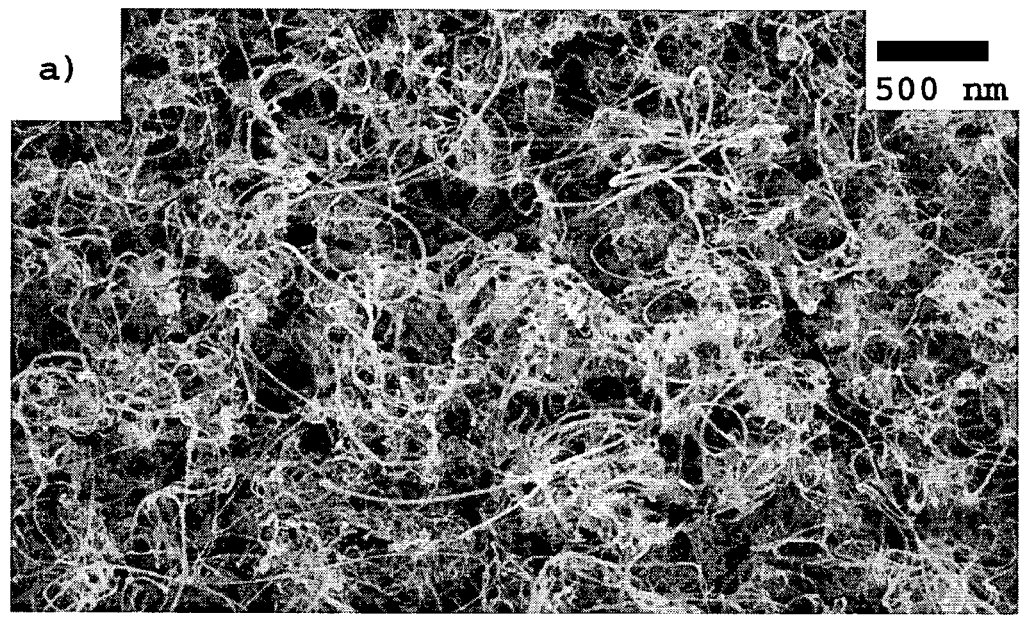

Example 7: The argon flow and hydrogen flow are kept constant at 100 sccm and 400 sccm, respectively. Ethylene gas is flowed at 5.0 sccm. Metal layers are as follow: 5.0 nm aluminum, 1.0 nm iron and 2.0 nm molybdenum, the CVD temperature is 800° C., and is run for 10 minutes. FIG. 1I is a micrograph of the film, which resulted from this procedure.

Figure 1J:
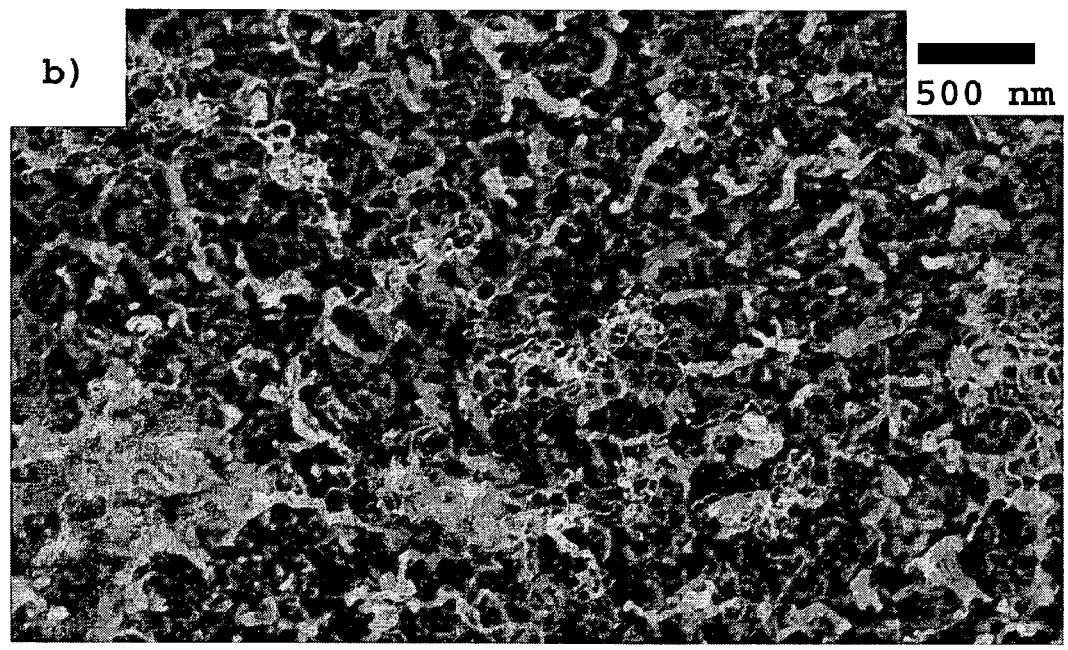

Example 8: All parameters are kept the same as example 7 except ethylene gas flow is 2.5 sccm. FIG. 1J is a micrograph of the film which resulted from this procedure.

Figure 1K:
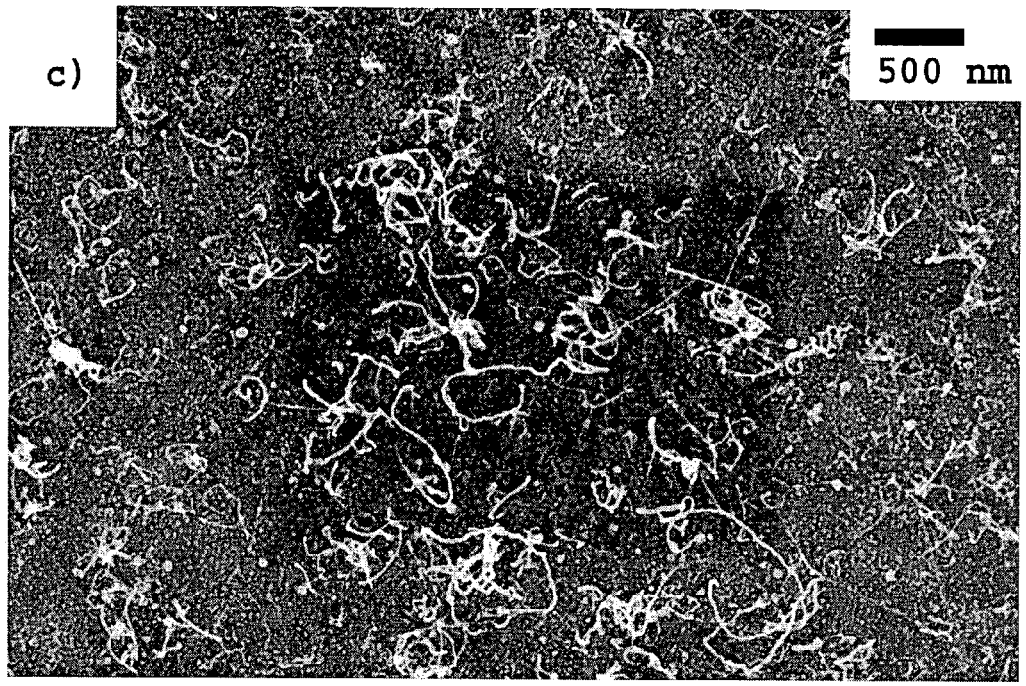

Example 9: All parameters are kept the same as example 7 except ethylene gas flow is 1.0 sccm. FIG. 1K is a micrograph of the film which resulted from this procedure.

EXAMPLES 10-12

Examples 10-12 show the effects of reducing CVD temperatures while keeping all other parameters constant. The CVD methods are otherwise much the same as in example 1. These examples also show that fine control may be achieved in porosity, thickness and length of nanofabrics and nanotubes. Figures for examples 10-12, respectively, show fabrics corresponding to decreasing CVD temperatures. As the temperature decreases, the fabric density decreases, and the resistance increases.

Figure 1L:
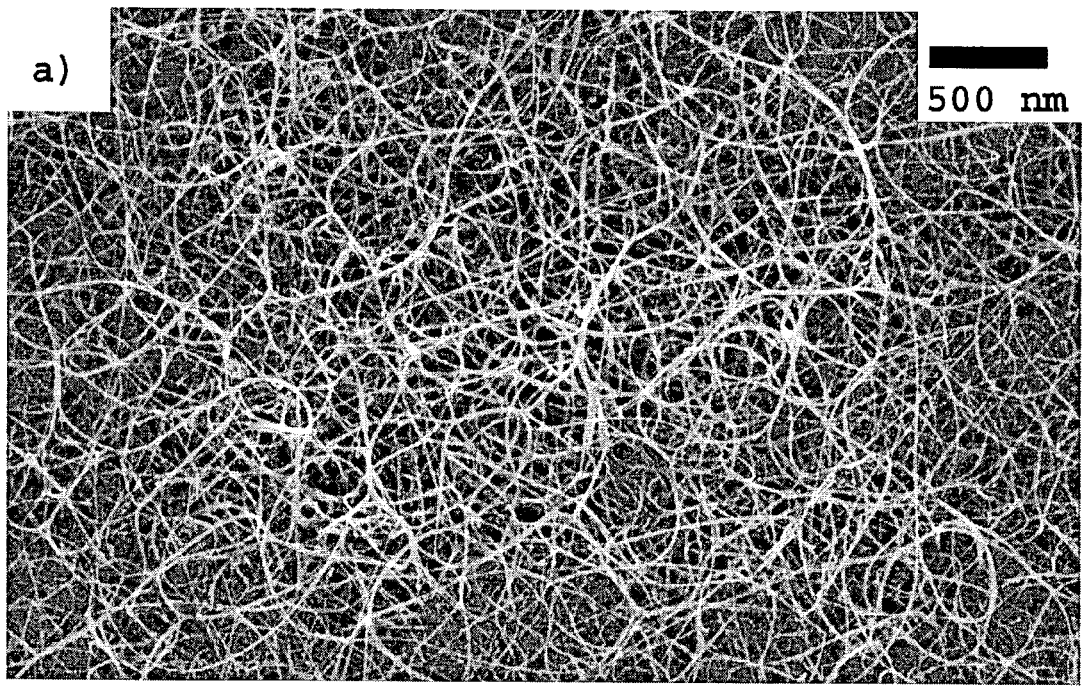

Example 10: CVD is performed on a substrate of silicon coated with 15 nm aluminum, 1 nm iron and 2 nm molybdenum, using a 725 sccm flow of methane gas at 900° C. for ten minutes in Ar/H flow as above. FIG. 1L is a micrograph of the film which resulted from this procedure.

Figure 1M:
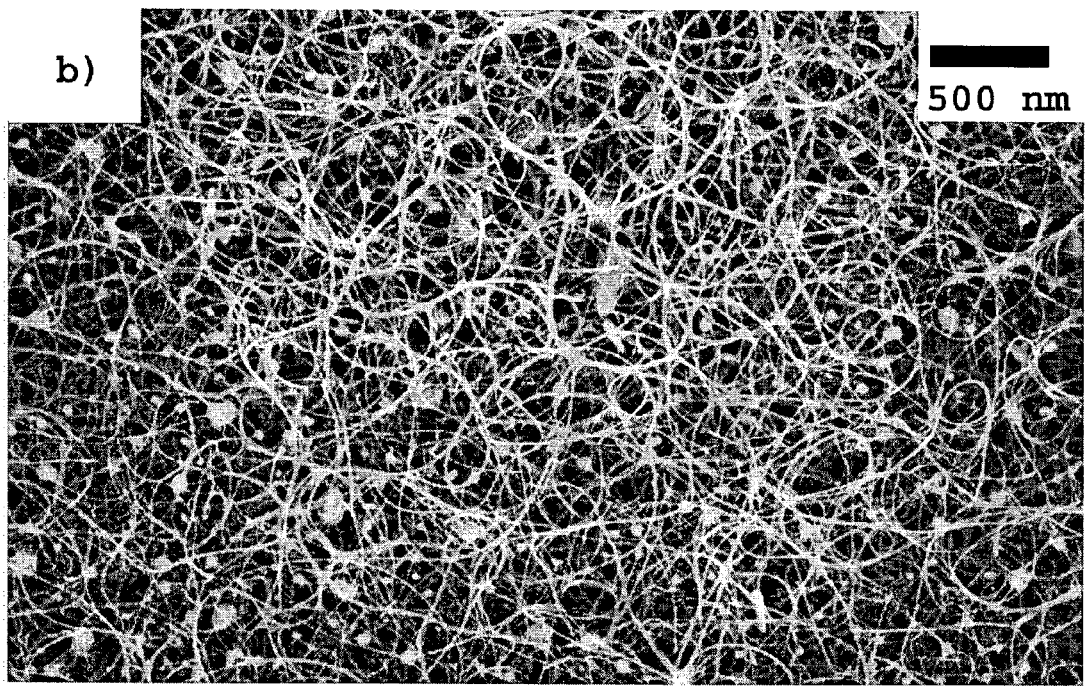

Example 11: All parameters are kept the same as in example 10, except the CVD temperature is decreased to 850° C. FIG. 1M is a micrograph of the film which resulted from this procedure.

Figure 1N:
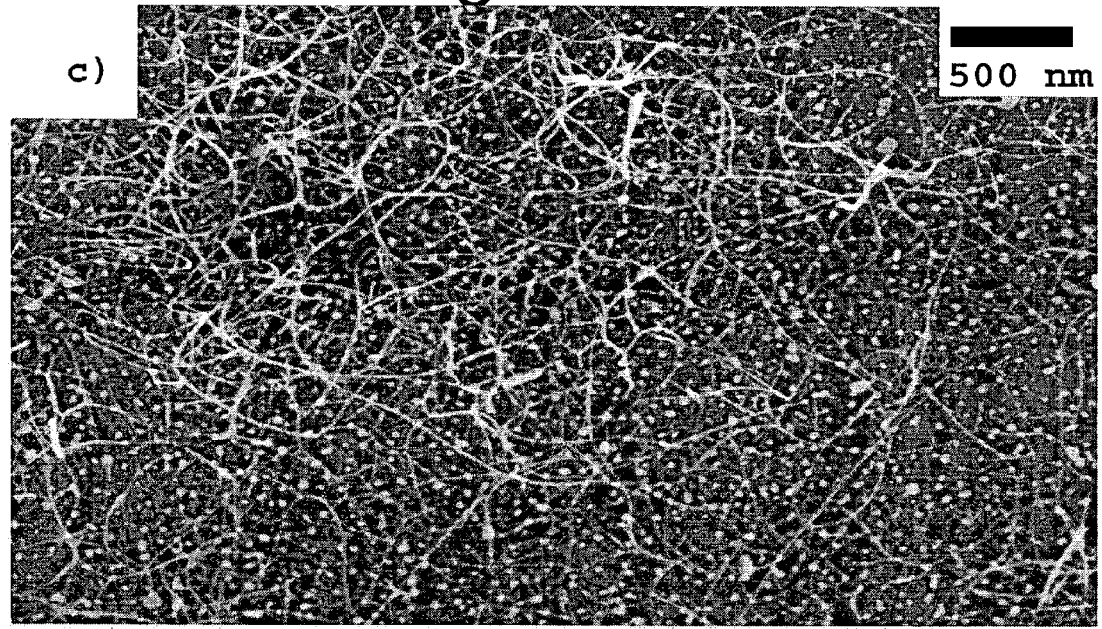

Example 12: All parameters are kept the same as in example 10, except the CVD temperature is decreased to 800° C. FIG. 1N is a micrograph of the film which resulted from this procedure.

EXAMPLES 13-16

Figures for examples 13-16, respectively, show fabrics corresponding to decreasing CVD run time. As the run time decreases, the fabric density decreases, and the resistance increases.

Figure 1O:
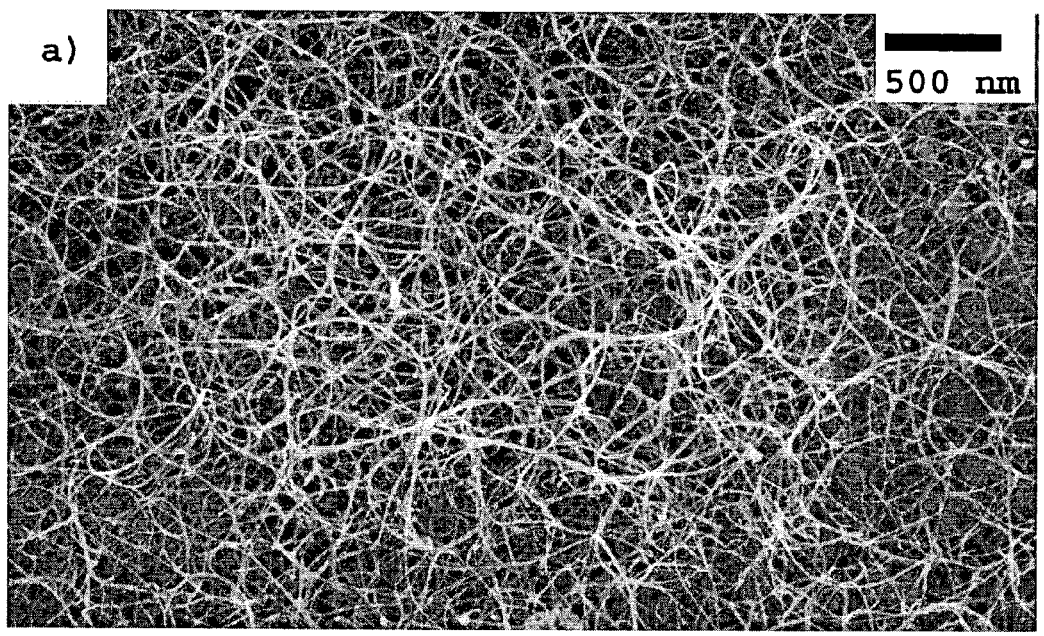

Example 13: CVD is run for 10 minutes on a substrate of silicon coated with 15 nm aluminum, 1 nm iron, and 2 nm molybdenum at 850° C. in a 725 sccm flow of methane gas and 100:400 sccm Ar:H$_2$ as above. FIG. 1O is a micrograph of the film which resulted from this procedure.

Figure 1P:
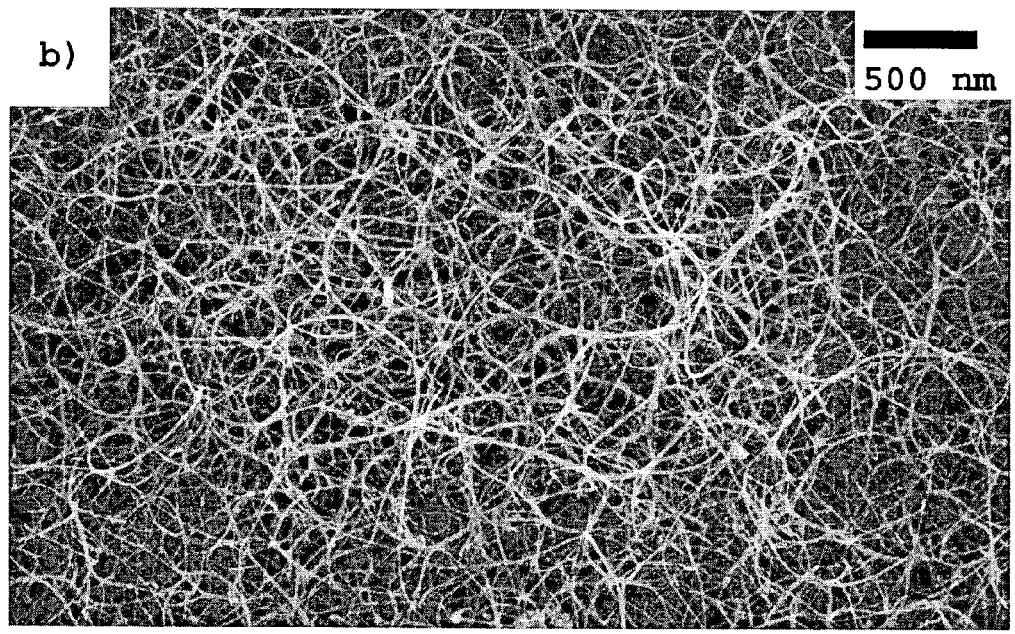

Example 14: All parameters are kept the same as example 13, except the CVD run time is decreased to five minutes. FIG. 1P is a micrograph of the film which resulted from this procedure.

Figure 1Q:
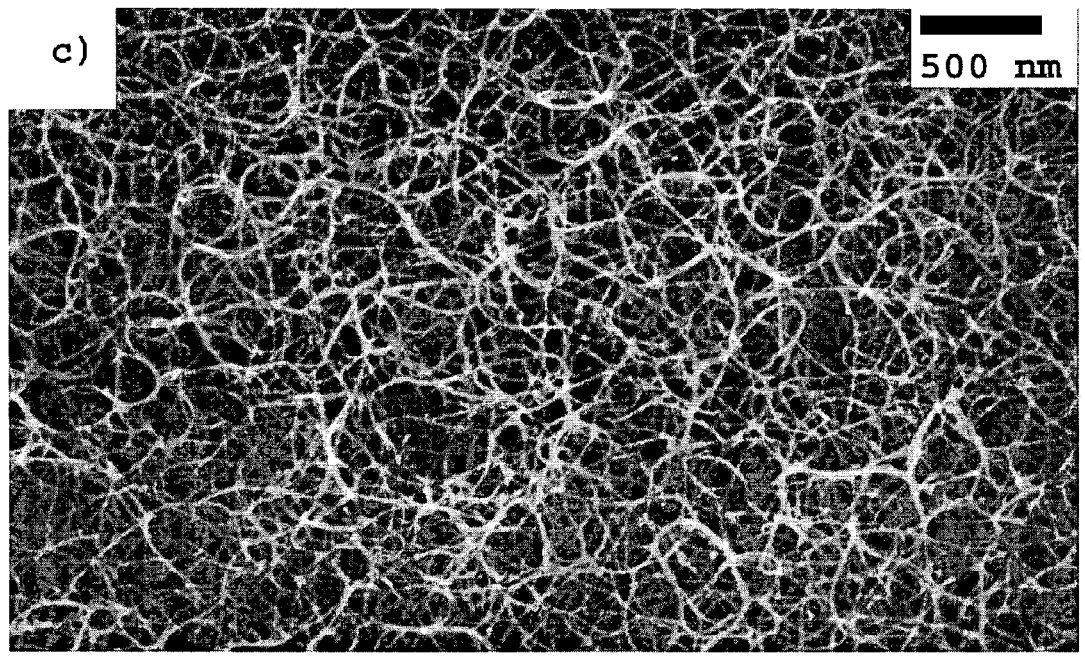

Example 15: All parameters are kept the same as in example 13, except the CVD run time is decreased to two minutes. FIG. 1Q is a micrograph of the film which resulted from this procedure.

Figure 1R:
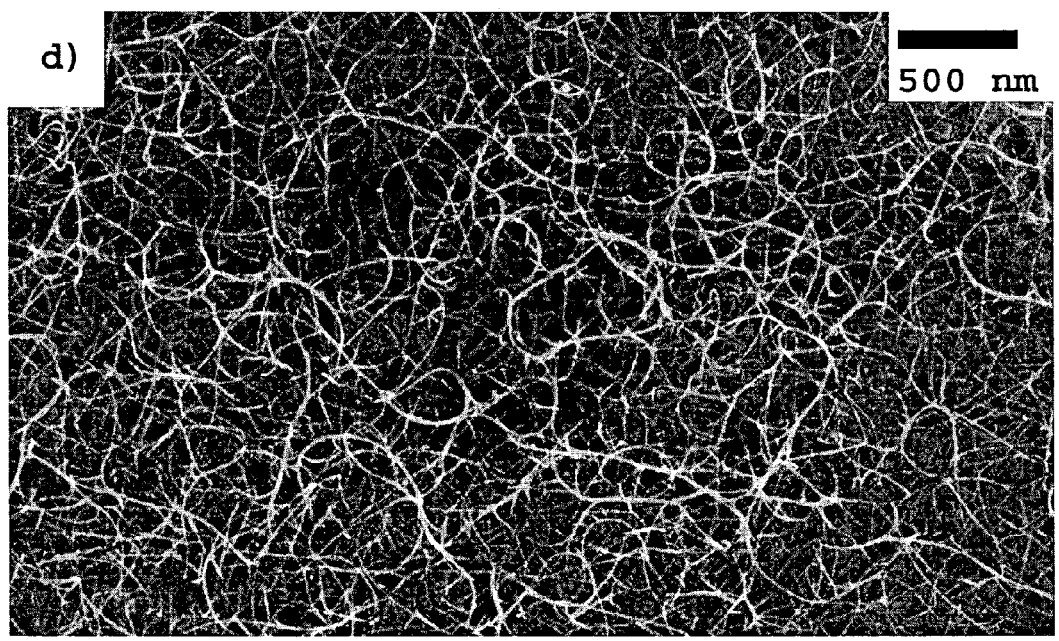

Example 16: All parameters are kept the same as in example 13, except the CVD run time is decreased to one minute. FIG. 1R is a micrograph of the film which resulted from this procedure.

EXAMPLES 17-20

Examples 17-20 show the effect that varying the thicknesses of the aluminum metal layer has on the resulting films. As above, all of these examples show fine control may be achieved over the growth density, nanotube porosity, nanotube length and the resistance per square values. Figures for examples 17-20, respectively, show fabrics corresponding to decreasing thickness of the metal layer catalyst. As the thickness decreases, the fabric density decreases, and the resistance increases.

Figure 1S:
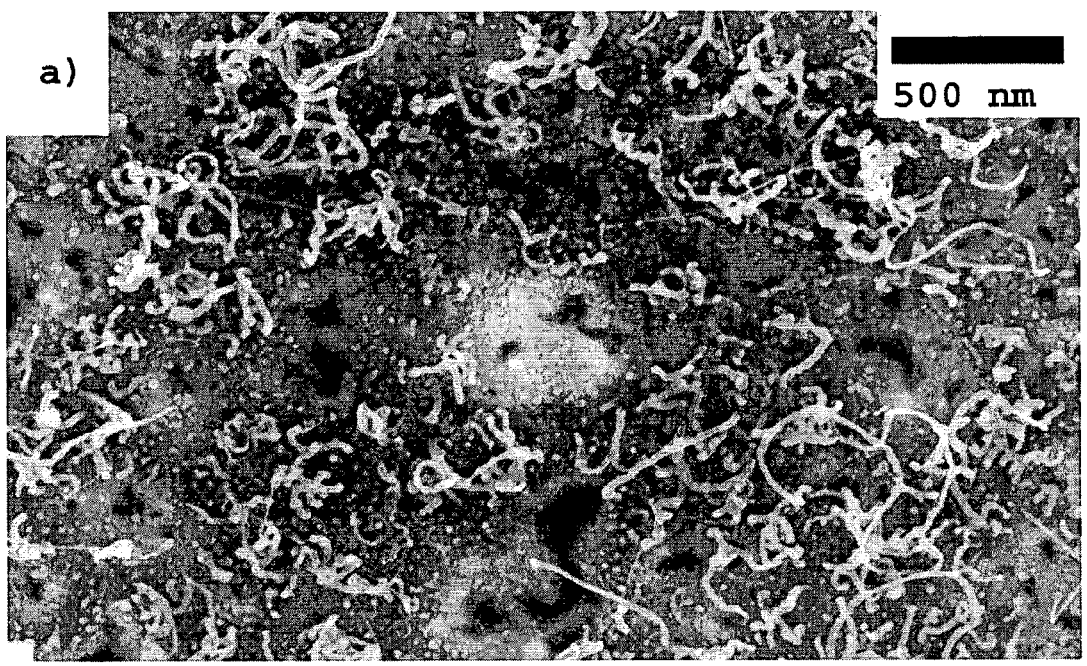

Example 17: CVD is performed on a substrate of silicon coated with 25 nm aluminum, 1 nm iron and 2 nm molybdenum, using a 725 sccm flow of methane gas and the argon and hydrogen gas flow are kept constant at 100 sccm and 400 sccm, respectively, at 850° C. for ten minutes. FIG. 1S is a micrograph of the film which resulted from this procedure.

Figure 1T:
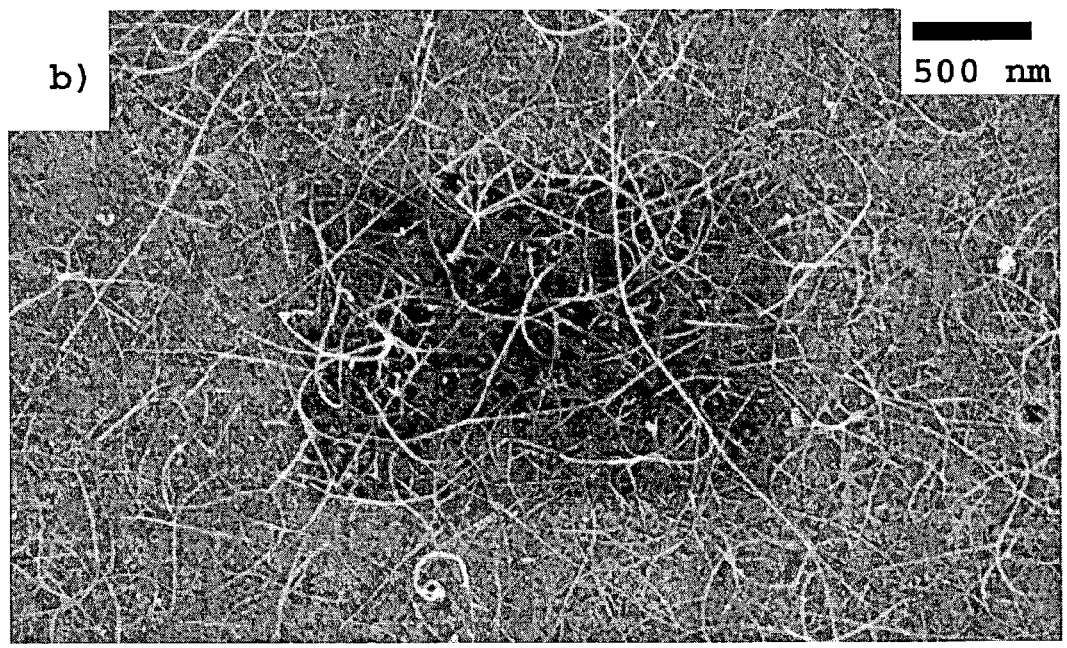

Example 18: All parameters are kept the same as in example 17, except the thickness of the aluminum layer is decreased to 15 nm. FIG. 1T is a micrograph of the film which resulted from this procedure.

Figure 1U:
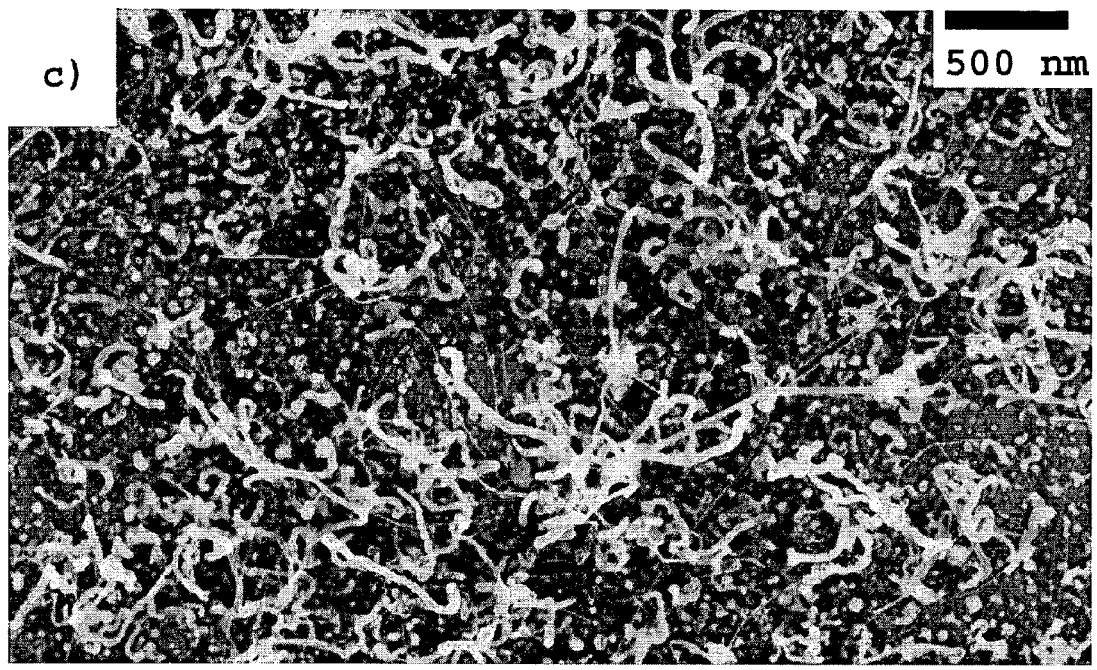

Example 19: All parameters are kept the same as in example 17, except the thickness of the aluminum layer is decreased to 5 nm. FIG. 1U is a micrograph of the film which resulted from this procedure.

Figure 1V:
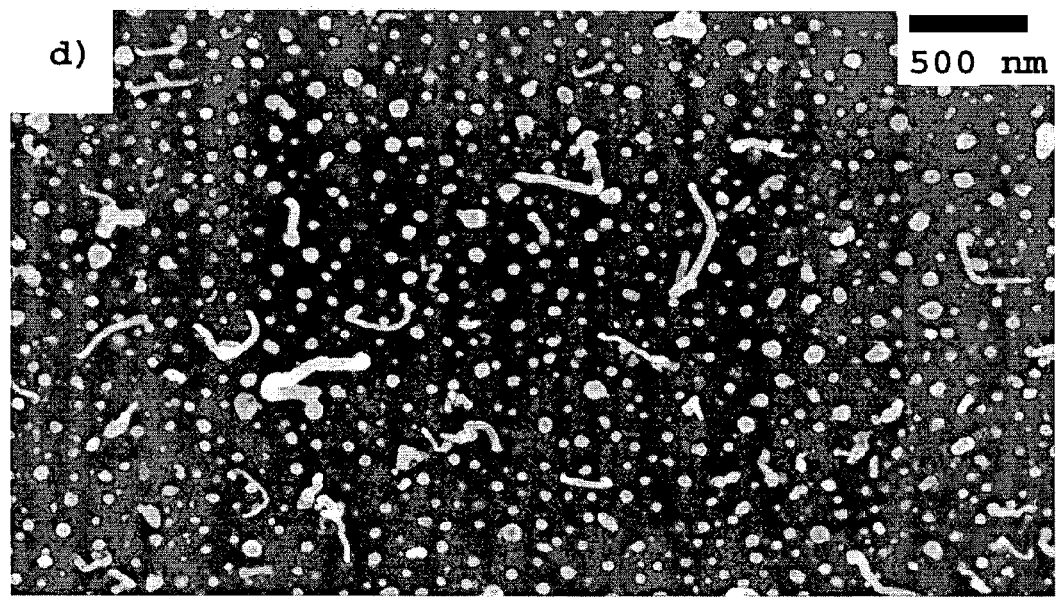

Example 20: All parameters are kept the same as in example 17, except the thickness of the aluminum layer is decreased to 0 nm (no aluminum is deposited in this example). FIG. 1V is a micrograph of the film which resulted from this procedure.

EXAMPLES 21-22

Examples 21-22 show the results of altering thin metal layer thickness and using silicon dioxide as substrate. Altering the metal layer thickness allows tuning of the porosity and specifically the type of nanotubes. Thicker layers are more conducive to growing MWNTs while thinner layers grow better SWNTs and leave less residual metal because they are vaporized at the high temperatures of nanotube growth. Figures for examples 21-22, respectively, show fabrics corresponding to decreasing thickness of the metal layer catalyst. As the thickness decreases, the fabric density decreases, and the resistance increases.

Figure 1W:
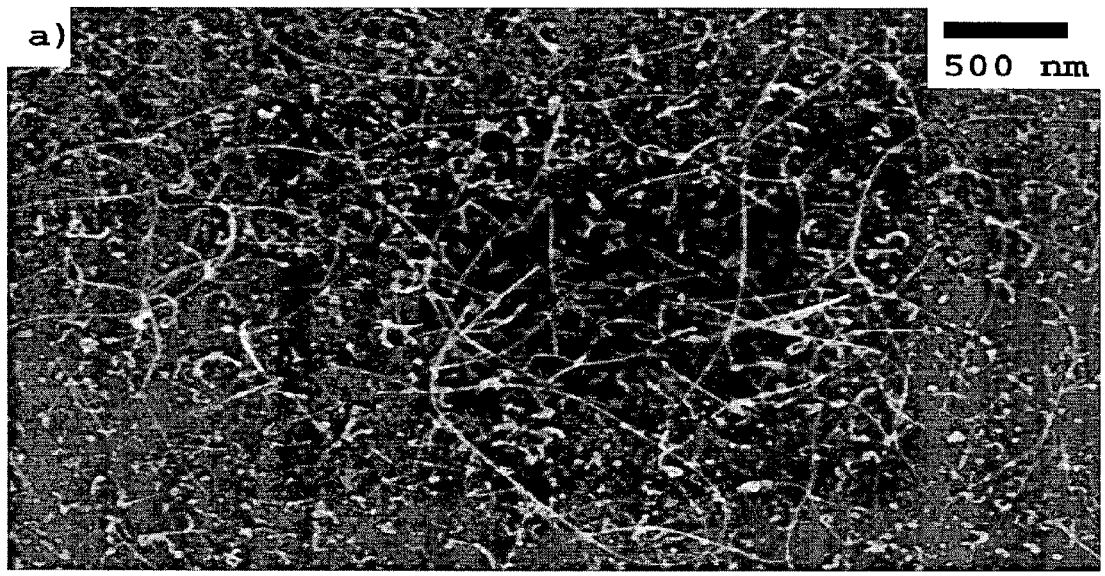

Example 21: CVD is performed on a silicon dioxide substrate coated with thin metal layers; 2.0 nm aluminum, 0.5 nm iron and 1.0 nm molybdenum at 850° C. in a 500 sccm flow of methane gas in 100:400 sccm Ar:H$_2$ for one minute. FIG. 1W is a micrograph of the film which resulted from this procedure.

Figure 1X:
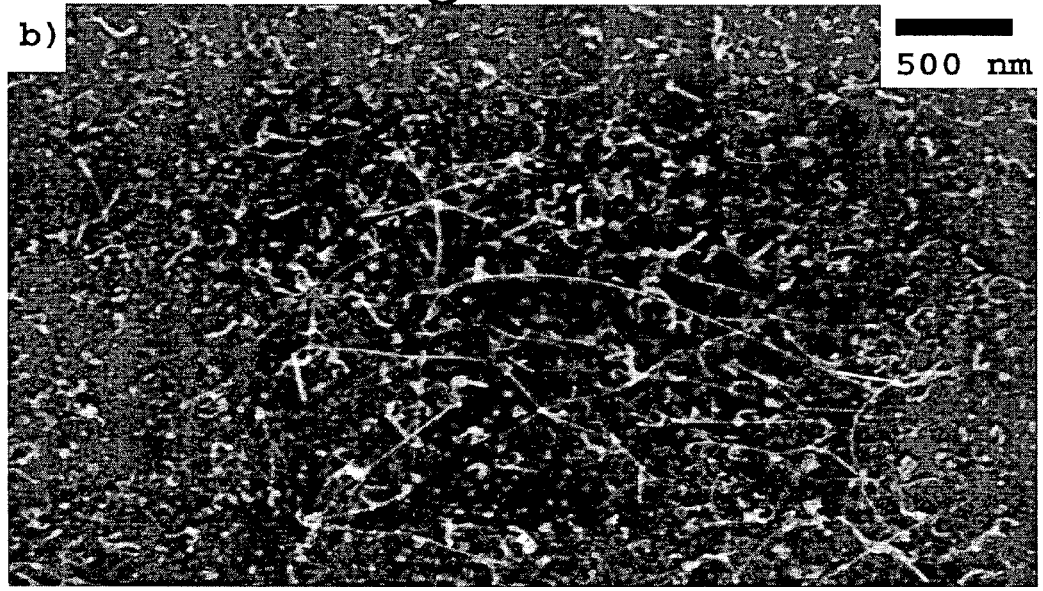

Example 22: All parameters are kept the same as example 21, except thin metal layers of the following thicknesses; 1.0 nm aluminum, 0.5 nm iron and 1.0 nm molybdenum were used. FIG. 1X is a micrograph of the film which resulted from this procedure.

EXAMPLES 23-24

Examples 23 and 24 show the films that are grown by CVD on silicon and silicon dioxide substrates. These examples illustrate control over porosity even on different substrates. Here we have an example of a semiconducting substrate and an insulating substrate. Growth is achievable on a variety of substrate layers allowing ready integration into typical semiconductor process flows and ease of manufacture. Figures for example 23 and 24 show that the fabric density changes with the type of substrate, and thus resistance changes.

Figure 1Y:
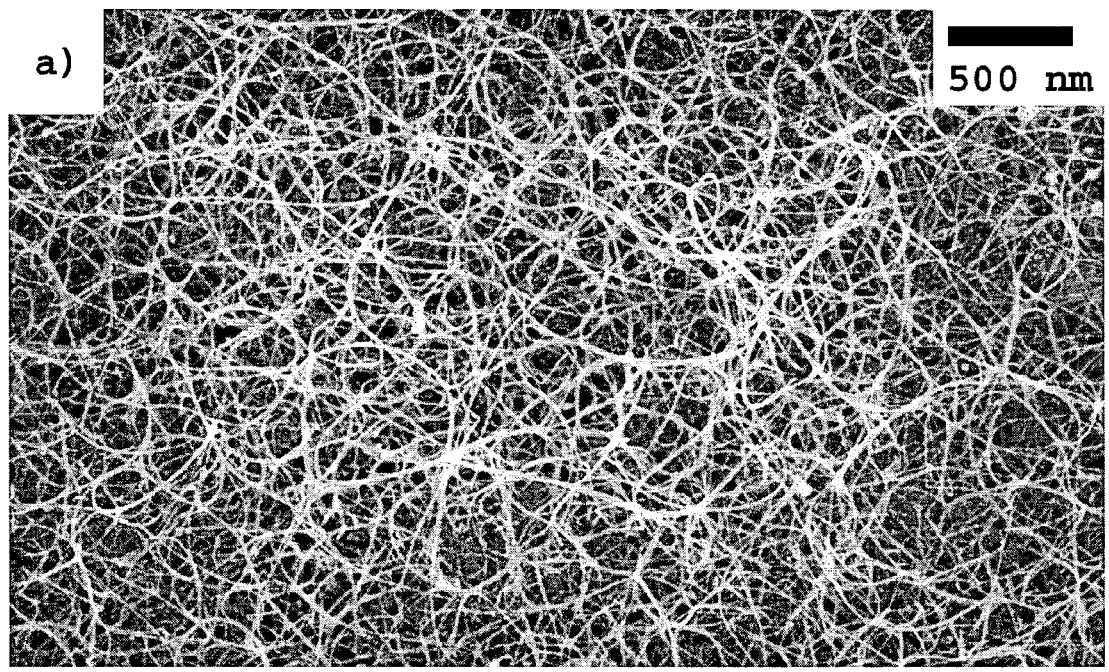

Example 23: CVD is performed on a silicon substrate coated with thin metal layers; 15 nm aluminum, 1.0 nm iron and 2.0 nm molybdenum at 850° C. in a 500 sccm flow of methane gas for two minutes. FIG. 1Y is a micrograph of the film which resulted from this procedure.

Figure 1Z:
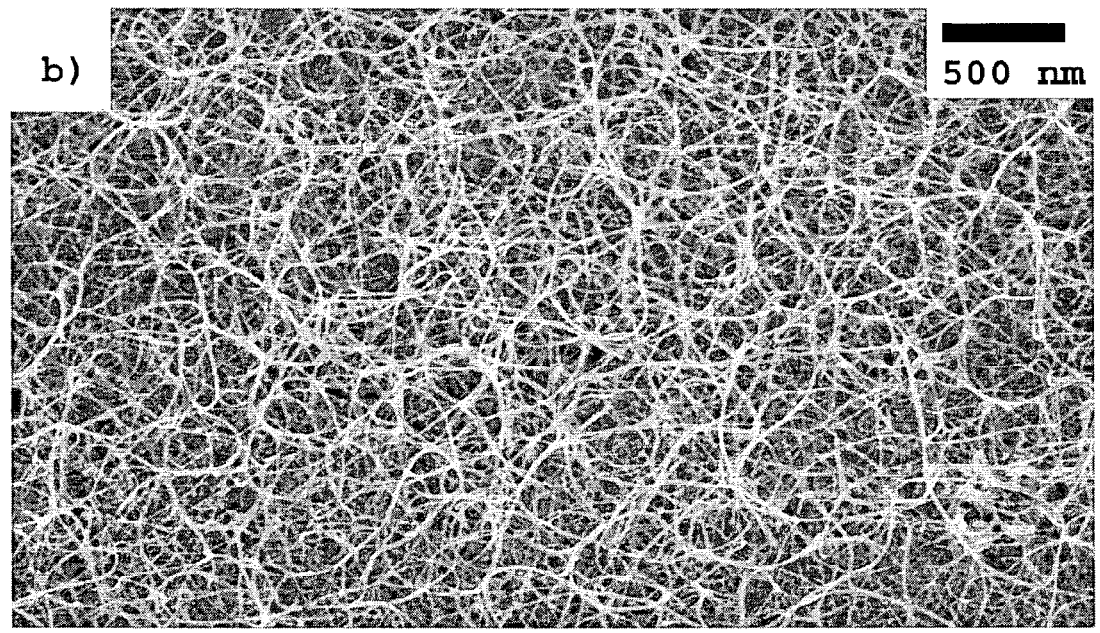

Example 24: All parameters are kept the same as example 23, except silicon dioxide is used as substrate. FIG. 1Z is a micrograph of the film which resulted from this procedure.

Growing Nanofabrics with Nanoparticles

Another preferred method of growing nanofabrics uses metallic or metal oxide nanoparticles (e.g., iron oxide) as carbon nanotube growth catalyst. Metallic or metal-oxide nanoparticles have a narrow range of diameters. This narrow range can lead to more effective control over the diameter and type of nanotubes forming the eventual nanofabric. The surface of the substrate used can be derivitized to create a more hydrophobic or hydrophilic environment to promote better adhesion of the catalyst particles. The nature of the substrate allows control over the level of dispersion of the nanoparticles to a precision sufficient to generate monolayer nanotube fabrics.

Figure 3A:
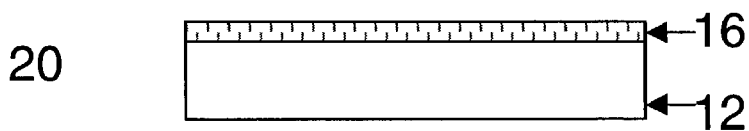
FIG. 3A shows a structure, according to certain embodiments of the invention, having a distribution of nanoparticles that may be used in an exemplary method of growing nanofabric.

FIG. 3A shows a cross-sectional view of an exemplary structure 20 used to grow nanofabrics. A substrate 12 has a distribution 16 of metallic or metal oxide nanoparticles thereon. (For simplicity, the figure shows the distribution as a continuous layer, though people skilled in the art will appreciate that in reality the structure 20 will have a distribution of relatively discrete nanoparticles.) The substrate surface used for generation of carbon nanotubes may be any material including, but not limited to, silicon, thermal oxide, silicon oxide, silicon nitride, tungsten, tungsten/titanium and other typical insulators, semiconductors and metallic surfaces commonly used in CMOS and semiconductor fabrication processes the surface may have electronic components and patterns already defined therein, as mentioned above, and the substrate may be functionalized or non-functionalized.

Figure 3B:
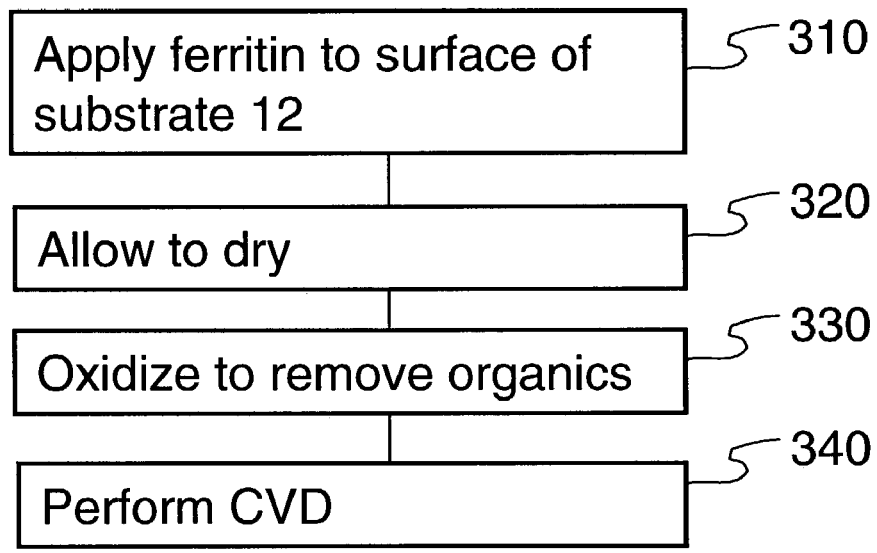
FIGS. 3B-C illustrate exemplary methods of growing nanotube fabric by CVD using the structure of FIG. 3A.

FIG. 3B illustrates a way of growing a nanofabric using a substrate coated with nanoparticles 16. A mixture of ferritin and water is created. For example, ferritin dissolved in deionized (DI) water at a typical concentration (1-1000 μM) (SIGMA catalog) is provided. The ferritin contains naturally encapsulated iron in an organic layer or shell, and can be processed so that the encapsulated iron may be used in subsequent nanotube generation. This shell is oxidized using air or oxygen oxidation or plasma ashing, which causes its removal leaving only an iron oxide nanoparticle. During CVD growth of nanotubes the iron oxide nanoparticles are reduced to leave metallic iron nanoparticles which catalyze the growth of nanotubes. The purpose of using ferritin or any appropriate nanoparticles is to cause the nanoparticles to be dispersed on the surface in an even fashion (monodisperse). Ferritin particles have a very narrow diameter range as do the nanoparticles discussed below.

The ferritin solution is applied 310 to a surface of substrate 12. Before application the substrate can be derivitized to make it more hydrophilic or hydrophobic in order to promote adhesion of the ferritin to the surface. The substrate is allowed to dry 320 (e.g. approximately five minutes has been found to be sufficient). This leaves a coating of ferritin on the surface of the substrate. The protein shells are then removed 330 from the ferritin particles. For example, the structure may be subjected to either an oxidation operation at 400-800° C. for about 15 minutes, or it may be subjected to a plasma ashing operation. The oxidation process removes substantially all of the proteinaceous shell from the ferritin, thereby leaving behind a coating 16 of nanoparticles of iron oxide. The nanoparticles are approximately two to five nanometers in diameter, or more particularly approximately three nanometers in diameter. See Li, 46 Journal Physical Chem. above.) Once catalyst particles from ferritin are formed, CVD may be performed 340 to grow a nanofabric of nanotubes. The nanofabric may be grown, for example, over an entire wafer surface as a monolayer of contacting nanotubes. The above embodiment is conducive to growing a conductive (primarily) monolayer fabric with sufficient density to remain suspended over a switching junction.

Under yet other embodiments, metal ligand-catalyst precursor molecules are used to deposit metallic nanoparticles on a functionalized substrate surface to thereby help create growth of nanotubes. Typically, the formula of the metal/ligand complex will have a formula such as ML, in which M is a metal such as iron, cobalt, or nickel, and L is one or more organic ligands having an affinity for the metal. One general formula may be $C_xH_y$ (COOH), but other carbon, oxygen, nitrogen and/or sulfur-containing ligands are known and may be used. A metallic nanoparticle ligated to an organic moiety is deposited on a functionalized substrate surface. The surface is functionalized to optimize ligand bonding during spin coating, a procedure which may result in minimal deposition of untreated nanoparticles. Certain embodiments use a generic method to synthesize metallic nanoparticles with organic shells which have a very specific size regime for example 3-5 nm which can be monodisperse on a substrate.

Certain embodiments use prefabricated iron oxide particles as carbon nanotube growth catalyst. Iron oxide nanoparticles are applied to a substrate in a concentration sufficient to support the desired density of nanotube growth. The substrate is then subjected to a CVD operation as described herein. The substrate, optionally, can be dried and/or oxidized prior to beginning the CVD run. For example, iron oxide nanoparticles may be applied to a substrate surface by spin coating. In one embodiment, iron oxide is suspended in deionized water at a 1:10 ratio. The aqueous iron suspension is applied to a substrate surface, and the surface is spun at approximately 1000 rpm to distribute the suspension. The surface is then spun at 4000 rpm to dry the suspension. More than one application of iron oxide nanoparticles may be performed. The number of applications of iron oxide nanoparticles required will vary depending on the concentration of the suspension used, the desired resulting surface density of nanoparticles, the physical properties of the desired fabric, and the physical properties of the substrate used.

Figure 3C:
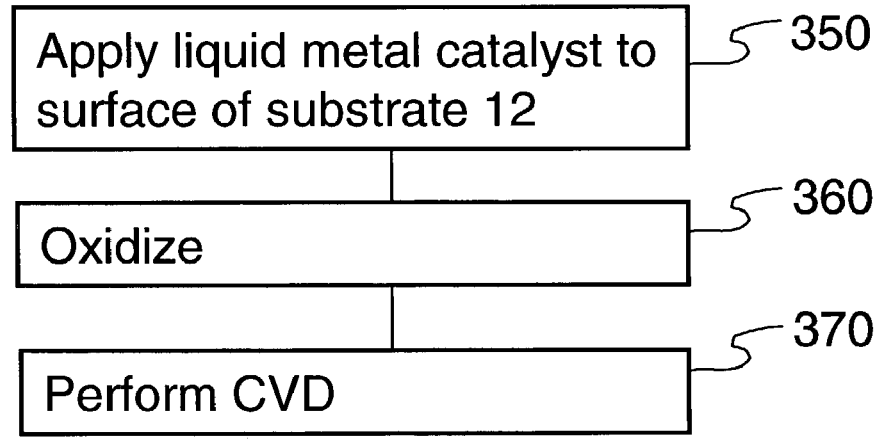

Under yet other embodiments, a liquid catalyst precursor suspension is used. FIG. 3C illustrates a way of growing a nanofabric using liquid metal catalyst. A liquid metal catalyst is created. For example, a dissolved metal catalyst, e.g., iron nitrate $(Fe(NO_3)_3)$, is mixed with methanol and applied onto a substrate 350. The substrate is oxidized 360, e.g., by ashing, thereby leaving a dispersion of iron oxide nanoparticles on the surface of the substrate. The substrate is then subjected to a CVD operation 370 to grow nanotubes. Provided below are several exemplary ways of growing nanofabrics using the above principles.

EXAMPLE 25

Figure 3D:
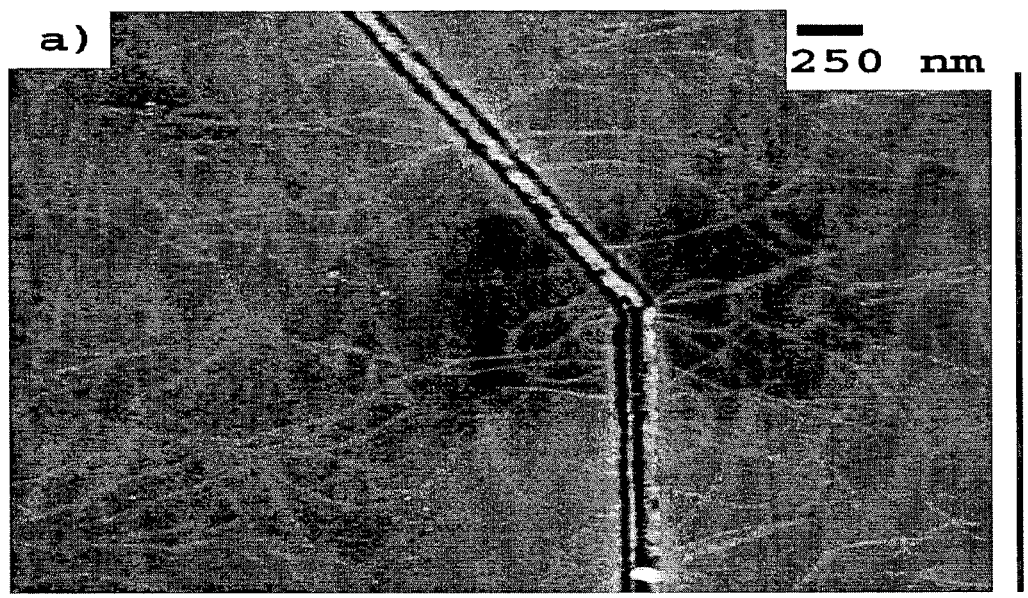
FIGS. 3D-3F are micrographs of nanofabrics grown with exemplary processes according to certain embodiments of the invention.

This is an example of nanoparticles using metal-ligand catalyst precursor molecules. HMDS (hexamethyldisilane) is spun onto a silicon dioxide substrate at 4000 rpm for one minute as an adhesion layer. Iron nanoparticles are made by dissolving $Fe(NO_3)_3$ in solution of a lauric acid in methanol at a ratio of 1:3.3 Fe:lauric acid. The nitrate solution is evacuated to pump off nitric acid, and the solvent. The dried iron nanoparticles are then added to 10 mL toluene and 10 mL isopropanol to resuspend the nanoparticles in solution. The Fe nanoparticle solution is then diluted 1:25 in isopropanol. The iron nanoparticles in a 1:25 iron nanoparticle solution in isopropanol is then deposited on the wafer by spinning at 1000 rpm for 30 seconds, then at 4000 rpm for 20 seconds. Two Fe nanoparticle applications are deposited and spun. The substrate is baked at 100° C. to remove the solvent, it is then ashed for 30 minutes in $O_2$ plasma, CVD is performed at 850° C. for ten minutes in a 500 sccm flow of methane and a 100:400 sccm flow of Ar:$H_2$. FIG. 3D is a micrograph of a nanofabric which resulted from this procedure. The nanoparticles in this embodiment can be tuned to a particular size by changing the organic ligand (analogous to the protein shell of ferritin) that is bound to the metal. Additionally, nanoparticles of different metal or metal oxide species may be mixed together in a solution and applied for use as catalyst, e.g., 50% Fe and 50% Co, or 33% Fe 33% Co and 33% Al, or any other appropriate combinations.

EXAMPLE 26

Figure 3E:
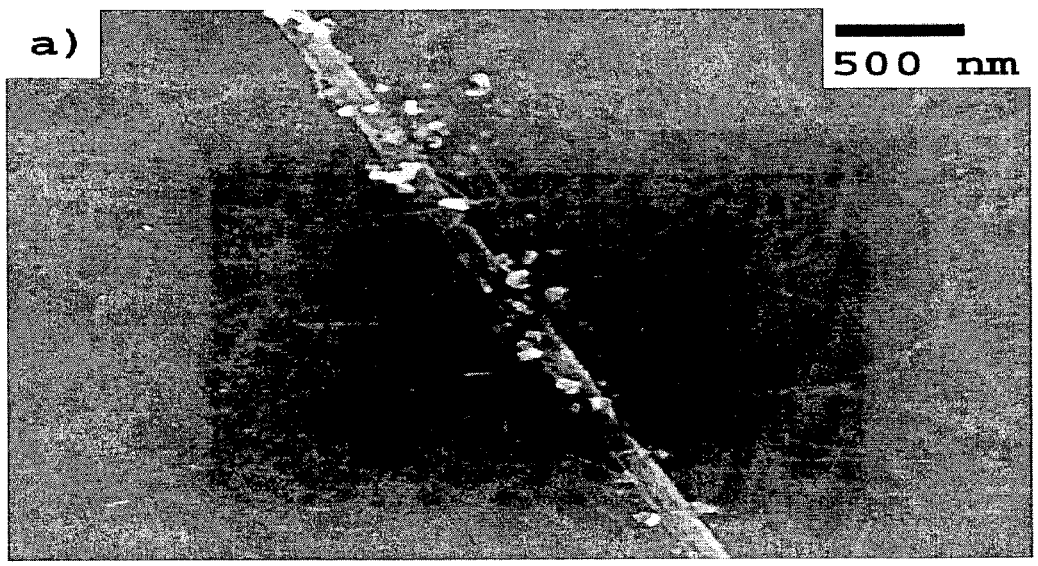

This is an example of iron nanoparticles in solution which are dispersed onto a silicon dioxide substrate and not spin coated on the surface. After the catalyst is dispersed onto the surface, the substrate is allowed to stand for 5 min., covered, and baked at 100° C. to remove solvent, and it is ashed. CVD is performed at 850° C. for ten minutes in a 500 sccm flow of methane and a 100:400 sccm flow of Ar:$H_2$. FIG. 3E is a micrograph of a nanofabric which resulted from this procedure.

EXAMPLE 27

Figure 3F:
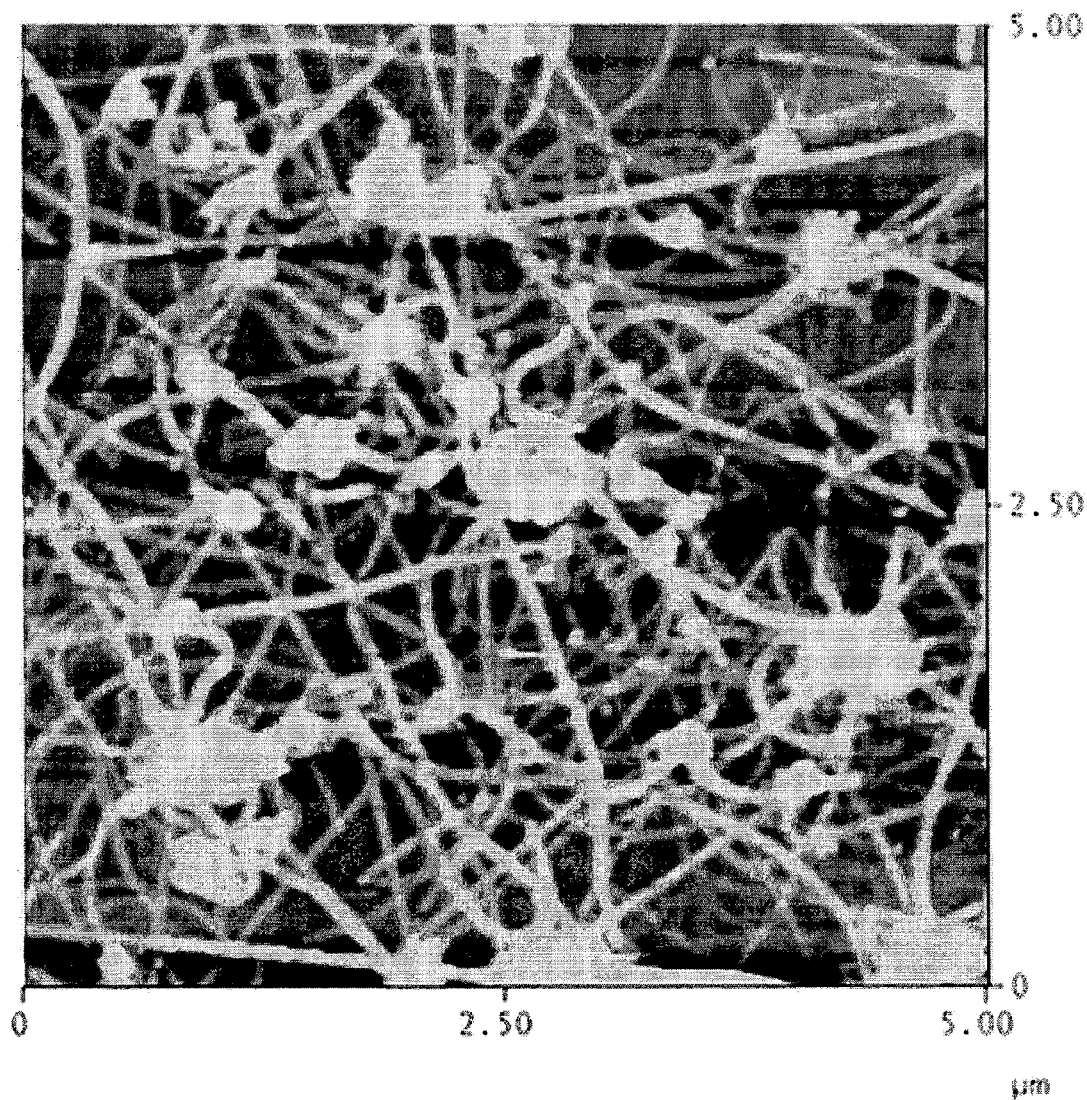

Example 27 demonstrates the growth of carbon nanotubes from a substrate with ferritin on the surface. The process involves the use of ferritin as a catalyst precursor. A 1:10 mixture of ferritin in deionized water is applied to a silica surface of a wafer. The wafer is dried, leaving a dispersed coating of ferritin on the surface of the substrate. The substrate is oxidized to remove all non-iron, organic matter and placed in the oven. The oven is ramped to 700° C. for 10 minutes in Ar:$H_2$, then it is ramped to 800° C. for seven minutes in Ar:$H_2$. CVD is performed at 800° C. with a 10 sccm flow of ethylene for 40 minutes in 600:400 sccm Ar:$H_2$. FIG. 3F shows a FESEM micrograph of carbon nanotubes grown using ferritin as catalyst precursor.

Growing Nanofabrics with a Combination of Nanoparticles and Thin Metal Layers

Another preferred method of growing nanofabrics uses nanoparticles in conjunction with thin metal layers on a substrate surface. This method allows one to easily distribute catalyst particles while taking advantage of the ease of thin layer deposition and their properties in assisting the process of growing nanotubes. Recall that aluminum and molybdenum are useful in generating surface carbon precursors that grow nanotubes.

Figure 4A:
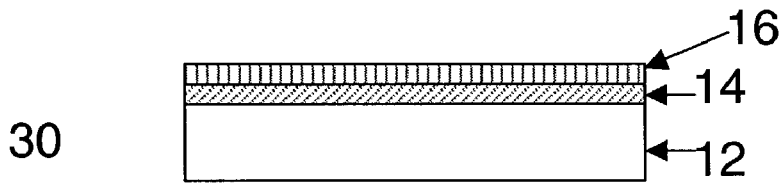
FIG. 4A shows a structure, according to certain embodiments of the invention, having a thin layer of metal catalyst and having a distribution of nanoparticles that may be used in an exemplary method of growing nanofabric.

FIG. 4A shows a cross-sectional view of an exemplary structure 30 used to grow nanofabrics. A substrate 12 has a thin layer 14 of metal catalyst and a distribution 16 of nanoparticles thereover. The substrate surface used for generation of carbon nanotubes may be any material including, but not limited to silicon or thermal oxide, e.g. silicon oxide, alumina. The uppermost layer can be an insulator, semiconductor or metal. Typical substrates which are of interest include silicon dioxide ($SiO_2$), silicon nitride ($Si_3N_4$), titanium, titanium/tungsten and others used in standard CMOS and semiconductor processing. The surface may have already formed therein various components and structures (e.g., gratings) of the aforementioned materials. In addition, the surface may be functionalized or non-functionalized.

Figure 4B:
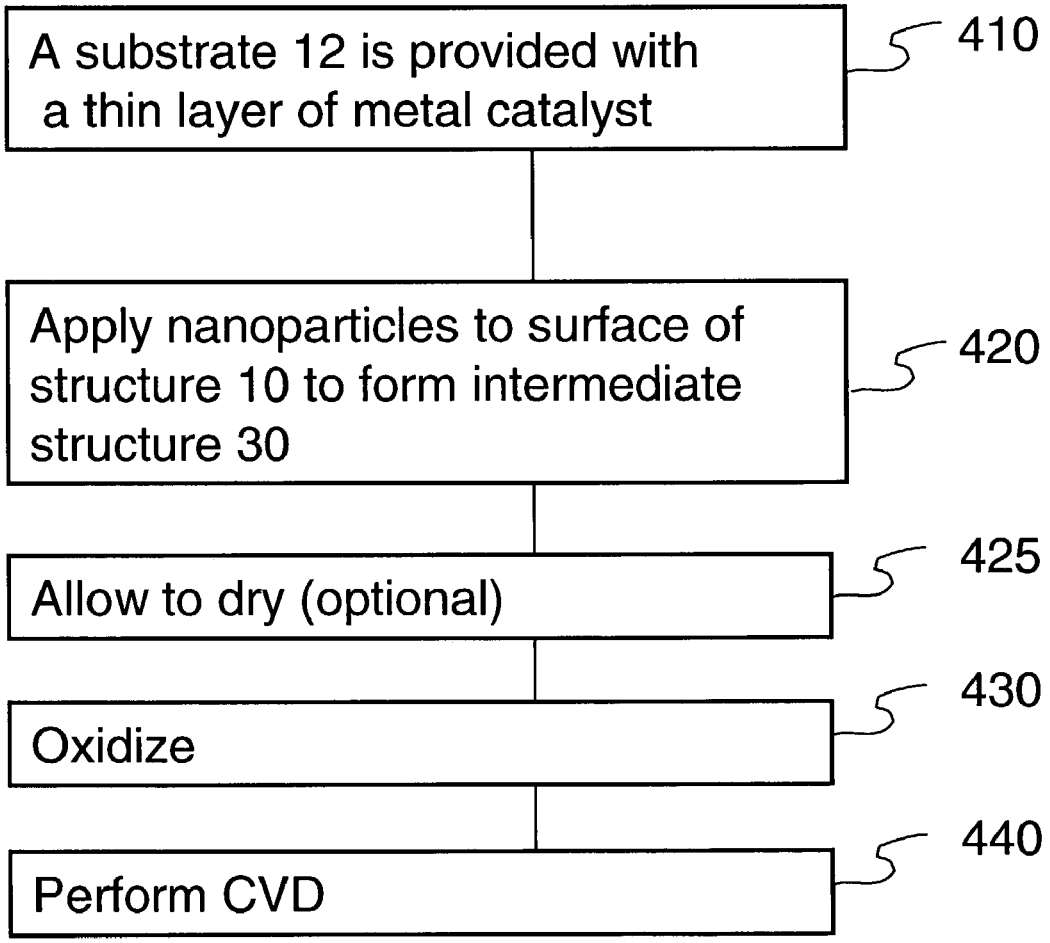

FIG. 4B illustrates a way of growing a nanofabric of carbon nanotubes (e.g., to cover a wafer surface) by using nanoparticles in conjunction with thin metal layers. First, a substrate 12 is provided and a thin layer of metal catalyst is provided 410 to at least selected regions of a wafer or perhaps an entire wafer surface, as described above. This forms layer 14 of metal catalyst. Thereafter, a distribution of nanoparticles 16 is applied 420 to the surface of layer 14. This may be done using any of the above methods of applying nanoparticles, e.g., spin coating suspensions of nanoparticles. Catalyst precursors such as ferritin, liquid metal catalyst precursor and metal ligand-catalyst precursor molecules may also be used in conjunction with thin metal layers on substrates to grow carbon nanotube fabrics. Depending on how the nanotubes are applied, the substrate may be dried (optionally) 425. The substrate is oxidized 430. Once so formed, the structure 30 may be subjected to a CVD process 440 to form a nanofabric.

Forming Nanofabrics with Pre-Formed Nanotubes

Introduction

One preferred method of forming a nanofabric uses spin coating techniques in conjunction with pre-formed nanotubes. Nanotubes should be sufficiently free of amorphous carbon if the nanotubes are to be used as electronic elements. Among other advantages, this technique is more conducive to semiconductor manufacturing environments than growth of nanotubes by CVD because it uses a room temperature process that does not contribute to the thermal budget of the standard CMOS process flows or semiconductor manufacturing methods. Additionally, the overall cost of this integration of nanotubes is very inexpensive.

Figure 5A:
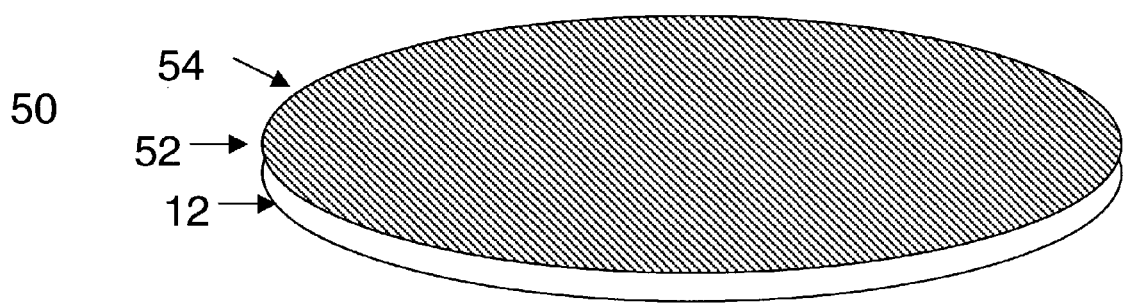
FIG. 5A shows a structure, according to certain embodiments of the invention, in which a nanofabric is formed over a substrate.

FIG. 5A shows an exemplary structure 50 having a wafer substrate 12 and a nanofabric 54 thereover. The nanofabric 54 may be made to cover an entire wafer surface.

An exemplary, non-limiting substrate 12 is like those described above. The substrate may be any material that will accept the deposition of nanotubes by spin coating, but preferably a material chosen from the group consisting of a thermal oxide or nitride, including but not limited to silicon dioxide, silicon nitride, alumina on silicon, or any combination of the following on silicon or silicon dioxide: aluminum, molybdenum, iron, titanium, platinum, and aluminum oxide, or any other substrate useful in the semiconductor industry.

Spin Coating Nanotubes on Functionalized Substrate Surfaces

Figure 5B:
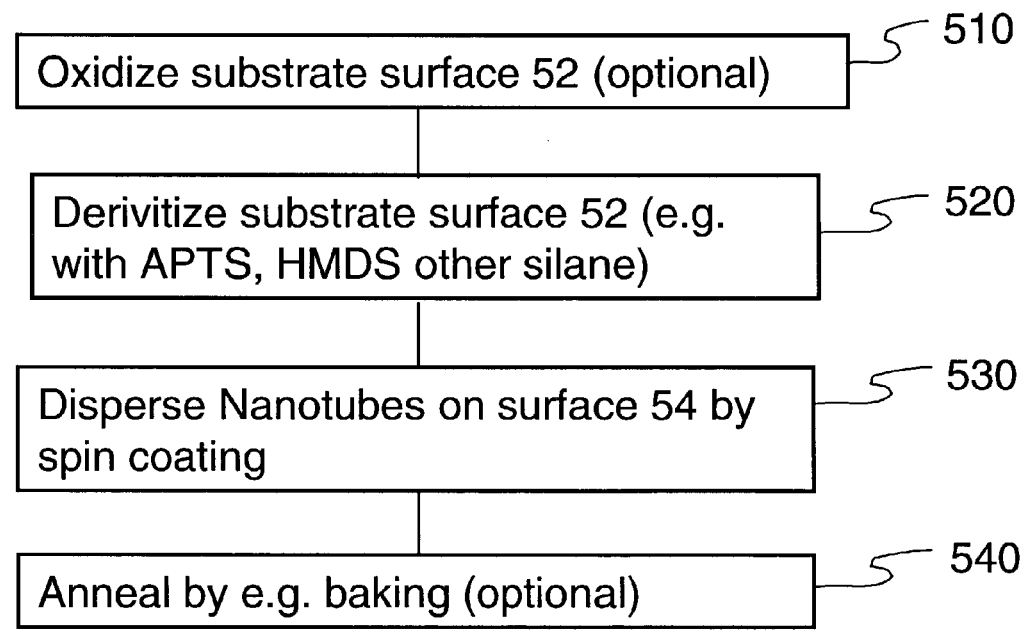
FIG. 5B illustrates an exemplary method of forming nanotube fabric by spin-coating preformed nanotubes in suspension.

FIG. 5B shows a way of making a fabric of nanotubes on a functionalized carbon nanotube growth substrate surface 52. The substrate surface 52 may be prepared for spin coating by functionalizing the surface. Specifically, functionalization of a wafer/substrate surface involves derivitizing the surface of the substrate. For example, one could chemically convert a hydrophilic to hydrophobic state or provide functional groups such as amines, carboxylic acids, thiols or sulphonates to alter the surface characteristics of the substrate. Functionalization may include the optional primary step 510 of oxidizing or ashing the substrate in oxygen plasma to remove carbon and other impurities from the substrate surface and to provide a uniformly reactive, oxidized surface which is then reacted with a silane. One such polymer that may be used is 3-aminopropyltriethoxysilane (APTS). The substrate surface 52 may be derivitized 520 prior to application of a nanotube suspension to enhance bonding of the nanotubes. The inventors foresee that any reactive silane could be used in functionalization of such a surface. In a particular, non-limiting embodiment, the substrate surface 52, whether or not subjected to ashing, is exposed to an approximately 1 to 50 millimolar solution of APTS in suitable organic solvent, e.g. hexane, but more preferably 13 to 28 millimolar APTS in hexane, such that approximately a monolayer of APTS is deposited on the substrate surface. In order to form such a monolayer of APTS, the substrate typically is immersed in an APTS solution for 30 minutes. Once the surface 52 is prepared for spin coating, carbon nanotubes are dispered 530 on the surface, and the surface is subjected to spinning in order to disperse the nanotubes, forming a nanotube fabric (e.g., fabric 54 of FIG. 5A). The substrate is then (optionally) annealed 540.

Different methods may be employed to apply nanotubes to surfaces to form nanofabrics: to attain desired fabric properties; the selection of one method over another depends, in part, on the properties of the pre-formed nanotubes being used. For example, under certain embodiments laser-ablated SWNTs are used; under other embodiments, commercially-available high pressure carbon monoxide decomposition SWNTs nanotubes are used, such as HiPco™ nanotubes available from Rice University; under still other embodiments, other nanotubes may be used.

Under some embodiments, laser-ablated nanotubes are mixed with a solvent at a concentration of about 100-500 μg/mL. Solvents which are quite useful for suspension of SWNTs and distribution via spin coating include isopropanol, methanol, ethanol, 1,2 dichlorobenzene, 1,3 dichlorobenzene, 1,4 dichlorobenzene, chlorobenzene, n-methylpyrollidinone, dimethylformamide, dimethylsulfoxide, acetonitrile, hexane, toluene, methylene chloride and chloroform. While all of these solvents have the ability to suspend nanotubes, the precise characteristics of the film desired and substrate used are important for solvent selection. If a low boiling solvent is desired hexane would, for example, be a better selection than DMSO. 1,2 dichlorobenzene is a preferred solvent owing to its excellent suspension properties and compatibility with industrial semiconductor processes.

Under some embodiments, HiPco™ nanotubes may be used. The HiPco™ nanotubes are SWNTs and relatively free from amorphous deposits, fibrous deposits and other impurities. HiPco™ tubes are mixed into orthodichlorobenzene at a more dilute concentration than are laser ablated nanotubes, typically 10-200 μg/mL.

Under the above embodiments, the preferred concentration depends on the length of the nanotubes used. Laser ablated nanotubes tend to have overall greater lengths than HiPco™ tubes. Regardless of the nanotubes used, the nanotubes in mixture should be adequately dispersed, e.g., by sonication.

Adequately-dispersed nanotubes may be applied 530 onto a substrate surface by spin coating. Such a surface should be relatively free of any residue remaining after storage or after any substrate preparation step, e.g. functionalization of the surface. If solvent, e.g. hexane is present on the substrate's surface, it may be removed, e.g., by baking at 100-115° C. for 1 minute. After removal of any storage solvent, the nanotubes are spun onto the substrate surface.

One way of spin coating the nanotubes involves spinning the substrate, for example, at 1000 rpm while depositing the nanotube solution on the substrate surface, for about 30 seconds or alternatively they can be applied before the spinning has begun. The substrate may (i.e., optionally) then be dried, for example, by spinning at 4000 rpm until dry. Further coats of nanotube suspension may be applied in like manner, until the substrate surface is coated with the desired density of nanotubes. Ribbon density may be varied based on desired use. Adequate layers of nanotubes typically have resistance per square measurements between 1-1000 k$\Omega$/□. For particular applications, nanotube layers with resistances per square below 1 k$\Omega$/□ may be preferred, and for yet other uses, nanotube films with resistance per square measurements of 1-10 M$\Omega$/□ may be sufficient. Typically four coatings of the nanotube suspension are applied to the substrate surface to create a fabric that will have a redundancy of electrically conductive pathways. After a layer of nanotubes of desired density, i.e., a monolayer, is spun onto the substrate, the substrate may be baked 540 once again to remove any remaining solvent, e.g., at 100-115° C. After four coatings are applied as described, a fabric resistance per square of ~100 k$\Omega$ is typically measured. The actual resistance per square depends upon the quality of the nanotubes used, their compositions, and overall purity.

Spin Coating Nanotubes on Non-Functionalized Substrate Surfaces

A non-functionalized substrate surface may be coated with nanotubes by spin coating. The surface may be oxidized, e.g., by ashing in oxygen plasma, to remove surface impurities, or it may be coated and not oxidized. The nanotubes used may be, but are not limited to, laser-ablated SWNTs or HiPco™ nanotubes.

Adequately dispersed nanotubes may be deposited on a non-functionalized substrate surface by spin coating. Similarly to the above, the substrate may be spun at 1000 rpm for 30 seconds while applying a nanotube solution to the substrate surface to distribute the nanotubes or the solution may be applied first and then spun. Further coats of nanotube suspension may be applied until the substrate surface is coated with the desired density of nanotubes. The substrate may be dried (optionally) between application steps, e.g., by spinning at 4000 rpm until dry.

Similarly to the above, ribbon density may be varied based on desired use. Typically, eight coatings of the nanotube suspension are applied to the non-functionalized substrate surface, when using the preceding parameters, to attain a fabric of electrically conductive nanotubes. After a layer of nanotubes of desired density is spun onto the substrate surface, the substrate can be baked once again to remove any remaining solvent, e.g. at 100-115° C. Such a method typically results in a nanotube layer resistance per square measurement of ~1-100 k$\Omega$ which is dependent both on the number of applications performed and the purity and character of the nanotubes used. Because nanotubes that have been deposited on a surface may be solvated and removed by subsequent applications of nanotubes in solvent, it may be desirable to cure the substrate and nanotubes before subsequent applications of solvated nanotubes. Such curing may be accomplished through evaporation or drying. Another way of limiting the subsequent dissolution and removal of already-spun-on tubes (removal by dissolution and from the centrifugal force overcoming van der Waals attraction between the nanotubes and the substrate surface) is to use a different solvent for subsequent spin coating steps.

The density of the nanotube ribbon may be controlled by altering such variables as including but not limited to functionalization of the underlying surface, spin coating parameters (length of time and RPM), solvent choice, nanotube type and concentration, diameter and length of nanotubes, number of applications and substrate type and composition.

Provided below are several exemplary ways of forming nanofabrics using the above principles.

EXAMPLE 28

A wafer substrate is first ashed in oxygen plasma for 15 minutes. After ashing, the substrate is bathed for 30 minutes in a solution of 3-aminopropyltriethoxysilane (APTS), the functionalization agent, and hexane at a ratio of 30-60 µL of APTS to 10 mL of Hexane. During the surface functionalization step, a nanotube solution is prepared. HiPco™ SWNTs are mixed in a solution comprising 1 mg of nanotubes and 50 ml 1,2 dichlorobenzene. The nanotube solution is then sonicated for 1 hour to adequately disperse the nanotubes in the solvent solution. Before nanotube deposition, the substrate is removed from the hexane bath and is baked at 100-115° C. for 1 minute to remove any solvent residue. After baking, the nanotubes are spun onto the wafer at 1000 rpm for 30 seconds to distribute the nanotubes, and then they are spun at 4000 rpm to dry the wafer. Four such SWNT spin coatings are applied to the wafer. After spinning, the wafer is baked again at 100-115° C. to remove any remaining solvent.

Figure 5C:
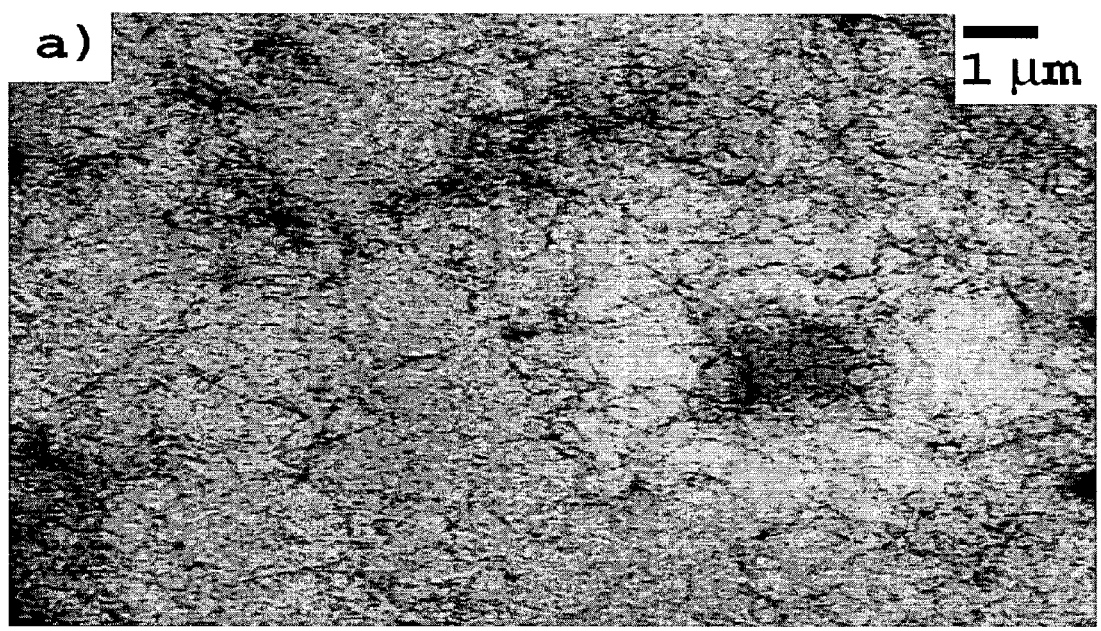
FIGS. 5C-5H are micrographs of nanofabrics formed with exemplary processes according to certain embodiments of the invention.
Figure 5D:
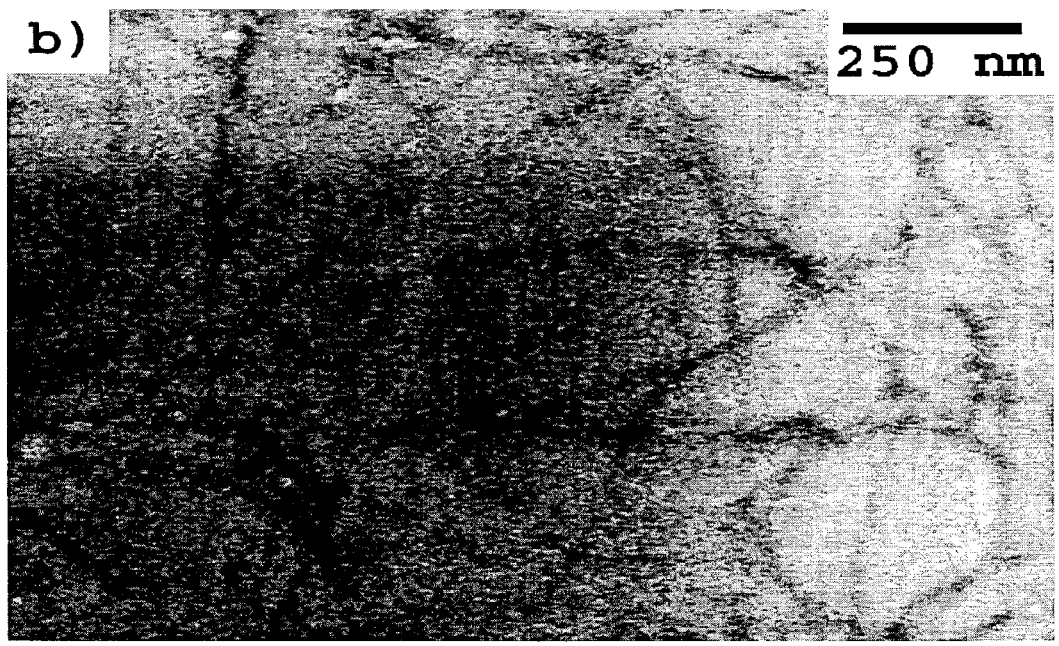

A resistance per square measurement of 1-100 k$\Omega$ was measured. FIGS. 5C-D display FESEM images of different magnifications of HiPco™ SWNTs spun onto a functionalized surface.

EXAMPLE 29

Figure 5E:
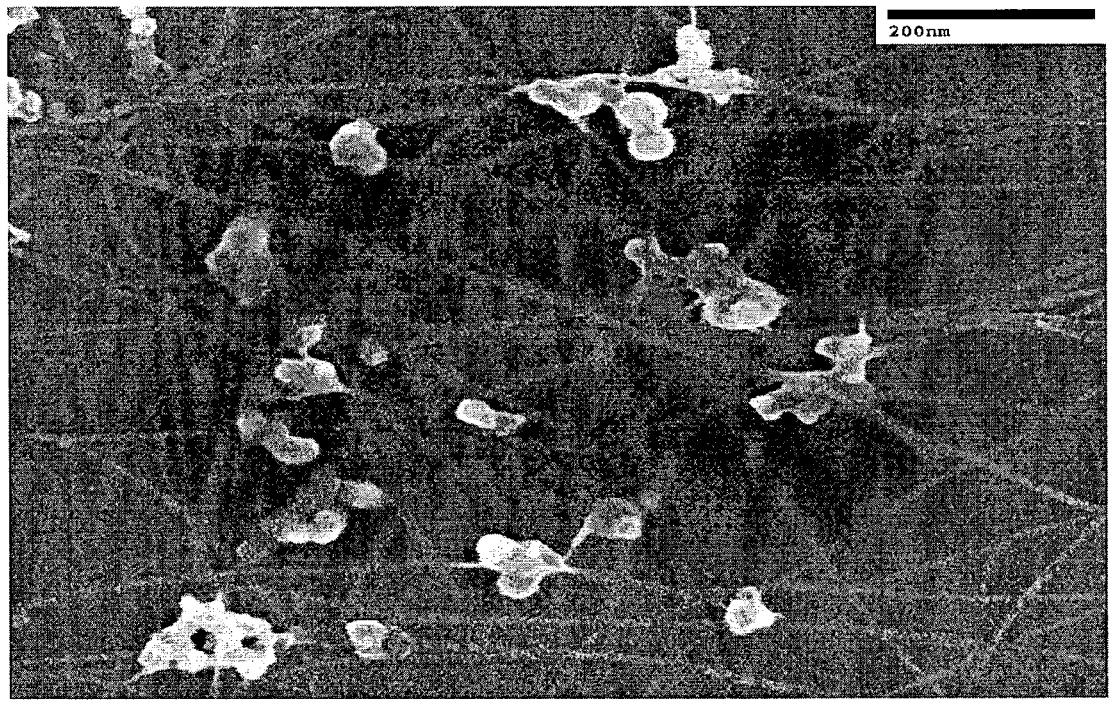

All parameters are kept the same as in example 28 except 10 mg of laser-ablated nanotubes are mixed in 100 mL of 1,2 dichlorobenzene and are spun onto a wafer surface. A resistance per square of 100-400 k$\Omega$ was measured. FIG. 5E displays a FESEM image of spun-on laser-ablated SWNTs with a functionalized surface. Some particles containing amorphous carbon impurities are observed also.

EXAMPLE 30

Figure 5G:
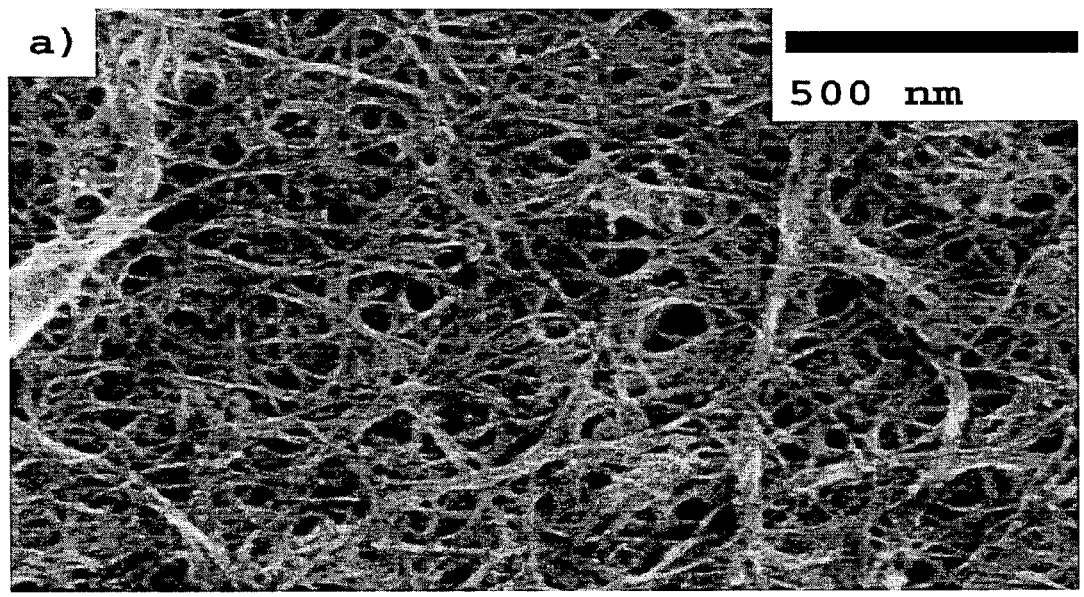
Figure 5F:
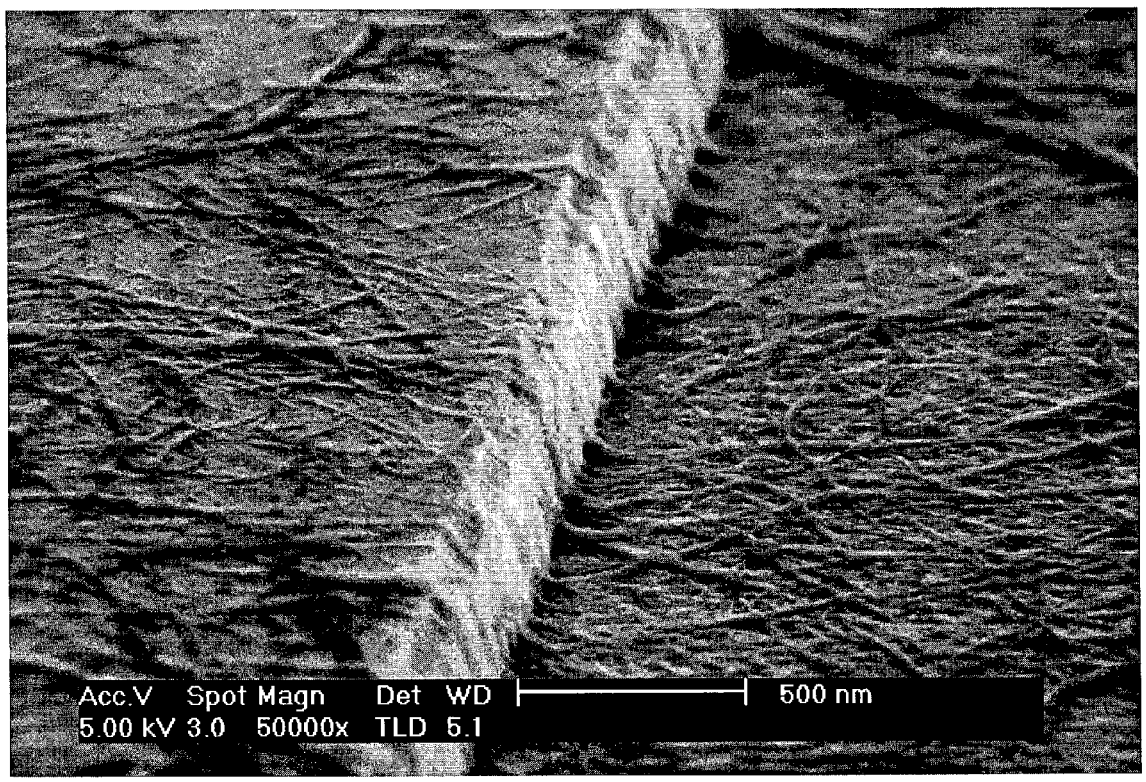

All parameters are kept constant as in example 29, except the substrate used for spin coating was stepped, i.e., not horizontally planar. FIG. 5F displays a micrograph of a nanofabric spun on to the substrate according to this method; the micrograph shows that nanotubes conform to a substrate surface via van der Waals attraction. The inventors contemplate that conformal nanofabrics may be useful in fabrication of non-horizontal electromechanical switches, especially vertical electromechanical switches or also as interconnects, actuators, relays, sensors and other electronic elements.

EXAMPLE 31

Figure 5H:
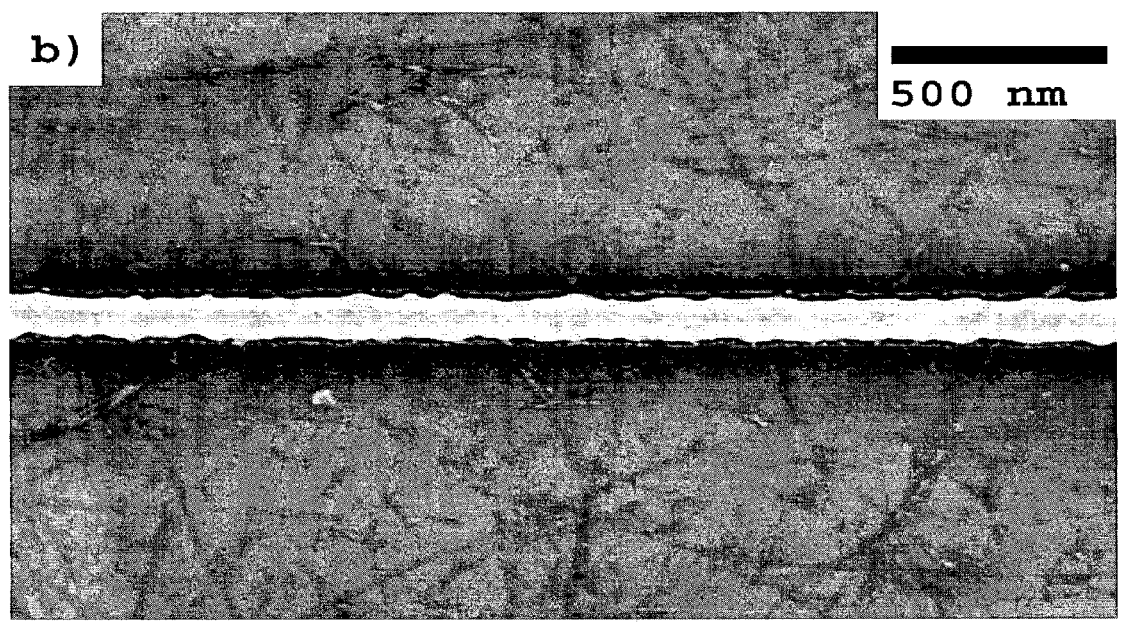

Carbon nanotubes are deposited on a non-functionalized surface as follows. A wafer surface is ashed for 1 minute. A nanotube solution is deposited and spun on to the wafer as presented in Example 28, above. Eight applications of nanotube mixture are applied to the wafer surface, producing resistance per square measurements on varying sections of the nanotube fabric ranging from 50 to 100 kΩ. FIG. 5G displays an FESEM image of SWNTs spun onto a non-functionalized wafer surface with sufficient applications to generate a multilayer nanofabric. FIG. 5H displays an FESEM micrograph of a monolayer fabric spun onto a substrate which has a prefabricated metal electrode with a width of about 130 nm shown.

Preferred embodiments operate with a range of concentrations for pre-formed nanotubes. For example for laser ablated nanotubes a concentration of about 0.1-0.5 mg/mL (100-500 ug/mL) is used. The concentration is preferably adjusted depending upon the purity and length of the nanotubes; for example, shorter nanotubes have one spinning regime and longer ones have a different regime.

In addition, preferred embodiments preferably subject the nanotube solution to sonication. For example, preferred embodiments use sonication times such as 30-120 minutes.

Patterning Nanofabrics

The new and improved methods for creating nanofabrics may be used to create articles therefrom. The U.S. patent applications, identified and incorporated above, describe specific (but not limiting) uses of such fabrics and articles. For example, the various masking and patterning techniques for selectively removing portions of the fabric are described in these applications but are not repeated here for the sake of brevity. Moreover, various component architectures are described in the incorporated applications but not repeated here for the sake of brevity.

Figure 6:
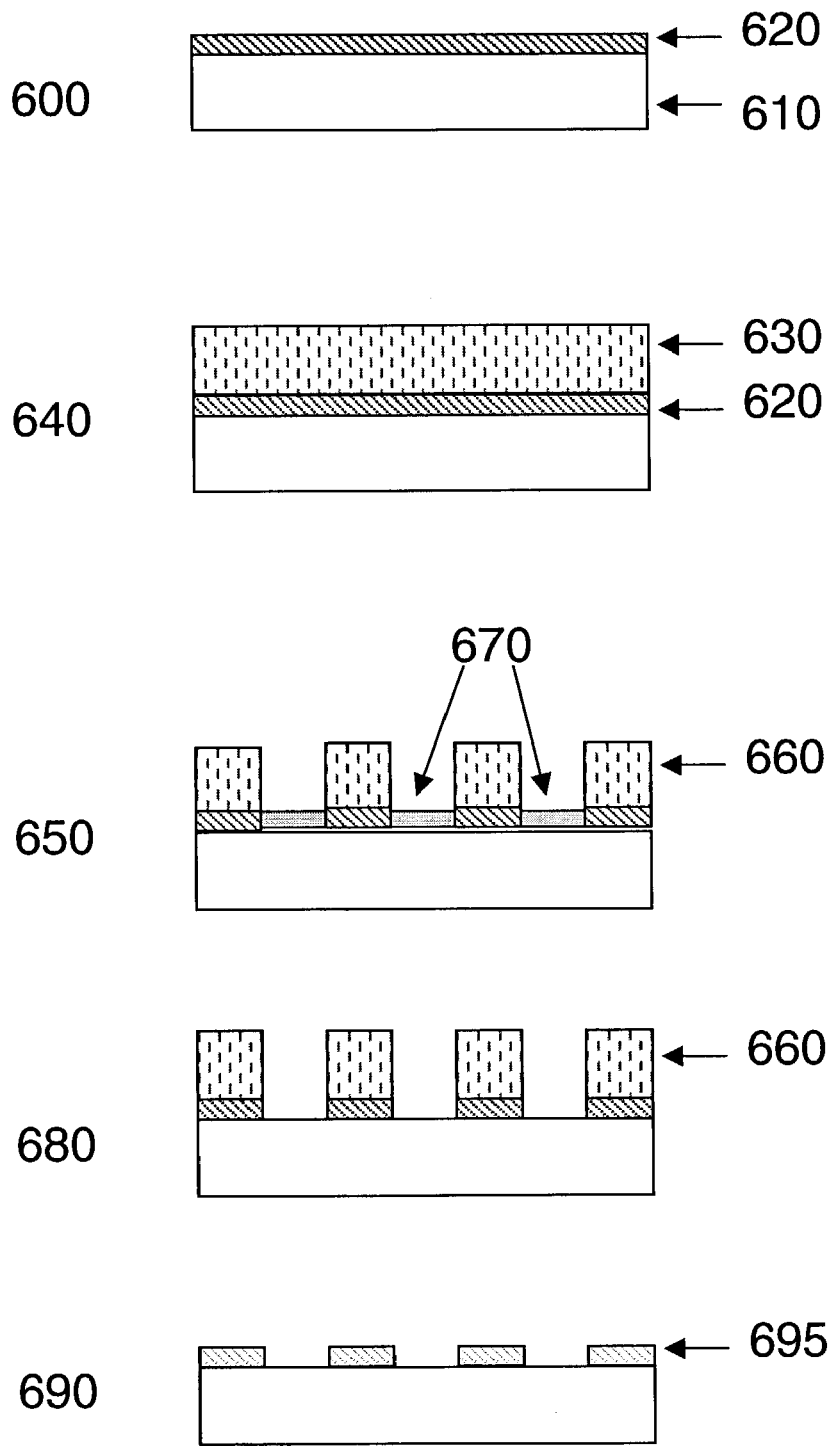
FIG. 6 are cross-sectional views of exemplary structures according to certain embodiments of the invention.

FIG. 6, for example, is a cross-sectional view of exemplary structures used in creating patterned nanofabrics. This method creates patches of carbon nanotube fabric which can be used as electronic elements. Such a patch of nanotube fabric may be used as an electromechanical switch, or as an electronic interconnect. An intermediate structure 600 is provided. Structure 600 comprises a nanofabric 620 overlying a substrate 610. The substrate 610 could be a simple substrate made of a single material; it could be a substrate which has already undergone some processing, e.g., to include vias, plugs or other elements, etc. The nanofabric 620 may be grown or formed using any of the methods disclosed or incorporated above. The nanofabric may be of SWNTs or multi-walled nanotubes. A layer of resist 630 is applied over the nanofabric 620 to form intermediate structure 640. The resist 630 is then patterned using any of a variety of techniques, including but not limited to those described in the incorporated references. For example, the resist may be patterned to correspond to the desired pattern of nanofabric patches, so that the resist will cover (and define) the desired patches. Removing selected portions of the resist (e.g., exposed portions) will create intermediate structure 650. The intermediate structure 650 includes exposed nanofabric portions 670 and remaining resist portions 660. The exposed nanofabric portions 670 may be removed in many ways; for example, by performing a reactive ion etch procedure, or oxidizing the substrate, by plasma ashing, air oxidation or other reaction methods to remove all nanotube fabric except for the desired patches, thereby creating intermediate structure 680. The remaining resist portions 660 may then be stripped from intermediate structure 680, yielding structure 690 which includes patterned patches 695 of nanofabric.

As explained in the incorporated references, the nanofabric 620 may be formed or grown over defined regions of sacrificial material and over defined support regions. The sacrificial material may be subsequently removed, yielding suspended articles of nanofabric. See, for example, Electromechanical Memory Array Using Nanotube Ribbons and Method for Making Same (U.S. patent application Ser. No. 09/915,093) filed Jul. 25, 2001, for an architecture which suspends ribbons of nanofabric.

Figure 7:
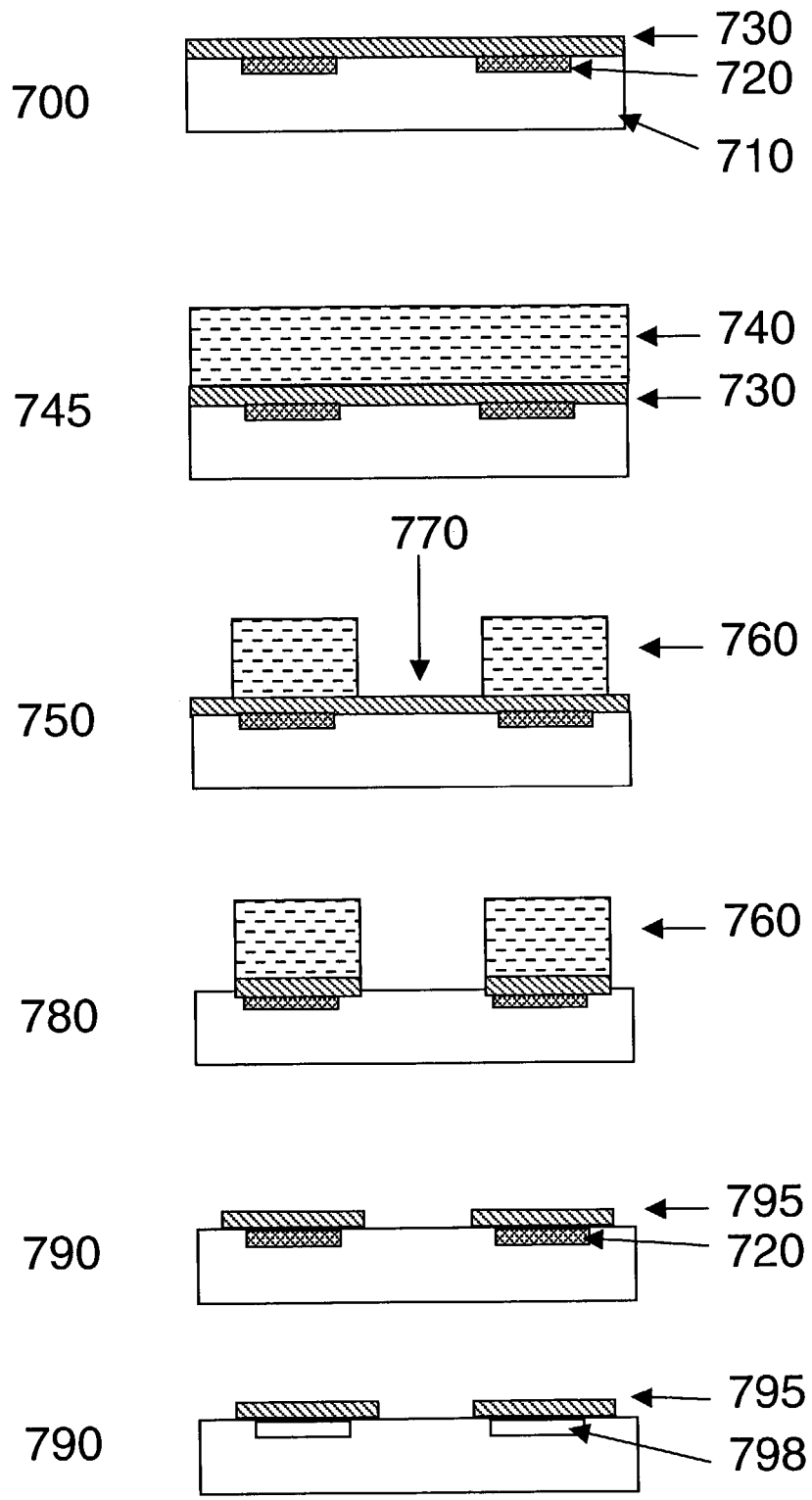
FIG. 7 shows cross-sectional views of exemplary structures according to certain embodiments of the invention.

FIG. 7, for example, is a cross-sectional view of exemplary structures used in creating suspended, patterned nanofabrics. This method creates suspended patches of carbon nanotube fabric, which can be used as electronic elements. Such a patch of nanotube fabric may be used as an electromechanical switch, or as an actuator, a relay, a sensor, especially a biosensor or chemical sensor.

An intermediate structure 700 is provided. Structure 700 comprises defined regions of sacrificial material 720 overlying a substrate 710 (which as outlined above could made of a single material; could be a substrate which has already undergone some processing, e.g. to include vias, plugs or other elements, etc.). A nanofabric 730 covers the substrate surface and the sacrificial material 720. The nanofabric 730 may be formed or grown as outlined above and may be multilayer or single layer and may have single- or multi-walled nanotubes. A layer of resist 740 is applied over the nanofabric 730 to create intermediate structure 745. The resist 740 is then patterned (not shown). Removing selected portions of the resist (e.g., exposed portions) will create intermediate structure 750. The intermediate structure 750 includes exposed nanofabric portions 770 and remaining resist portions 760. The exposed nanofabric portions 770 may be removed in many ways; for example, by performing a reactive ion etch procedure, or oxidizing the substrate, by plasma ashing, air oxidation or other reactive methods to remove all nanotube fabric except for the desired patches, thereby creating intermediate structure 780. The remaining resist portions 760 may then be stripped from intermediate structure 780, yielding structure 790 which includes patterned nanofabric patches 795 overlying defined sacrificial material 720. The sacrificial layer 720 is removed by selective etching, leaving substantially intact the suspended patterned nanofabric 795 and leaving an air gap 798 in the place of the removed sacrificial layer. The inventors contemplate that the stripping of the remaining resist portions 760 and removal of sacrificial material 720 may be done in the same step, with an appropriate process.

Figure 8A:
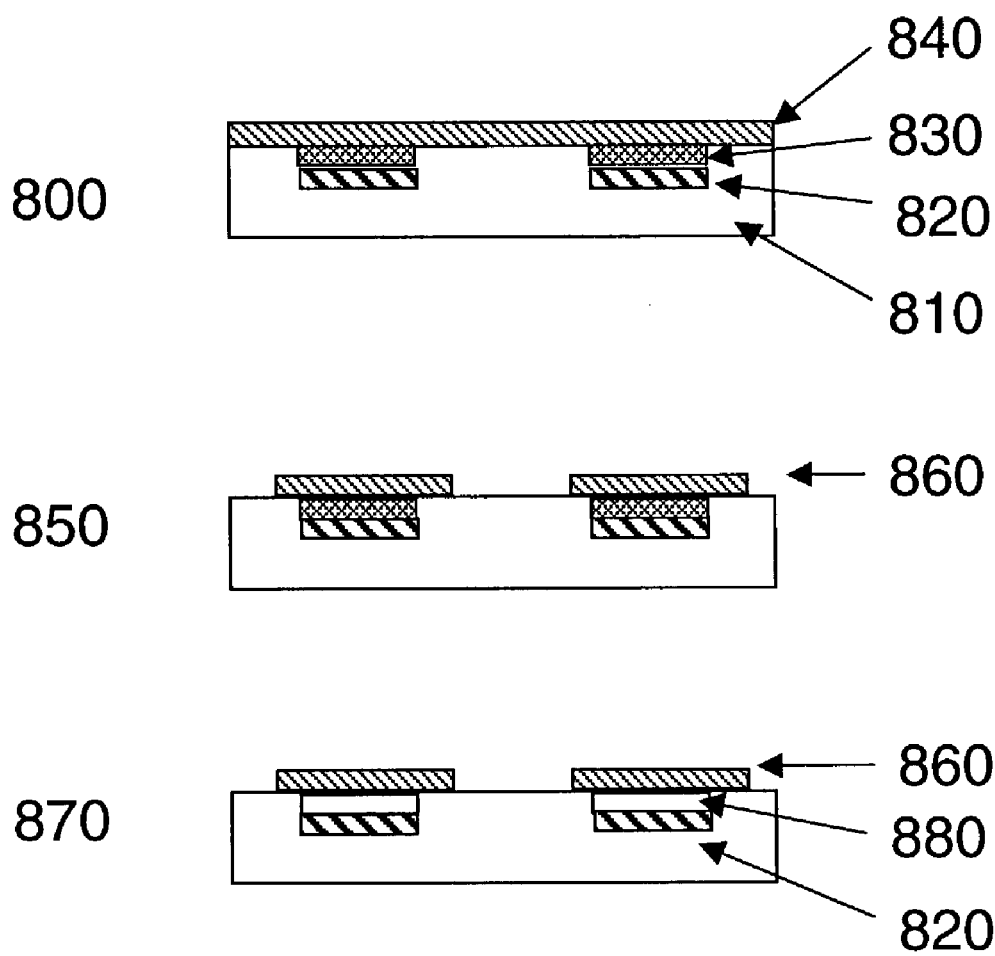
FIG. 8A shows cross-sectional views of exemplary structures according to certain embodiments of the invention.

FIG. 8A, for example, is a cross-sectional view of exemplary structures used in creating suspended, patterned nanofabrics. This method creates suspended patches of carbon nanotube fabric overlying an electrode with which the nanofabric may come into electrically conductive contact when the nanofabric is deflected. Such a device can be used as an electronic element, e.g. as an electromechanical switch, etc.

An intermediate structure 800 is provided. Structure 800 comprises a substrate 810 (similar to those described above) with already defined electrodes 820 (e.g., made of sufficiently conductive material, such as doped semiconductor or metal) and defined sacrificial material 830 thereover. A nanofabric 840 covers the substrate surface and the sacrificial layer 830. The nanofabric may be made by any of the above-described methods. Similar to that described above and as described in the incorporated references, the nanofabric 840 may be patterned (e.g., lithographic patterning) and defined portions of nanofabric may be removed to form intermediate structure 850. Patterned nanofabric articles 860 then cover defined sacrificial material 830 which in turn cover electrodes 820. The sacrificial material 830 may then be removed by selective etching, leaving remaining structures substantially intact, yielding structure 870. Structure 870 comprises suspended nanofabric articles 860 separated from electrodes 820. The nanofabric articles 860 and/or the electrodes may then be subjected to electrical stimulus to cause the nanofabric articles 860 to deflect toward, or away from, electrodes 820. As described in the incorporated references, the deflected articles retain their deflected state in a non-volatile manner.

EXAMPLE 32

Figure 8B:
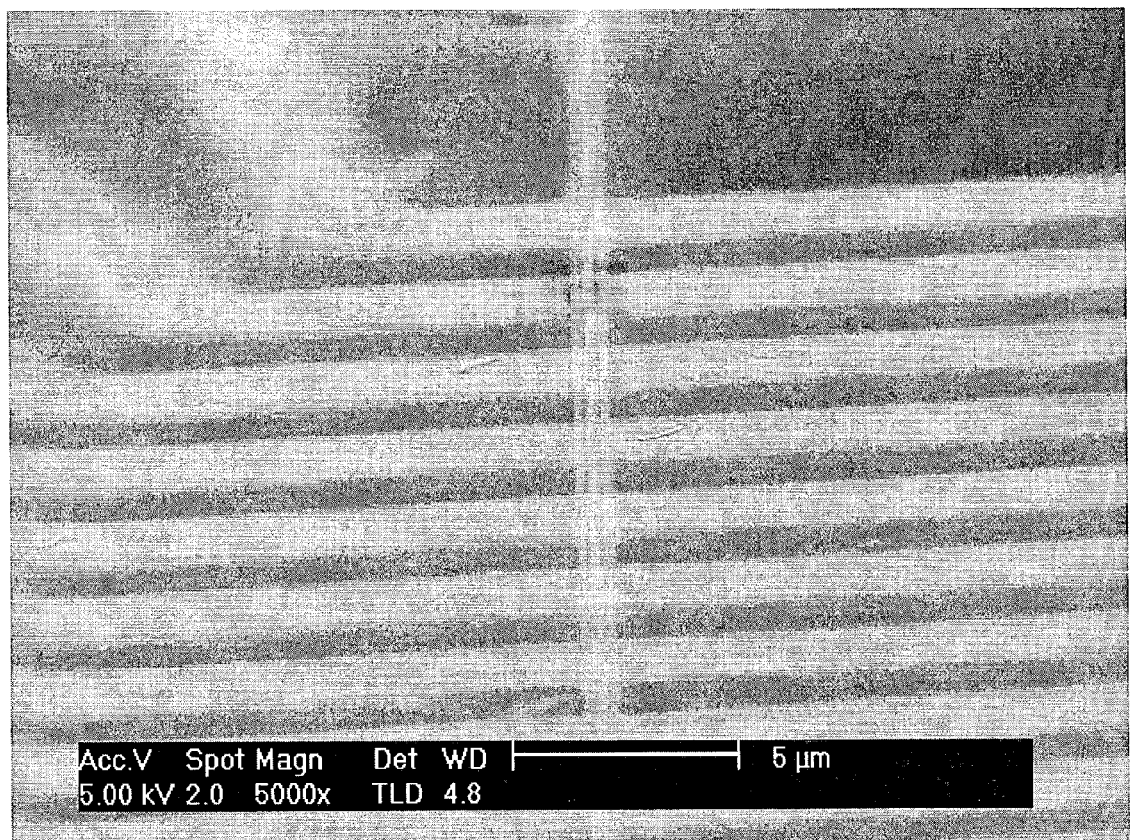
FIGS. 8B-D are micrographs of nanofabrics patterned according to certain embodiments of the invention.
Figure 8C:
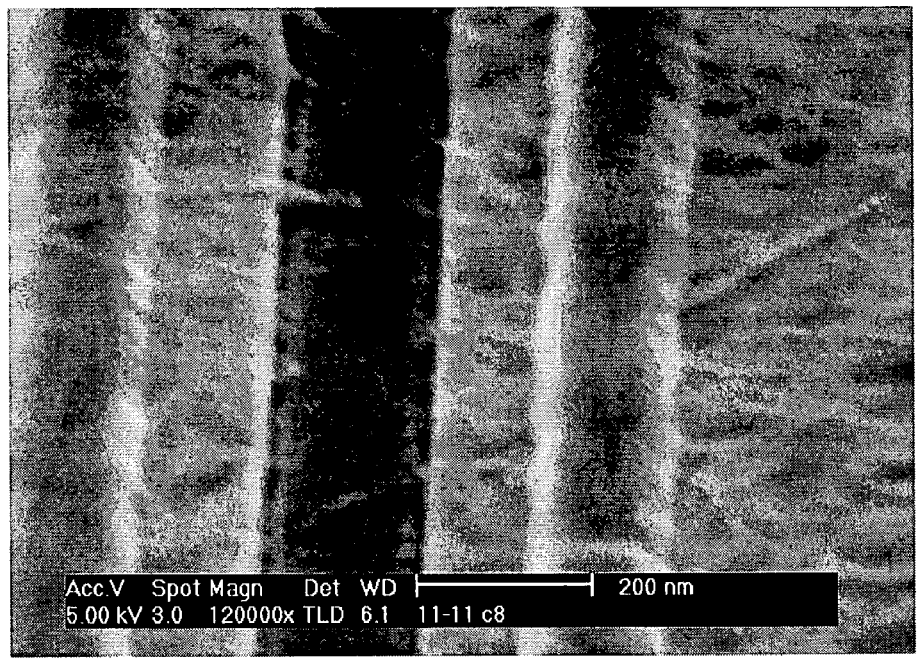
Figure 8D:
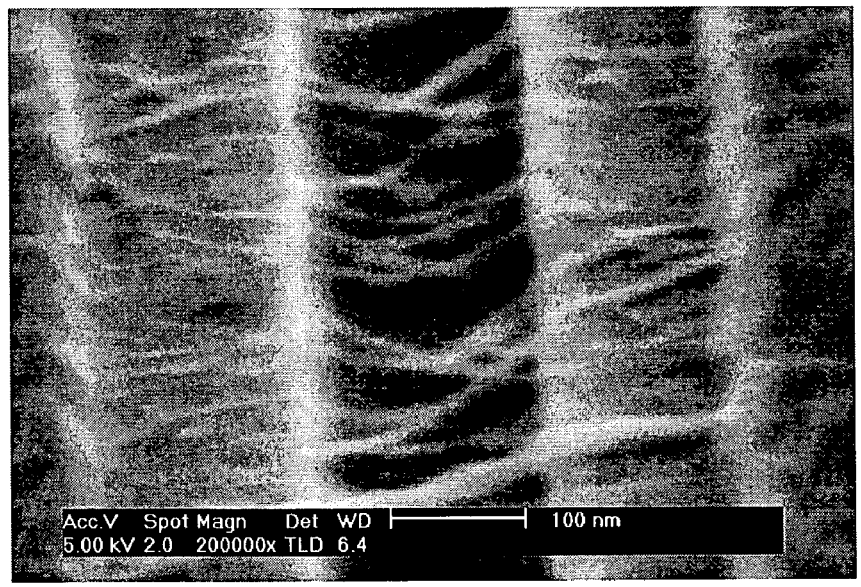

A wafer substrate, an overlying nanofabric, an embedded titanium electrode under a sacrificial layer of $Al_2O_3$ are provided. Shipley 1805 photoresist is applied to the wafer surface by spin coating at 4000 rpm for 60 seconds. The photoresist is exposed using a Kasper Mask Aligner for 8 seconds. The pattern is developed using a basic developer, thereby exposing portions of nanofabric and leaving other portions protected by the photoresist. The substrate is rinsed in deionized water and dried at 115° C. The exposed portions of nanofabric are removed by plasma ashing for five minutes with 25 cubic feet per minute oxygen at a pressure of 280 millitorr and a power of 300 Watts. The substrate is soaked in n-methylpyrollidinone at 70° C. to remove remaining photoresist for 30 minutes. The substrate is rinsed in isopropanol and dried. Hot phosphoric acid is applied to remove the $Al_2O_3$, leaving a patterned nanofabric suspended over an electrode with which it may come into electrical contact when deflected. FIG. 8B displays an FESEM image of patterned nanofabrics made by this method. In the micrograph, bare substrate regions are dark, nanofabric patches are light in color and the longitudinal light stripe is a metallic electrode. Typical resistivity for a patterned trace with a length of 100 μm and width of 3 μm is 1-10 MΩ. FIG. 8C displays an FESM image of the same structure as in 8B under greater magnification. The dark longitudinal stripe is the sacrificial layer overlying the metal electrode. FIG. 8D displays an FESM image of the same structure with the sacrificial layer removed; the nanofabric can be seen suspended over and not in contact with the electrode.

Controlled Composition of Types of Nanotubes in Nanofabric

Other embodiments involve controlled composition of carbon nanotube fabrics. Specifically, methods may be employed to control the relative amount of metallic and semiconducting nanotubes in the nanofabric. In this fashion, the nanofabric may be made to have a higher or lower percentage of metallic nanotubes relative to semiconducting nanotubes. Correspondingly, other properties of the nanofabric (e.g., resistance) will change. The control may be accomplished by direct growth, removal of undesired species, or application of purified nanotubes.

With regard to controlled direct growth, methods are known, for example, to selectively grow semiconducting nanotubes. (ee Kim et al., Synthesis of Ultralong and High Percentage of Semiconducting Single-Walled Carbon Nanotubes, Vol. 2 Nanoletters 703 (2002).) The inventors envision a protocol in which selective growth of fabrics of semiconducting or metallic nanotubes followed by etching would produce nanotube ribbons or traces useful in fabrication of electromechanical devices.

With regard to removal of undesired species, methods are known, for example, to process MWNTs and SWNT ropes to convert such into metallic or semiconducting nanotubes as desired (See Collins et al., Engineering Carbon Nanotubes and Nanotube Circuits Using Electrical Breakdown, Vol. 292 Science 706 (2001).)

With regard to application of purified nanotubes, using proper bulk nanotube preparations which contain primarily metallic or semiconducting nanotubes would allow application of a nanotube fabric to a substrate. The application could be performed via spin coating of a nanotube stock solution onto a substrate, dipping a substrate into a nanotube stock solution, spraying of nanotube stock solutions onto a surface or other methods. Application of single-walled, multiwalled or mixtures of such nanotubes can be envisioned with subsequent patterning and etching to generate fabrics or traces of sufficient length and width to make electronic devices.

By way of example, FIG. 1B.2 is similar to FIG. 1B.1 and the description thereof is not repeated. In material part, the method of FIG. 1B.2 removes the optional step of annealing nanotubes found in FIG. 1B.1 and substitutes it with a selective removal of nanotubes, e.g., removing semiconducting nanotubes or metallic. By doing so the composition of the nanofabric may be controlled.

Figure 3G:
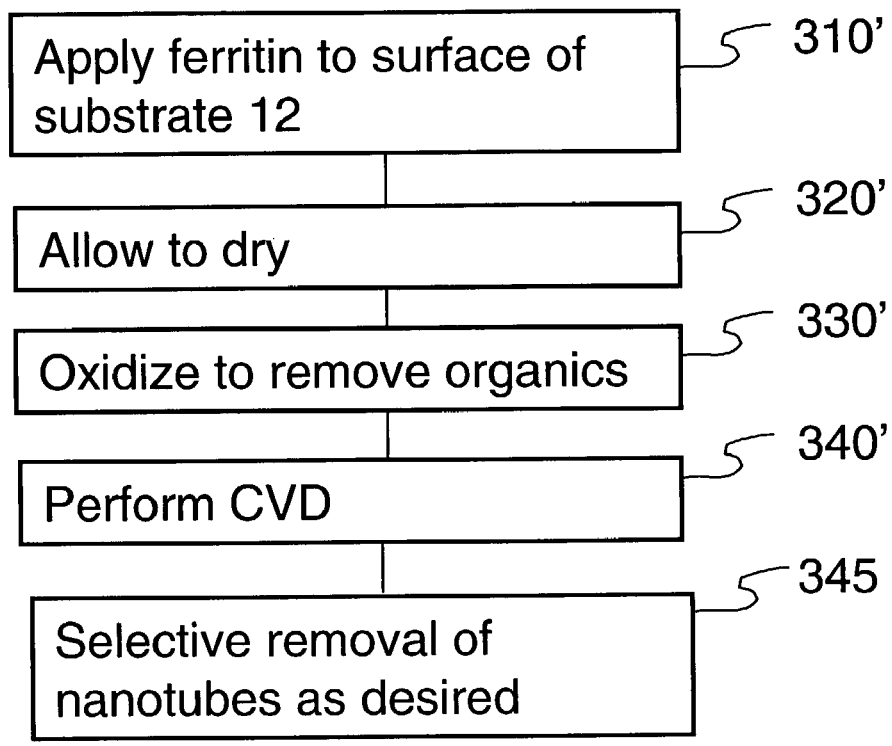
FIGS. 3G-H illustrate exemplary methods of growing nanotube fabric by CVD using the structure of FIG. 3A.
Figure 3H:
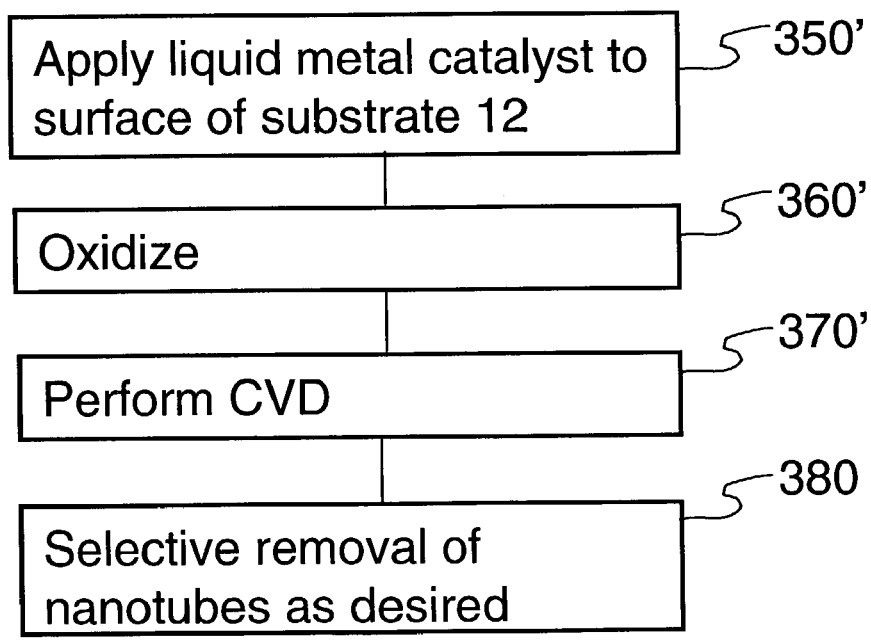

FIGS. 3G-H is similar to FIGS. 3B-C and the descriptions thereof are not repeated. In material part, the method of FIG. 3G adds a selective removal 345 of nanotubes, e.g., removing semiconducting nanotubes or metallic; analogously, the method of FIG. 3H adds a selective removal 380 of nanotubes. By doing so the composition of the nanofabric may be controlled.

FIG. 4C is similar to FIG. 4B and the description thereof is not repeated. In material part, the method of FIG. 4C adds a selective removal 450 of nanotubes, e.g., removing semiconducting nanotubes or metallic. By doing so the composition of the nanofabric may be controlled.

FIG. 4D is similar to FIG. 4B and the description thereof is not repeated. In material part, the method of FIG. 4D substitutes the CVD step 440 of FIG. 4B with a selective growth 440' of nanotubes, in which the growth process affects the relative concentration of one type of nanotube as compared to another. By doing so the composition of the nanofabric may be controlled.

Under some of the above embodiments, the application of nanotubes may be iterative. Thus for example a nanofabric may be created and subsequently processed to remove semiconducting nanotubes and then another application of nanotubes may be applied. Repeated application and removal will increase the relative amount of metallic or semiconducting nanotubes in the resulting nanofabric.

Figure 5I:
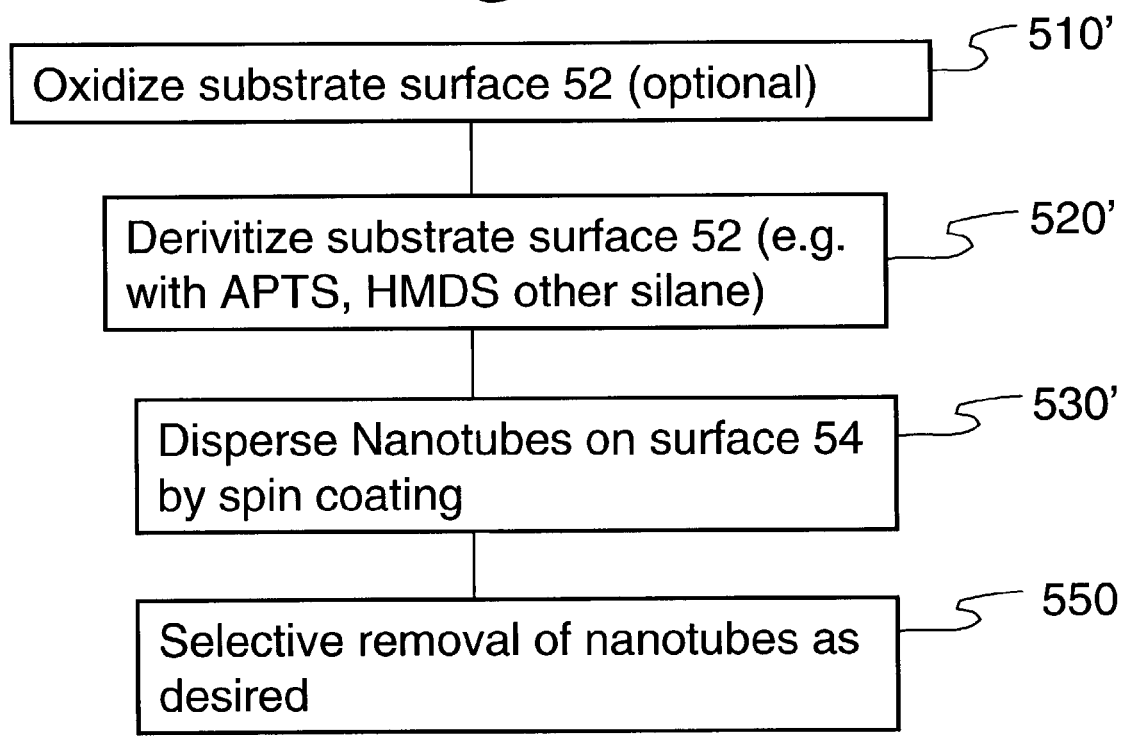
FIGS. 5I-J illustrate exemplary methods of forming nanotube fabric by spin-coating preformed nanotubes in suspension.

FIG. 5I is similar to FIG. 5B and the description thereof is not repeated. In material part, the method of FIG. 5I removes the optional annealing step 540 of FIG. 5B and adds a selective removal 550 of nanotubes, e.g., removing semiconducting nanotubes or metallic. By doing so the composition of the nanofabric may be controlled. This process step 550 can be iterated to generate a more dense nanofabric.

Figure 5J:
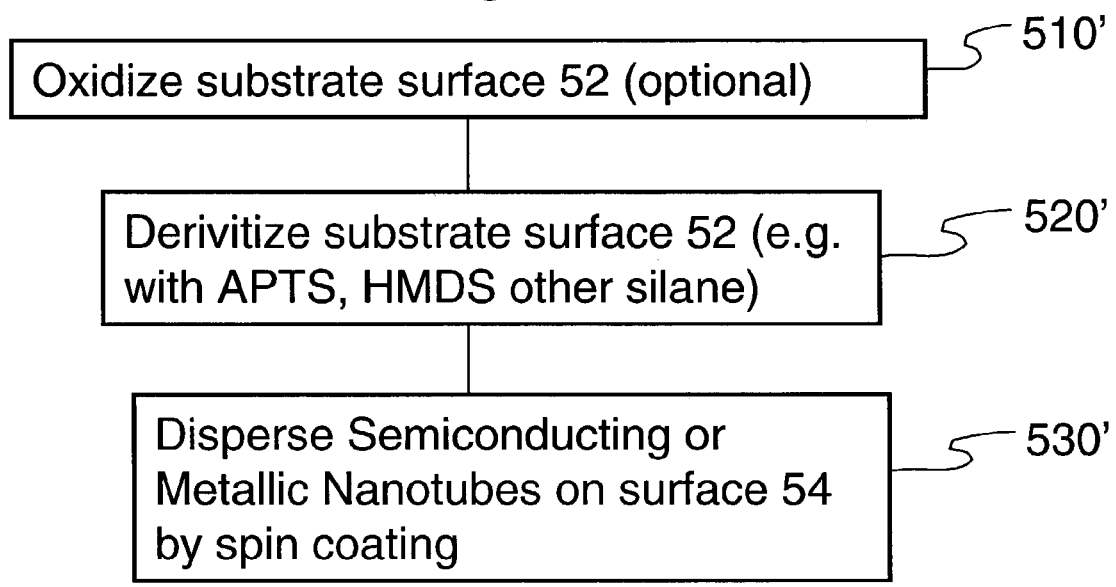

FIG. 5J is similar to FIG. 5B and the description thereof is not repeated. In material part, the method of FIG. 5I removes the optional annealing step 540 of FIG. 5B and substitutes the dispersal step 530 with a new dispersal step 530', in which the nanotubes that are disperse have a controlled composition, e.g., selected amounts of metallic nanotubes. By doing so the composition of the nanofabric may be controlled. This process step 530' can be iterated to generate a more dense nanofabric.

OTHER EMBODIMENTS

Catalyst deposited on substrate surface or remaining in spun-on SWNTs may be removed by rinse/wash steps if a desired property of the ribbon included that it be free of metal/catalyst. This could be performed by successive treatments in an appropriate solvent or acid which would cause the removal of the exterior carbon shell that typically passivates the particles during nanotube growth. Other unreacted nanoparticles could be removed with just a mild solvent wash.

Some of the above methods of manufacturing such nanofabrics and patterning articles therefrom are conducive to certain environments, such as a circuit manufacturing environment. Other methods provide nanofabrics and articles therefrom that have desirable characteristics, such as an ability to adhere to hydrophobic surfaces (found in many electronic devices), even when the feature size is in the nanometer regime (<200 nm).

While the inventors typically desire a monolayer fabric of single-walled nanotubes, for certain applications it may be desirable to have multilayer fabrics to increase current density, redundancy or other mechanical or electrical characteristics. Additionally it may be desirable to use either a monolayer fabric or a multilayer fabric comprising MWNTs for certain applications or a mixture of single-walled and multi-walled nanotubes. The previous methods illustrate that control over catalyst type, catalyst distribution, surface deriviti-zation, temperature, feedstock gas types, feedstock gas pressures and volumes, reaction time and other conditions allow growth of fabrics of single-walled, multi-walled or mixed single- and multi-walled nanotube fabrics that are at the least monolayers in nature but could be thicker as desired with measurable electrical characteristics.

In the case of formation of fabrics using pre-grown nanotubes, formulation of nanotube solutions in appropriate solvents with subsequent distribution over surfaces with or without derivitization allows exquisite control over porosity and density of the fabrics and would lead to facile generation of single-walled, multi-walled or mixed single- and multi-walled fabrics that are at the least monolayers in nature but could be thicker as desired with measurable electrical characteristics.

It will be further appreciated that the scope of the present invention is not limited to the above-described embodiments, but rather is defined by the appended claims, and that these claims will encompass modifications of and improvements to what has been described.

What is claimed is:

1. A method of making an article, comprising:
    applying carbon nanotube growth catalyst on to a surface of a substrate;
    subjecting the substrate to a chemical vapor deposition of a carbon-containing gas to grow a non-woven fabric of carbon nanotubes, wherein the nanotubes of the fabric are substantially parallel to said surface of the substrate;
    selectively removing portions of the non-woven fabric according to a defined pattern; and
    providing first and second electrodes in contact with respective first and second portions of the patterned non-woven fabric to create the article, wherein the patterned non-woven fabric forms a conductive trace between the first and second electrodes.

2. The method of claim 1 wherein the act of applying carbon nanotube growth catalyst on to a surface of a substrate includes applying metallic nanoparticles.

3. The method of claim 1 wherein the act of applying carbon nanotube growth catalyst on to a surface of a substrate includes applying metal oxide nanoparticles.

4. The method of claim 1 further including derivitizing the surface of the substrate.

5. The method of claim 4 wherein the surface is derivitized to create a more hydrophobic environment to promote adhesion of the carbon nanotube growth catalyst.

6. The method of claim 4 wherein the surface is derivitized to create a more hydrophilic environment to promote adhesion of the carbon nanotube growth catalyst.

7. The method of claim 1 wherein the act of applying carbon nanotube growth catalyst on to a surface of a substrate includes applying a ferritin solution.

8. The method of claim 1 wherein the act of applying carbon nanotube growth catalyst creates a substantial monolayer of nanoparticles on the surface of the substrate.

9. The method of claim 1 wherein the act of applying carbon nanotube growth catalyst on to a surface of a substrate includes applying a metal ligand-catalyst precursor.

10. The method of claim 9 wherein the surface is functionalized to promote binding of the ligand.

11. The method of claim 9 wherein the metal ligand-catalyst precursor has a formula ML, in which M is metal from a group including iron, cobalt, or nickel, and in which L is at least one organic ligand.

12. The method of claim 9 wherein the metal ligand-catalyst precursor is applied by a spin coating technique.

13. The method of claim 9 in which the metal ligand-catalyst precursor is oxidized to remove an organic shell therefrom.

14. The method of claim 1 wherein the act of applying carbon nanotube growth catalyst on to a surface of a substrate includes applying a solution of iron oxide nanoparticles on the surface of the substrate.

15. The method of claim 14 wherein the solution of iron oxide nanoparticles is applied by a spin coating technique.

16. The method of claim 15 wherein the spin coating technique includes repetitive applications of the solution of iron oxide nanoparticles and repetitive distributing thereof by spinning the substrate at a defined rate.

17. The method of claim 1 wherein the act of applying carbon nanotube growth catalyst on to a surface of a substrate includes applying a suspension of liquid metal catalyst precursor on the surface of the substrate.

18. The method of claim 1 wherein the carbon-containing gas is methane.

19. The method of claim 1 wherein the carbon-containing gas is ethylene.

20. The method of claim 18 wherein chemical vapor deposition is at about 850° C. for about ten minutes and the methane is applied at about a 500 sccm flow.

21. The method of claim 19 wherein chemical vapor deposition is at about 800° C. for about forty minutes and the ethylene is applied at about a 10 sccm flow.

22. The method of claim 1 wherein the act of subjecting the substrate to chemical vapor deposition includes inert gasses.

23. The method of claim 22 wherein the inert gasses are a controlled flow of Argon and Hydrogen.

24. The method of claim 23 wherein Argon and Hydrogen are flowed in a controlled ratio of 1:4.

25. The method of claim 1 further including oxidizing the substrate prior to chemical vapor deposition.

26. The method of claim 1 wherein the nanotube growth catalysts are nanoparticles having specific diameters.

27. The method of claim 1 wherein the carbon nanotubes of the non-woven fabric include metallic nanotubes and semiconducting nanotubes and wherein the relative composition of metallic and semiconducting nanotubes in the fabric is controlled.

28. The method of claim 1 wherein the carbon nanotubes of the non-woven fabric include metallic nanotubes and semiconducting nanotubes and wherein the method further includes selectively removing metallic nanotubes.

29. The method of claim 1 wherein the carbon nanotubes of the non-woven fabric include metallic nanotubes and semiconducting nanotubes and wherein the method further includes selectively removing semiconducting nanotubes.

* * * * *